(12) United States Patent
Birmingham

(10) Patent No.: US 11,616,186 B1
(45) Date of Patent: Mar. 28, 2023

(54) THERMAL-TRANSFER APPARATUS INCLUDING THERMIONIC DEVICES, AND RELATED METHODS

(71) Applicant: Birmingham Technologies, Inc., Arlington, VA (US)

(72) Inventor: Joseph Birmingham, Arlington, VA (US)

(73) Assignee: Birmingham Technologies, Inc., Arlington, VA (US)

( * ) Notice: Subject to any disclaimer, the term of this patent is extended or adjusted under 35 U.S.C. 154(b) by 80 days.

(21) Appl. No.: 17/359,729

(22) Filed: Jun. 28, 2021

(51) Int. Cl.
| | | |
|---|---|---|
| *H01L 35/34* | (2006.01) | |
| *H01L 35/02* | (2006.01) | |
| *H01J 45/00* | (2006.01) | |

(52) U.S. Cl.
CPC .............. *H01L 35/34* (2013.01); *H01J 45/00* (2013.01); *H01L 35/02* (2013.01)

(58) Field of Classification Search
None
See application file for complete search history.

(56) References Cited

U.S. PATENT DOCUMENTS

| | | |
|---|---|---|
| 2,876,368 A | 3/1959 | Thomas |
| 3,376,437 A | 4/1968 | Meyerand, Jr. et al. |
| 3,601,638 A * | 8/1971 | Busse ............... G21D 7/04 310/306 |
| 3,683,209 A * | 8/1972 | Gross ............... G21C 1/022 310/306 |
| 3,798,475 A | 3/1974 | Campagnuolo et al. |
| 3,839,094 A | 10/1974 | Campagnuolo |
| 4,264,641 A | 4/1981 | Mahoney et al. |
| 4,628,143 A | 12/1986 | Brotz |
| 4,762,975 A | 8/1988 | Mahoney et al. |
| 4,900,368 A | 2/1990 | Brotz |
| 4,995,231 A | 2/1991 | Smith et al. |
| 5,008,579 A | 4/1991 | Conley et al. |
| 5,578,886 A | 11/1996 | Holmlid et al. |
| 5,606,213 A | 2/1997 | Kherani et al. |

(Continued)

FOREIGN PATENT DOCUMENTS

| | | |
|---|---|---|
| CN | 106452287 | 6/2018 |
| EP | 2849334 | 3/2015 |

(Continued)

OTHER PUBLICATIONS

Jensen, K.L. et al., "A photoemission model for low work function coated metal surfaces and its experimental validation," Journal of Applied Physics, vol. 99, p. 124905 (2006).

(Continued)

*Primary Examiner* — Daniel P Malley, Jr.
(74) *Attorney, Agent, or Firm* — Lieberman & Brandsdorfer, LLC

(57) ABSTRACT

Embodiments relate to systems designed for thermal transfer augmentation and thermionic energy harvesting. Thermionic energy harvesters are configured to supply electricity for applications such as electronics, communications, and other electrical devices. Thermal transfer may be used for a variety of heating/cooling and power generation/heat recovery systems, such as, refrigeration, air conditioning, electronics cooling, industrial temperature control, waste heat recovery, off-grid and mobile refrigeration, and cold storage.

20 Claims, 15 Drawing Sheets

(56) References Cited

U.S. PATENT DOCUMENTS

| | | | |
|---|---|---|---|
| 5,787,965 A | 8/1998 | Sterett et al. | |
| 5,960,853 A | 10/1999 | Sterett et al. | |
| 5,989,824 A | 11/1999 | Birmingham et al. | |
| 5,994,638 A | 11/1999 | Edelson | |
| 6,037,697 A * | 3/2000 | Begg | H02N 3/00 310/306 |
| 6,062,392 A | 5/2000 | Birmingham et al. | |
| 6,110,247 A | 8/2000 | Birmingham et al. | |
| 6,181,049 B1 * | 1/2001 | Streckert | H01J 45/00 310/306 |
| 6,287,714 B1 | 9/2001 | Xiao et al. | |
| 6,294,858 B1 | 9/2001 | King et al. | |
| 6,492,792 B1 | 12/2002 | Johnson, Jr. et al. | |
| 6,722,872 B1 | 4/2004 | Swanson et al. | |
| 6,774,532 B1 * | 8/2004 | Marshall | G21H 1/106 310/305 |
| 7,073,561 B1 | 7/2006 | Henn | |
| 7,081,684 B2 | 7/2006 | Patel et al. | |
| 7,259,109 B2 | 8/2007 | Meagley | |
| 7,327,026 B2 | 2/2008 | Shimogishi et al. | |
| 7,524,528 B2 | 4/2009 | Kodas et al. | |
| 7,651,926 B2 | 1/2010 | Jacobson et al. | |
| 7,701,576 B2 | 4/2010 | Moore et al. | |
| 7,737,356 B2 | 5/2010 | Goldstein | |
| 7,906,182 B1 | 3/2011 | Schlaf | |
| 8,093,144 B2 | 1/2012 | Jacobson et al. | |
| 8,182,982 B2 | 5/2012 | Korbin | |
| 8,188,456 B2 | 5/2012 | Nemanich et al. | |
| 8,192,920 B2 | 6/2012 | Korbin | |
| 8,318,386 B2 | 11/2012 | Korbin | |
| 8,334,217 B2 | 12/2012 | Korbin | |
| 8,367,525 B2 | 2/2013 | Jacobson et al. | |
| 8,425,789 B2 | 4/2013 | Korbin | |
| 8,518,633 B1 | 8/2013 | Korbin et al. | |
| 8,621,245 B2 | 12/2013 | Shearer et al. | |
| 8,816,633 B1 | 8/2014 | Neal et al. | |
| 8,907,352 B2 | 12/2014 | Naito | |
| 9,069,244 B2 | 6/2015 | Korbin | |
| 9,073,937 B2 | 7/2015 | Frazier et al. | |
| 9,116,430 B2 | 8/2015 | Korbin et al. | |
| 9,166,405 B2 | 10/2015 | Brandt et al. | |
| 9,244,356 B1 | 1/2016 | Korbin et al. | |
| 9,465,296 B2 | 10/2016 | Korbin | |
| 9,472,699 B2 | 10/2016 | Kotter | |
| 9,481,112 B2 | 11/2016 | Korbin et al. | |
| 9,559,617 B2 | 1/2017 | Landa et al. | |
| 9,645,504 B2 | 5/2017 | Korbin | |
| 9,722,420 B2 | 8/2017 | Teggatz et al. | |
| 9,726,790 B2 | 8/2017 | Boyd et al. | |
| 9,726,791 B2 | 8/2017 | Boyd et al. | |
| 9,782,917 B2 | 10/2017 | Korbin et al. | |
| 9,786,718 B1 | 10/2017 | Boyd | |
| 9,793,317 B1 | 10/2017 | Boyd et al. | |
| 9,893,261 B1 | 2/2018 | Boyd et al. | |
| 9,923,514 B1 | 3/2018 | Boyd et al. | |
| 9,981,410 B2 | 5/2018 | Korbin et al. | |
| 10,014,461 B1 | 7/2018 | Boyd et al. | |
| 10,056,538 B1 | 8/2018 | Boyd | |
| 10,079,561 B1 | 9/2018 | Boyd | |
| 10,096,648 B2 | 10/2018 | Boyd | |
| 10,103,654 B2 | 10/2018 | Yun et al. | |
| 10,109,672 B2 | 10/2018 | Boyd et al. | |
| 10,109,781 B1 | 10/2018 | Boyd | |
| 10,110,163 B2 | 10/2018 | Boyd et al. | |
| 10,247,861 B2 | 4/2019 | Boyd et al. | |
| 10,249,810 B2 | 4/2019 | Boyd et al. | |
| 10,345,491 B2 | 7/2019 | Boyd et al. | |
| 10,345,492 B2 | 7/2019 | Boyd et al. | |
| 10,347,777 B2 | 7/2019 | Boyd et al. | |
| 10,525,684 B2 | 1/2020 | Boyd et al. | |
| 10,529,871 B2 | 1/2020 | Boyd et al. | |
| 10,546,991 B2 | 1/2020 | Boyd | |
| 10,553,774 B2 | 2/2020 | Boyd | |
| 10,559,864 B2 | 2/2020 | Birmingham | |
| 10,690,485 B2 | 6/2020 | Koester et al. | |
| 10,859,480 B2 | 12/2020 | Koester et al. | |
| 10,985,677 B2 | 4/2021 | Boyd et al. | |
| 2004/0099304 A1 | 5/2004 | Cox | |
| 2005/0016575 A1 | 1/2005 | Kumar et al. | |
| 2005/0104185 A1 | 5/2005 | Shimogishi et al. | |
| 2006/0068611 A1 | 3/2006 | Weaver, Jr. et al. | |
| 2006/0137732 A1 | 6/2006 | Farahani et al. | |
| 2007/0182362 A1 | 8/2007 | Trainor et al. | |
| 2008/0017237 A1 | 1/2008 | Bray et al. | |
| 2008/0053509 A1 * | 3/2008 | Flitsch | H01L 37/00 136/203 |
| 2008/0066796 A1 | 3/2008 | Mitchell et al. | |
| 2008/0149158 A1 * | 6/2008 | Logan | H01L 35/00 136/203 |
| 2009/0071526 A1 | 3/2009 | Parker | |
| 2009/0140465 A1 | 6/2009 | Plumpton | |
| 2010/0051092 A1 | 3/2010 | Dumitru et al. | |
| 2010/0068406 A1 | 3/2010 | Man | |
| 2010/0326487 A1 | 12/2010 | Komori et al. | |
| 2011/0104546 A1 | 5/2011 | Seino et al. | |
| 2011/0148248 A1 * | 6/2011 | Landa | H01J 45/00 310/306 |
| 2012/0153772 A1 * | 6/2012 | Landa | C23C 14/34 428/221 |
| 2013/0062457 A1 | 3/2013 | Deakin | |
| 2013/0101729 A1 | 4/2013 | Keremes et al. | |
| 2013/0206199 A1 | 8/2013 | Lassiter et al. | |
| 2013/0313745 A1 | 11/2013 | Ikushima | |
| 2014/0230875 A1 | 8/2014 | Angermann et al. | |
| 2014/0349430 A1 | 11/2014 | Kim | |
| 2015/0024516 A1 | 1/2015 | Seibel et al. | |
| 2015/0079504 A1 | 3/2015 | Farrugia | |
| 2015/0087144 A1 | 3/2015 | Liu et al. | |
| 2015/0207457 A1 * | 7/2015 | Trucchi | B23K 26/355 438/54 |
| 2015/0210400 A1 | 7/2015 | Gonidec et al. | |
| 2015/0211499 A1 | 7/2015 | Morin | |
| 2015/0229013 A1 * | 8/2015 | Birmingham | H02N 11/002 429/231.5 |
| 2015/0243867 A1 | 8/2015 | Geballe et al. | |
| 2015/0251213 A1 | 9/2015 | Birmingham et al. | |
| 2016/0305367 A1 * | 10/2016 | Ghoshal | B64C 39/024 |
| 2017/0106082 A1 | 4/2017 | Birmingham | |
| 2017/0126150 A1 | 5/2017 | Wang | |
| 2017/0155098 A1 | 6/2017 | Park et al. | |
| 2017/0252807 A1 | 9/2017 | Lund et al. | |
| 2017/0358432 A1 | 12/2017 | Wang | |
| 2018/0083176 A1 | 3/2018 | Ryu et al. | |
| 2019/0019981 A1 | 1/2019 | Kim et al. | |
| 2019/0214675 A1 | 7/2019 | Christensen et al. | |
| 2019/0214845 A1 | 7/2019 | Hausman, Jr. et al. | |
| 2019/0267846 A1 | 8/2019 | Shearer et al. | |
| 2019/0287773 A1 * | 9/2019 | Choi | G21H 1/106 |
| 2019/0356267 A1 | 11/2019 | Ganley | |
| 2020/0144039 A1 * | 5/2020 | Schmitt | H01J 45/00 |
| 2020/0153069 A1 | 5/2020 | Birmingham | |
| 2020/0273959 A1 | 8/2020 | Birmingham | |
| 2020/0274045 A1 | 8/2020 | Birmingham | |
| 2020/0274046 A1 | 8/2020 | Birmingham | |
| 2020/0303132 A1 | 9/2020 | Bhattacharjee et al. | |
| 2020/0346736 A1 | 11/2020 | Krasnoff | |
| 2020/0368848 A1 | 11/2020 | Birmingham | |
| 2020/0369516 A1 | 11/2020 | Birmingham | |
| 2020/0370158 A1 | 11/2020 | Birmingham | |
| 2021/0050800 A1 | 2/2021 | Jones et al. | |
| 2021/0050801 A1 | 2/2021 | Jones et al. | |
| 2021/0086208 A1 | 3/2021 | Birmingham et al. | |
| 2021/0091291 A1 | 3/2021 | Birmingham et al. | |
| 2021/0091685 A1 | 3/2021 | Birmingham et al. | |
| 2021/0135600 A1 | 5/2021 | Thibado et al. | |

FOREIGN PATENT DOCUMENTS

| | | |
|---|---|---|
| JP | 2006086510 | 3/2006 |
| JP | 4901049 | 3/2012 |
| JP | 6147901 | 6/2017 |
| JP | 6411612 | 10/2018 |
| JP | 6411613 | 10/2018 |

(56) References Cited

FOREIGN PATENT DOCUMENTS

| | | |
|---|---|---|
| JP | 6521400 | 5/2019 |
| JP | 6521401 | 5/2019 |
| JP | 6524567 | 6/2019 |
| JP | 6598339 | 10/2020 |
| JP | 6828939 | 2/2021 |
| KR | 20090106247 | 10/2009 |
| KR | 20180107194 | 10/2018 |
| WO | 2009004345 | 1/2009 |
| WO | 2012114366 | 8/2012 |
| WO | 2014186783 | 11/2014 |
| WO | 2014204549 | 12/2014 |
| WO | 2017214179 | 12/2017 |
| WO | 2020176344 | 9/2020 |
| WO | 2020176345 | 9/2020 |
| WO | 2020184234 | 9/2020 |
| WO | 2020184235 | 9/2020 |
| WO | 2020235254 | 11/2020 |
| WO | 2020236776 | 11/2020 |
| WO | 2021030489 | 2/2021 |
| WO | 2021061995 | 4/2021 |
| WO | 2021061996 | 4/2021 |
| WO | 2021061997 | 4/2021 |
| WO | 2021191629 | 9/2021 |

OTHER PUBLICATIONS

Kawano, H., "Effective work functions for ionic and electronic emissions from mono- and polycrystalline surfaces," Progress in Surface Science, vol. 83, pp. 1-165 (2008).
Kirchheim, Reiner, "Grain coarsening inhibited by solute segregation," Acta Materialia, vol. 50, pp. 413-419 (2002).
Kirchheim, Reiner, "Reducing grain boundary, dislocation line and vacancy formation energies by solute segregation II. Experimental evidence and consequences," Acta Materialia, vol. 55, pp. 5139-5148 (2007).
Kirchheim, Reiner, "Reducing grain boundary, dislocation line and vacancy formation energies by solute segregation. I. Theoretical backround," Acta Materialia, vol. 55, pp. 5129-5138 (2007).
Klimeck et al., "Quantum device simulation with a generalized tunneling formula," Appl. Phys. Lett., vol. 67, pp. 2539-2541 (1995).
Koch, C.C. et al., "Stabilization of nanocrystalline grain sizes by solute additions," Journal of Materials Science, vol. 43, Issue 23-24, pp. 7264-7272 (2008).
Koch, C.C. et al., "Ductility of Nanostructured Materials," Materials Research Society Bulletin, vol. 24, pp. 54-58 (1999).
Koch, C.C., "Synthesis of nanostructured materials by mechanical milling: problems and opportunities," Nanostructured Materials, vol. 9, Issues 1-8, pp. 13-22 (1997).
Koeck, Franz A.M. et al., "Thermionic electron emission from low work-function phosphorus doped diamond films," Diamond Related Material, vol. 18, pp. 789-791 (2009).
Landauer, R., "Spatial Variation of Currents and Fields Due to Localized Scatterers in Metallic Conduction," IBM Journal of Research and Development, vol. 1, pp. 223-231 (1957).
Lee, J.-H. et al., "Thermionic Emission From Microfabricated Silicon-Carbide Filaments," Proceedings Power MEMS, pp. 149-152 (2009).
Lee, Z. et al., "Bimodal microstructure and deformation of cryomilled bulk nanocrystalline Al-7.5Mg alloy," Materials Science and Engineering A, vols. 410-411, pp. 462-467 (2005).
Legros, M. et al., "Microsample tensile testing of nanocrystalline metals," Philosophical Magazine A, vol. 80, No. 4, pp. 1017-1026 (2000).
Lenggoro, I.W. et al., "Nanoparticle Assembly on Patterned "plus/minus" Surfaces From Electrospray of Colloidal Dispersion," Journal of Colloid and Interface Science, vol. 303, pp. 124-130 (2006).
Levine, J.D., "Structural and Electronic Model of Negative Electron Affinity on The Si/Cs/O Surface," Surface Science, vol. 34, pp. 90-107 (1973).
Likharev, Konstantin K., "Single-Electron Devices and Their Applications," Proc. IEEE, vol. 87, pp. 606-632 (1999).
Lin, M.C. et al., "Work functions of cathode surfaces with adsorbed atoms based on ab initio calculations," Journal of Vacuum Science and Technology B, vol. 26, pp. 821-825 (2008).
Lindell, L. et al., "Transparent, Plastic, Low-Work-Function Poly (3,4-ethylenedioxythiophene) Electrodes," Chemistry of Materials, vol. 18, pp. 4246-4252 (2006).
Lloyd, D.J., "Particle reinforced aluminum and magnesium matrix composites," International Materials Reviews, vol. 39, Issue 1, pp. 1-23 (1994).
Love, J.C. et al., "Self-Assembled Monolayers of Thiolates on Metals as a Form of Nanotechnology," Chemical Reviews, vol. 105, pp. 1103-1169 (2005).
Luo, Jian et al., "The Role of a Bilayer Interfacial Phase on Liquid Metal Embrittlement," Science, vol. 333, Issue 6050, pp. 1730-1733 (2011).
Maboudian, R. et al., "Critical Review: Adhesion in surface micromechanical structures," Journal of Vacuum Science and Technology B, vol. 15, pp. 1-20 (1997).
Maboudian, R. et al., "Self-assembled monolayers as anti-stiction coatings for MEMS: characteristics and recent developments," Sensors and Actuators, vol. 82, pp. 219-223 (2000).
Maboudian, R., "Surface processes in MEMS technology," Surface Science Reports, vol. 30, 207-269 (1998).
Magkoev, T.T. et al., "Aluminium oxide ultrathin-film growth on the Mo(110) surface: a work-function strudy," Journal of Physics: Condensed Matter, vol. 13, pp. L655-L661 (2001).
Mahan, G.D., "Thermionic refrigeration," Journal of Applied Physics, vol. 76, No. 7, pp. 4362-4366 (1994).
Marzari, Nicola et al., "Maximally localized generalized Wannier functions for composite energy bands," Physical Review B, vol. 56, No. 20, pp. 12847-12865 (1997).
Mayr, S.G. et al., "Stabilization of Cu nanostructures by grain boundary doping with Bi: Experiment versus molecular dynamics simulation," Physical Review B, vol. 76, pp. 024111 (2007).
McCandlish L.E. et al., "Chemical processing of nanophase WC—Co composite powders," Materials Science and Technology, vol. 6, Issue 10, pp. 953-957 (1990).
Millett, Paul C. et al., "Stabilizing nanocrystalline materials with dopants," Acta Materialia, vol. 55, pp. 2329-2336 (2007).
Modinos, A., "Theory of Thermionic Emission," Surface Science, vol. 115, pp. 469-500 (1982).
Moon, Kyoung II et al., "A study of the microstructure of nanocrystalline Al—Ti alloys synthesized by ball milling in a hydrogen atmosphere and hot extrusion," Journal of Alloys Compounds, vol. 291, pp. 312-321 (1999).
Morris, J.E., "Nanopackaging: Nanotechnologies and Electronics Packaging," Springer-Verlag, pp. 93-107 (2008).
Mortensen, A. et al., "Metal Matrix Composites," Annual Review of Materials Research, vol. 40, pp. 243-270 (2010).
Muller-Steinhagen, Hans et al., "Concentrating solar power," Ingenia, pp. 1-9 (2004).
Murata, Kazuhiro, "Super-fine ink-jet printing for nanotechnology," Proceedings International Conference on MEMS, NANO and Smart Systems, pp. 346-349 (2003).
Murray, Royce W., "Nanoelectrochemistry: Metal Nanoparticles, Nanoelectrodes, and Nanopores," Chemical Reviews, vol. 108, No. 7, pp. 2688-2720 (2008).
Musho, T.D. et al., "Quantum simulation of thermionic emission from diamond films," Journal of Vacuum Science and Technology B, vol. 31, p. 021401 (2013).
Nabarro, F.R.N., "The theory of solution hardening," The Philosophical Magazine: A Journal of Theoretical Experimental and Applied Physics, vol. 35, pp. 613-622 (1977).
Nan, C.W. et al., "The Influence of Particle Size and Particle Fracture on the Elastic/Plastic Deformation of Metal Matrix Composites," Acta Materialia, vol. 44, No. 9, pp. 3801-3811 (1996).
Natan, A. et al., "Computing surface dipoles and potentials of self-assembled monolayers from first principles," Applied Surface Science, vol. 252, pp. 7608-7613 (2006).

(56) References Cited

OTHER PUBLICATIONS

Neugebauer, J. et al., "Adsorbate-substrate and adsorbate-adsorbate interactions of Na and K adlayers on Al (111)," Physical Review B, vol. 46, pp. 16067-16080 (1992).
Nguyen, Hoang M. et al., "Thermionic emission via a nanofluid for direct electrification from low-grade heat energy," Nano Energy, vol. 49, pp. 172-178 (2018).
Nichols, M.H., "The Thermionic Constants of Tungsten as a Function of Crystallographic Direction," Physical Review, vol. 57, pp. 297-306 (1940).
Obraztsov, Alexander et al., "Cold and Laser Stimulated Electron Emission from Nanocarbons," Journal Nanoelectronics and Optoelectronics, vol. 4, pp. 1-13 (2009).
Olawole, O.C. et al., "Theoretical studies of thermionic conversion of solar energy with graphene as emitter and collector," Journal of Photonics for Energy, vol. 8(1), p. 018001 (2018).
Park, Jang-Ung et al., "High-resolution electrohydrodynamic jet printing," Nature Materials, vol. 6, pp. 782-789 (2007).
Park, Jang-Ung et al., "Nanoscale Patterns of Oligonucleotides Formed by Electrohydrodynamic Jet Printing with Applications in Biosensing and Nanomaterials Assembly," Nano Letters, vol. 8, pp. 4210-4216 (2008).
Perepezko, J.H., et al., "Amorphization and nanostructure synthesis in Al alloys", Intermetallics 10 (2002) p. 1079-1088.
Enikov, E.T. et al., "Analysis of Nanometer Vacuum Gap Formation in Thermo-tunneling Devices," Nanotechnology, vol. 19, p. 075703 (2008).
Humphrey, T.E. et al., "Power optimization in thermionic devices," Journal of Physics D: Applied Physics, vol. 38, pp. 2051-2054 (2005).
Mahan, G.D. et al., "Multilayer Thermionic Refrigeration," Physical Review Letters, vol. 80, pp. 4016-4019 (1998).
Nojeh, A., "Thermionic Energy Conversion: Fundamentals and Recent Progress Enabled by Nanotechnology," 19th International Conference on Micro and Nanotechnology for Power Generation and Energy Conversion Applications (2019).
O'Dwyer, M.F. et al., "The effect of barrier shape on thermionic refrigerator performance," Proceedings of SPIE, vol. 6035, p. 60350R (2006).
O'Dwyer, M.F. et al., "The Effect of the Electron Energy Spectrum on Electronic Efficiency and Power in Thermionic and Thermoelectric Devices," International Conference on Thermoelectrics, p. 456 (2005).
Shakouri, A. et al., "Heterostructure integrated thermionic coolers," Applied. Physics Letters, vol. 71, pp. 1234-1236 (1997).
List of Birmingham Technologies, Inc. Patents or Applications Treated as Related, Jun. 2021.
International Search Report PCT/US2021/050831, dated Jan. 7, 2022.
Provisional Written Opinion PCT/US2021/050831, dated Jan. 7, 2022.
Campbell, Matthew F., et al., "Progress Toward High Power Output in Thermionic Energy Converters", Advanced Science, vol. 8, No. 9, May 1, 2021.
Prada, S. et al., "Work function changes induced by deposition of ultrathin dielectric films on metals: A theoretical analysis," Physical Review B, vol. 78, p. 235423 (2008).
Prieto Rojas, J. et al., "Folding and Stretching a Thermoelectric Generator," Proceedings of the Society of Photo-Optical Instrumentation Engineers, vol. 10639, p. 10639E (2018).
Redko, Mikhail et al., "Design and Synthesis of a Thermally Stable Organic Electride," J. Am. Chem. Soc., vol. 127, No. 35, pp. 12416-12422 (2005).
Rusu, Paul et al., "Work functions of self-assembled monolayers on metal surfaces by first-principles calculations," Physical Review B, vol. 74, pp. 073414-1-073414-4 (2006).
Sanders, P.G. et al., "Elastic and Tensile Behavior of Nanocrystalline Copper and Palladium," Acta Materialia, vol. 15, No. 10, pp. 4019-4025 (1997).
Sanders, P.G. et al., "The strength of nanocrystalline metals with and without flaws," Materials Science Engineering A, vol. 234-236, pp. 77-82 (1997).
Scheible, Dominik V. et al., "Tunable coupled nanomechanical resonators for single-electron transport," New Journal of Physics, vol. 4, pp. 86.1-86.7 (2002).
Schneider, Julian, "Electrohydrodynamic nanoprinting and its applications," Diss. ETH No. 22694 (2015).
Schreiber, Frank, "Structure and growth of self-assembling monolayers," Progress in Surface Science, vol. 65, pp. 151-256 (2000).
Schwede, J.W. et al., "Photon-enhanced thermionic emission for solar concentrator systems," Nature Materials, vol. 9, p. 762-767 (2010).
Scoville, N. et al., "Thermal Conductivity Reductions in SiGe Via Addition of Nanophase Particles," Materials Research Society Symposium Proceedings, vol. 351, pp. 431-436 (1994).
Sekine, H. et al., "A combined microstructure strengthening analysis of SiC—p/Al metal matrix composites," Composites, vol. 26, pp. 183-188 (1995).
Shakouri, Ali, "Nanoscale Thermal Transport and Microrefrigerators on a Chip," Proceedings of the IEEE, vol. 94, No. 8, pp. 1613-1638 (2006).
Shockley, William et al., "Detailed Balance Limit of Efficiency of pn Junction Solar Cells," Journal of Applied Physics, vol. 32, pp. 510-519 (1961).
Sindhuja, M. et al., "High Efficiency Graphene Coated Copper Based Thermocells Connected in Series," Frontiers in Physics, vol. 6, Article 35 (2018).
Singh-Miller, N.E. et al., "Surface energies, work functions, and surface relaxations of low-index metallic surfaces from first principles," Physical Review B, vol. 80, p. 235407 (2009).
Snider, D.R. et al., "Variational calculation of the work function for small metal spheres," Solid State Communications, vol. 47, No. 10, pp. 845-849 (1983).
Snyder, G. et al., "Complex thermoelectric materials," Nature Materials, vol. 7, pp. 105-114 (2008).
Sodha, M.S. et al., "Dependence of Fermi energy on size," Journal of Physics D: Applied Physics, vol. 3, No. 2, pp. 139-144 (1970).
Stephanos, Cyril, "Thermoelectronic Power Generation from Solar Radiation and Heat," University of Augsburg, Ph.D. Thesis, Nov. 2012.
Taylor, Geoffrey, "Disintegration of water drops in an electric field," Proc. R. Soc. A, vol. 280, pp. 383-397 (1964).
Templeton, Allen C. et al., "Monolayer-Protected Cluster Molecules," Accounts of Chemical Research, vol. 33, No. 1, pp. 27-36 (2000).
Tepper, Gary et al., "An electrospray-based, ozone-free air purification technology," Journal of Applied Physics, vol. 102, pp. 113305-1-113305-6 (2007).
Thygesen, Kristian S. et al., "Partly occupied Wannier functions," Physical Review Letters, vol. 94, pp. 026405-1-026405-4 (2005).
Tsuji, N. et al., "Strength and ductility of ultrafine grained aluminum and iron produced by ARB and annealing," Scripta Materialia, vol. 47, pp. 893-899 (2002).
Ulrich, Marc D. et al., "Comparison of solid-state thermionic refrigeration with thermoelectric refrigeration," Journal of Applied Physics, vol. 90, No. 3, pp. 1625-1631 (2001).
Valiev, R. Z. et al., "Bulk nanostructured materials from severe plastic deformation," Progress in Materials Science, vol. 45, pp. 103-189 (2000).
Valiev, R.Z. et al., "Producing Bulk Ultrafine-Grained Materials by Severe Plastic Deformation," Journal of Materials, vol. 58, Issue 4, p. 33 (2006).
Valiev, R.Z. et al., "Paradox of strength and ductility in metals processed by severe plastic deformation," Journal of Materials Research, vol. 17, No. 1, pp. 5-8 (2002).
Vanherpe, L. et al., "Pinning effect of spheroid second-phase particles on grain growth studied by three-dimensional phase-field simulations", Computational Materials Science 49 (2010) 340-350.
Vlahos, V. et al., "Ab initio investigation of barium-scandium-oxygen coatings on tungsten for electron emitting cathodes," Physical Review B, vol. 81, p. 054207 (2010).

(56) References Cited

OTHER PUBLICATIONS

Wada, Motoi et al., "Effective Work Function of an Oxide Cathode in Plasma," J. Plasma Fusion Res. Series, vol. 8, pp. 1366-1369 (2009).
Wang, C.S., "High photoemission efficiency of submonolayer cesium-covered surfaces," Journal of Applied Physics, vol. 48, pp. 1477-1479 (1977).
Wang, Y. et al.,"High tensile ductility in a nanostructured metal", Nature, 419 (2002), 912-915.
Wang, Y. M. et al., "Enhanced tensile ductility and toughness in nanostructured Cu," Applied Physics Letters, vol. 80, pp. 2395-2397 (2002).
Watanabe, Satoru et al., "Secondary electron emission and glow discharge properties of 12CaO—7Al2O3 electride for fluorescent lamp applications," Science and Technology of Advanced Materials, vol. 12, pp. 1-8 (2011).
Weaver, Stan et al., "Thermotunneling Based Cooling Systems for High Efficiency Buildings," GE Global Research, DOE Project: DE-FC26-04NT42324 (2007).
Weertman, J.R. et al., "Structure and Mechanical Behavior of Bulk Nanocrystalline Materials," Materials Research Society Bulletin, vol. 24, pp. 44-50 (1999).
Weiss, C. et al., "Accuracy of a mechanical single-electron shuttle," Europhysics Letters, vol. 47, No. 1, p. 97 (1999).
Weissmuller, J., "Alloy Effects in Nanostructures" Nanostructured Materials, vol. 3, pp. 261-272 (1993).
Wooten, L.A. et al., "Evaporation of Barium and Strontium from Oxide-Coated Cathodes," Journal of Applied Physics, vol. 26, pp. 44-51 (1955).
Xiao, T.D. et al., "Synthesis of Nanostructured Ni/Cr and Ni—Cr3C2 Powders by an Organic Solution Reaction Method," Nanostructured Materials, vol. 7, No. 8, pp. 857-871 (1996).
Xiao, T.D. et al., "Synthesis of Si(N,C) nanostructured powders from an organometallic aerosol using a hot-wall reactor," Journal of Materials Science, vol. 28, pp. 1334-1340 (1993).
Yamamoto, Shigehiko, "Fundamental physics of vacuum electron sources," Reports on Progress in Physics, vol. 69, pp. 181-232 (2006).
Yamasaki, T. et al., "Formation of metal-TiN/TiC nanocomposite powders by mechanical alloying and their consolidation," Materials Science and Engineering A, vol. 350, pp. 168-172 (2003).
Zhao, Y.P., "Morphological stability of epitaxial thin elastic films by van der Waals force," Archive of Applied Mechanics, vol. 72, pp. 77-84 (2002).
Zharin, Anatoly L. et al., "Application of the contact potential difference technique for on-line rubbing surface monitoring (review)," Tribology Letters, vol. 4, pp. 205-213 (1998).
Zhu, Moxuan, "Experimental Measurements of Thermoelectric Phenomena in Nanoparticle Liquid Suspensions (Nanofluids)," Graduate Thesis, Arizona State University, Dec. 2010.
International Search Report and Written Opinion for PCT/US2021/021676, dated May 2021.
Office Action for U.S. Appl. No. 16/582,545 dated Nov. 30, 2021.
Office Action for U.S. Appl. No. 17/483,916 dated Nov. 23, 2021.
International Search Report and Written Opinion for PCT/US2020/019230, dated Jun. 8, 2020.
International Search Report and Written Opinion for PCT/US2020/019232, dated Jun. 8, 2020.
International Search Report and Written Opinion for PCT/US2020033528, dated Aug. 5, 2020.
International Search Report and Written Opinion for PCT/US2020052506, dated Dec. 18, 2020.
International Search Report and Written Opinion for PCT/US2020/0525507, dated Dec. 18, 2020.
International Search Report and Written Opinion for PCT/US2020/05255508, dated Dec. 18, 2020.
Updated List of Assignee Patents and/or Patent Applications of Assignee, Dec. 2021.
Alhuwaidi, S.A., "3D Modeling Analysis, and Design of a Traveling-Wave Tube Using a Modified Ring-Bar Structure with Rectangular Transmission Lines Geometry," Dissertation submitted to the University of Colorado Colorado Springs (2017).
Baram, M. et al., "Nanometer-Thick Equilibrium Films: The Interface Between Thermodynamics and Atomistics," Science, vol. 332, Issue 6026, pp. 206-209 (2011).
Bassani, J.L., "Incompatibility and a simple gradient theory of plasticity," Journal of Mechanics and Physics of Solids vol. 49, pp. 1983-1996 (2001).
Battezzati, L. et al., "Solid state reactions in Al/Ni alternate foils induced by cold rolling and annealing," Acta Materialia, vol. 47, Issue 6, pp. 1901-1914 (1999).
Bell, Lon E., "Cooling, heating, generating power, and recovering waste heat with thermoelectric systems," Science, vol. 321, pp. 1457-1461 (2008).
Bhadrachalam, Pradeep et al., "Energy-filtered cold electron transport at room temperature," Nature Communications, Sep. 10, 2014.
Birmingham, J.G., "DEP-Enhanced Micro-Injector Array for Liquid Fuel Atomizer," Final Report for U.S. Army SBIR 02.2 N02-148 (2001).
Birmingham, J.G., "E-Field Micro-Injector Array Liquid Fuel Atomizer," Final Report for NASA SBIR Phase I: NASA 01.1-A8.02 (2002).
Birmingham, Joseph, "Printed Self-Powered Miniature Air Sampling Sensors," Sensors and Transducers, vol. 214, pp. 1-11 (2017).
Brezonik, Patrick L. et al., "Water Chemistry: An Introduction to the Chemistry of Natural and Engineered Aquatic Systems," Oxford University Press, Inc., pp. 170-175 (2011).
Brodie, I. et al., "Impregnated Barium Dispenser Cathodes Containing Strontium or Calcium Oxide," Journal of Applied Physics, vol. 27, pp. 417-418 (1956).
Brodie, I. et al., "Secondary electron emission from barium dispenser cathodes," British Journal of Applied Physics, vol. 8, pp. 202-204 (1957).
Brown, D.R. et al. "The Prospects of Alternatives to Vapor Compression Technology for Space Cooling and Food Refrigeration Applications," Prepared for the U.S. Department of Energy under Contract DE-AC05-76RL01830 Mar. 2010.
Choi, S.U.S et al., "Enhancing Thermal Conductivity of Fluids with Nanoparticles," Energy Technology Division and Materials Science Division Argonne National Laboratory, Jan. 1995.
Chou, S.H. et al.,"An orbital-overlap model for minimal work functions of cesiated metal surfaces," Journal of Physics Condensed Matter, vol. 24, p. 445007 (2012).
Chung, M.S. et al., "Energy exchange processes in electron emission at high fields and temperatures," Journal of Vacuum Science and Technology B, vol. 12, pp. 727-736 (1994).
Committee on Thermionic Research and Technology et al., "Thermionics: Quo Vadis? An Assessment of the DTRA's Advanced Thermionics Research and Development Program," National Academy Press (2001).
Cronin, J.L., "Modern dispenser cathodes," IEE Proc., vol. 128, Pt. 1, No. 1, pp. 19-32 (1981).
Curzon, F.L. et al., "Efficiency of a Carnot engine at maximum power output," American Journal of Physics, vol. 43, pp. 22-24 (1975).
Cutler, P.H. et al., "A new model for the replacement process in electron emission at high fields and temperatures," Applied Surface Science, vol. 76-77, pp. 1-6 (1994).
Daniel, Marie-Christine et al., "Gold Nanoparticles: Assembly, Supramolecular Chemistry, Quantum-Size-Related Properties, and Applications toward Biology, Catalysis, and Nanotechnology," Chemical Reviews, vol. 104, No. 1, pp. 293-346 (2004).
Darling, K.A. et al., "Thermal stability of nanocrystalline Fe—Zr alloys," Materials Science and Engineering A, vol. 527, pp. 3572-3580 (2010).
Datta, S., "Electronic Transport in Mesoscopic Systems," Cambridge University Press, New York, pp. 246-275 (1995).
De Juan, L. et al., "Charge and size distribution of electrospray drops," Journal of Colloid Interface Science, vol. 186, No. 2, pp. 280-293 (1997).

(56) References Cited

OTHER PUBLICATIONS

Deng et al., "Digital electrospray for controlled deposition," Review of Scientific Instruments, vol. 81, pp. 035114-1-035114-6 (2010).
Deng, Weiwei et al., "Influence of space charge on the scale-up of multiplexed electrosprays," Aerosol Science 38, pp. 1062-1078 (2007).
Detor, Andrew J. et al., "Grain boundary segregation, chemical ordering and stability of nanocrystalline alloys: Atomistic computer simulations in the Ni—W system," Acta Materialia, vol. 55, pp. 4221-4232 (2007).
Dillner, U., "The effect of thermotunneling on the thermoelectric figure of merit," Energy Conversion and Management, vol. 49, No. 12, pp. 3409-3425 (2008).
Dinda, G.P. et al., "Synthesis of bulk nanostructured Ni, Ti and Zr by repeated cold-rolling," Scripta Materialia, vol. 52, Issue 7, pp. 577-582 (2005).
Fall, C.J. et al., "Deriving accurate work functions from thin-slab calculations," Journal of Physics: Condensed Matter, vol. 11 2689-2696 (1999).
Fall, C.J. et al.,"Theorectical maps of work-function anisotropies," Physical Review B, vol. 65, p. 045401 (2001).
Fernandez De La Mora, J. et al., "Generation of submicron monodisperse aerosols in electrosprays," Journal of Aerosol Science, vol. 21, Supplement 1, pp. S673-S676 (1990).
Fisher, T.S. et al., "Thermal and Electrical Energy Transport and Conversion in Nanoscale Electron Field Emission Processes," Journal of Heat Transfer, vol. 124, pp. 954-962 (2002).
Fomenko, V.S., "Handbook of Thermionic Properties, Electronic Work Functions and Richardson Constants of Elements and Compounds," Plenum Press Data Division, New York, pp. 126-137 (1966).
Fu, Xinyong et al., "Realization of Maxwell's Hypothesis," Shanghai Jiao Tong University (2008).
Gertsman, V. Y. et al., "Deformation behavior of ultrafine-grained materials," Materials Science Forum, vols. 225-227, pp. 739-744 (1996).
Giordano, L. et al., "Tuning the surface metal work function by deposition of ultrathin oxide films: Density functional calculations," Physical Review B, vol. 73, p. 045414 (2005).
Go, David B. et al., "Thermionic Energy Conversion in the Twenty-first Century: Advances and Opportunities for Space and Terrestrial Applications," Frontiers in Mechanical Engineering, vol. 3 (2017).
Gudmundson, Peter, "A unified treatment of strain gradient plasticity," Journal of the Mechanics and Physics of Solids, vol. 52, pp. 1379-1406 (2004).
Gyftopoulos, E.P. et al, "Work Function Variation of Metals Coated by Metallic Films," Journal of Applied Physics, vol. 33, pp. 6-737 (1962).

Haas, G.A. et al., "Interatomic Auger Analysis of the Oxidation of Thin Ba Films," Applications of Surface Science, vol. 16, pp. 139-162 (1983).
Hafner, J. et al., "Toward Computational Materials Design: The Impact of Density Functional Theory on Materials Research," MRS Bulletin, vol. 31, pp. 659-668 (2006).
Hatsopoulos, G.N. et al., "Thermionic Energy Conversion vol. I: Process and Devices," The MIT Press, Cambridge, MA, pp. 5-37 (1973).
Hentschel, T. et al., "Nanocrytsalline Ni-3.6 at.% p. and its Transformation Sequence Studied by Atom-Probe Field-Ion Microscopy," Acta Materialia, vol. 48, pp. 933-941 (2000).
Hishinuma, Y. et al., "Refrigeration by combined tunneling and thermionic emission in vacuum: use of nanometer scale design," Applied Physics Letters, vol. 78, No. 17, pp. 2572-2574 (2001).
Hishinuma, Yoshikazu et al., "Measurements of cooling by room-temperature thermionic emission across a nanometer gap," Journal of Applied Physics, vol. 94, No. 7, p. 4690 (2003).
Houston, J.M., "Theoretical Efficiency of the Thermionic Energy Converter," Journal of Applied Physics, vol. 30, pp. 481-487 (1959).
Incropera, F.P. et al., "Fundamentals of Heat and Mass Transfer, 6th Edition," John Wiley & Sons, pp. 2-42 (2007).
Ioffe, A.F., "Semiconductor Thermoelements and Thermoelectric Cooling Infosearch," Infosearch Ltd., (1957).
Jaworek, A., "Electrospray droplet sources for thin film deposition," Journal of Materials Science, vol. 42, Issue 1, pp. 266-297 (2007).
International Search Report for PCT/US2021/037166, dated Sep. 2021.
Notice of Allowance for U.S. Appl. No. 16/745,071, dated Oct. 2021.
Updated International Search Report PCT/US2021/050831, dated Apr. 20, 2022.
Updated Written Opinion PCT/US2021/050831, dated Apr. 20, 2022.
Office Action, U.S. Appl. No. 16/817,112, filed Apr. 12, 2022.
Office Action, U.S. Appl. No. 16/817,122, filed Apr. 7, 2022.
Eaton Ellipse ECO spec sheet, pp. 1-2 (2011).
Im, Hyeongwook, et al., "High-efficiency electrochemical thermal energy harvester using carbon nanotube aerogel sheet electrodes", Nature Communications 7, Article No. 10600, (2016).
Pearson, Amanda, "10 advantages of 3D printing", (2018).
Zebarjadi, Mona, "Thermionic and Thermoelectric Power Generators", University of Virginia, (2010), pp. 1-19.
Office Action, U.S. Appl. No. 17/003,266, filed Jul. 27, 2022.
Office Action, U.S. Appl. No. 16/906,508, filed Jul. 21, 2022.
Office Action, U.S. Appl. No. 16/416,858, filed Jul. 20, 2022.
Office Action, U.S. Appl. No. 16/864,759, filed Jul. 13, 2022.
Office Action, U.S. Appl. No. 17/407,450, filed Aug. 3, 2022.
Updated List of Assignee Patents and/or Patent Applications of Assignee, May 2022.

* cited by examiner

THERMAL-TRANSFER APPARATUS INCLUDING THERMIONIC DEVICES, AND RELATED METHODS

BACKGROUND

Embodiments disclosed herein relate to a thermal-transfer apparatus including a plurality thermal energy harvesting thermionic devices configured to provide a cooling or temperature-reduction effect. Also provided are related circuits and methods, including methods of making and using the apparatus.

Existing thermal-transfer devices, such as those relying on vapor compression (i.e., refrigeration cycles) are relatively inefficient due to mechanical components such as compressors and environmentally degrading due to atmosphere-degrading refrigerants.

SUMMARY

Exemplary embodiments disclosed herein include apparatuses, circuits, and methods including or relating to thermal transfer. This Summary is provided to introduce a selection of representative concepts in a simplified form, which concepts are further described below in the Detailed Description. This Summary is not intended to identify key features or essential features of the claimed subject matter, nor is it intended to be used to limit the scope of the claimed subject matter.

In an aspect, an apparatus is provided comprising first and second panels. The first panel comprises a first sheet having first opposite surfaces, first thermally insulating coatings respectively positioned on the first opposite surfaces of the first sheet, and at least one first thermal energy harvesting thermionic device positioned in a first passage extending through the first sheet, wherein the at least one first thermionic device is not covered by the first thermally insulating coatings. The at least one first thermal energy harvesting thermionic device comprises a first emitter electrode, a first collector electrode, a first nano-fluid positioned between an inner surface of the first emitter electrode and an inner surface of the first collector electrode, one or more first emitter-side thermal conductors, and one or more first collector-side thermal conductors. The first nano-fluid comprises a first medium and a first plurality of nanoparticles in the first medium. The first nanoparticles are configured to transfer electrons between the first emitter electrode and the first collector electrode during operation of the apparatus to cool the first emitter electrode. The one or more first emitter-side thermal conductors are positioned adjacent to an outer surface of the first emitter electrode and in thermal communication with the first emitter electrode. The one or more first collector-side thermal conductors are positioned adjacent to an outer surface of the first collector electrode and in thermal communication with the first collector electrode. The second panel of the apparatus comprises a second sheet having second opposite surfaces, second thermally insulating coatings respectively positioned on the second opposite surfaces of the second sheet, and at least one second thermal energy harvesting thermionic device positioned in a second passage extending through the second sheet, wherein the at least one second thermionic device is not covered by the second thermally insulating coatings. The at least one second thermal energy harvesting thermionic device comprises a second emitter electrode, a second collector electrode, a second nano-fluid positioned between an inner surface of the second emitter electrode and an inner surface of the second collector electrode, one or more second emitter-side thermal conductors, and one or more second collector-side thermal conductors. The second nano-fluid comprises a second medium and a second plurality of nanoparticles in the second medium. The second nanoparticles are configured to transfer electrons between the second emitter electrode and the second collector electrode during operation of the apparatus. The one or more second emitter-side thermal conductors are positioned adjacent to an outer surface of the second emitter electrode and in thermal communication with the second emitter electrode. The one or more second collector-side thermal conductors are positioned adjacent to an outer surface of the second collector electrode and in thermal communication with the second collector electrode. The one or more second emitter-side thermal conductors of the at least one second thermal energy harvesting thermionic device are proximal to the one or more first collector-side thermal conductors of the at least one first thermal energy harvesting thermionic device to receive heat from the one or more first collector-side thermal conductors of the at least one first thermal energy harvesting thermionic device during operation of the apparatus.

Another aspect provides a circuit including an apparatus and an electrically conductive path. The apparatus comprises first and second panels. The first panel comprises a first sheet having first opposite surfaces, first thermally insulating coatings respectively positioned on the first opposite surfaces of the first sheet, and at least one first thermal energy harvesting thermionic device positioned in a first passage extending through the first sheet, wherein the at least one first thermionic device is not covered by the first thermally insulating coatings. The at least one first thermal energy harvesting thermionic device comprises a first emitter electrode, a first collector electrode, a first nano-fluid positioned between an inner surface of the first emitter electrode and an inner surface of the first collector electrode, one or more first emitter-side thermal conductors, and one or more first collector-side thermal conductors. The first nano-fluid comprises a first medium and a first plurality of nanoparticles in the first medium. The first nanoparticles are configured to transfer electrons between the first emitter electrode and the first collector electrode during operation of the apparatus to cool the first emitter electrode. The one or more first emitter-side thermal conductors are positioned adjacent to an outer surface of the first emitter electrode and in thermal communication with the first emitter electrode. The one or more first collector-side thermal conductors are positioned adjacent to an outer surface of the first collector electrode and in thermal communication with the first collector electrode. The second panel of the apparatus comprises a second sheet having second opposite surfaces, second thermally insulating coatings respectively positioned on the second opposite surfaces of the second sheet, and at least one second thermal energy harvesting thermionic device positioned in a second passage extending through the second sheet, wherein the at least one second thermionic device is not covered by the second thermally insulating coatings. The at least one second thermal energy harvesting thermionic device comprises a second emitter electrode, a second collector electrode, a second nano-fluid positioned between an inner surface of the second emitter electrode and an inner surface of the second collector electrode, one or more second emitter-side thermal conductors, and one or more second collector-side thermal conductors. The second nano-fluid comprises a second medium and a second plurality of nanoparticles in the second medium. The second nanoparticles are configured to transfer electrons between the second emitter electrode and the second collector electrode during operation of the apparatus. The one or more second emitter-side thermal conductors are positioned adjacent to an outer surface of the second emitter electrode and in thermal communication with the second emitter electrode. The one or more second collector-side thermal conductors are positioned adjacent to an outer surface of the second collector electrode and in thermal communication with the second collector electrode. The one or more second emitter-side thermal conductors of the at least one second thermal energy harvesting thermionic device are proximal to the one or more first collector-side thermal conductors of the at least one first thermal energy harvesting thermionic device to receive heat from the one or more first collector-side thermal conductors of the at least one first thermal energy harvesting thermionic device during operation of the apparatus. The circuit comprises an electrically conductive path configured to electrically couple at least the first thermal energy harvesting thermionic device, the second thermal energy harvesting thermionic device, or a combination of the first and second thermionic devices to an electrical load.

A further aspect provides a method of operating an apparatus. The first panel comprises a first sheet having first opposite surfaces, first thermally insulating coatings respectively positioned on the first opposite surfaces of the first sheet, and at least one first thermal energy harvesting thermionic device positioned in a first passage extending through the first sheet, wherein the at least one first thermionic device is not covered by the first thermally insulating coatings. The at least one first thermal energy harvesting thermionic device comprises a first emitter electrode, a first collector electrode, a first nano-fluid positioned between an inner surface of the first emitter electrode and an inner surface of the first collector electrode, one or more first emitter-side thermal conductors, and one or more first collector-side thermal conductors. The first nano-fluid comprises a first medium and a first plurality of nanoparticles in the first medium. The first nanoparticles are configured to transfer electrons between the first emitter electrode and the first collector electrode during operation of the apparatus to cool the first emitter electrode. The one or more first emitter-side thermal conductors are positioned adjacent to an outer surface of the first emitter electrode and in thermal communication with the first emitter electrode. The one or more first collector-side thermal conductors are positioned adjacent to an outer surface of the first collector electrode and in thermal communication with the first collector electrode. The second panel of the apparatus comprises a second sheet having second opposite surfaces, second thermally insulating coatings respectively positioned on the second opposite surfaces of the second sheet, and at least one second thermal energy harvesting thermionic device positioned in a second passage extending through the second sheet, wherein the at least one second thermionic device is not covered by the second thermally insulating coatings. The at least one second thermal energy harvesting thermionic device comprises a second emitter electrode, a second collector electrode, a second nano-fluid positioned between an inner surface of the second emitter electrode and an inner surface of the second collector electrode, one or more second emitter-side thermal conductors, and one or more second collector-side thermal conductors. The second nano-fluid comprises a second medium and a second plurality of nanoparticles in the second medium. The second nanoparticles are configured to transfer electrons between the second emitter electrode and the second collector electrode during operation of the apparatus. The one or more second emitter-side thermal conductors are positioned adjacent to an outer surface of the second emitter electrode and in thermal communication with the second emitter electrode. The one or more second collector-side thermal conductors are positioned adjacent to an outer surface of the second collector electrode and in thermal communication with the second collector electrode. The one or more second emitter-side thermal conductors of the at least one second thermal energy harvesting thermionic device are proximal to the one or more first collector-side thermal conductors of the at least one first thermal energy harvesting thermionic device to receive heat from the one or more first collector-side thermal conductors of the at least one first thermal energy harvesting thermionic device during operation of the apparatus. According to an exemplary embodiment of the aspect, a first body is positioned proximal to the first panel to transfer heat from the first body to the at least one first thermal energy harvesting thermionic device. Electrons are emitted from the first emitter electrode through the first nano-fluid and are receive at the first collector electrode to raise a temperature of the first collector electrode and the one or more first collector-side thermal conductors. Heat is transferred from the one or more first collector-side thermal conductors to the one or more second emitter-side thermal conductors of the second thermal energy harvesting thermionic device.

Other aspects disclosed herein include systems, devices, components, apparatus, assemblies, sub-assemblies, methods, and processes. Features of these and other aspects will become apparent from the following detailed description of exemplary embodiments, taken in conjunction with the accompanying drawings.

BRIEF DESCRIPTION OF THE SEVERAL VIEWS OF THE DRAWINGS

The drawings referenced herein form a part of and are incorporated into the specification. Features shown in the drawings are meant as illustrative of only some embodiments, and not of all embodiments, unless otherwise explicitly indicated.

DETAILED DESCRIPTION OF EXEMPLARY EMBODIMENTS

It will be readily understood that the components and features of the exemplary embodiments, as generally described herein and illustrated in the Figures, may be arranged and designed in a wide variety of different configurations. Thus, the following detailed description of the embodiments of the methods, devices, assemblies, apparatus, systems, compositions, etc. of the exemplary embodiments, as presented in the Figures, is not intended to limit the scope of the embodiments, as claimed, but is merely representative of selected embodiments.

The illustrated embodiments will be best understood by reference to the drawings, wherein like parts are designated by like numerals throughout. The following description is intended only by way of example, and illustrates certain selected embodiments of methods, devices, assemblies, apparatus, systems, etc. that are consistent with the embodiments as claimed herein.

Reference throughout this specification to "a select embodiment," "one embodiment," "an exemplary embodiment," "exemplary embodiments," "an embodiment," or "embodiments" means that a particular feature, structure, or characteristic described in connection with the embodiment(s) is included in at least one embodiment. Thus, appearances of the phrases "in a select embodiment," "in one embodiment," "in an exemplary embodiment," "in exemplary embodiments," "in an embodiment," or "in embodiments" in various places throughout this specification are not necessarily referring to the same embodiment(s). The embodiments may be combined with one another in various combinations and modified to include features of one another.

Figure 1A:
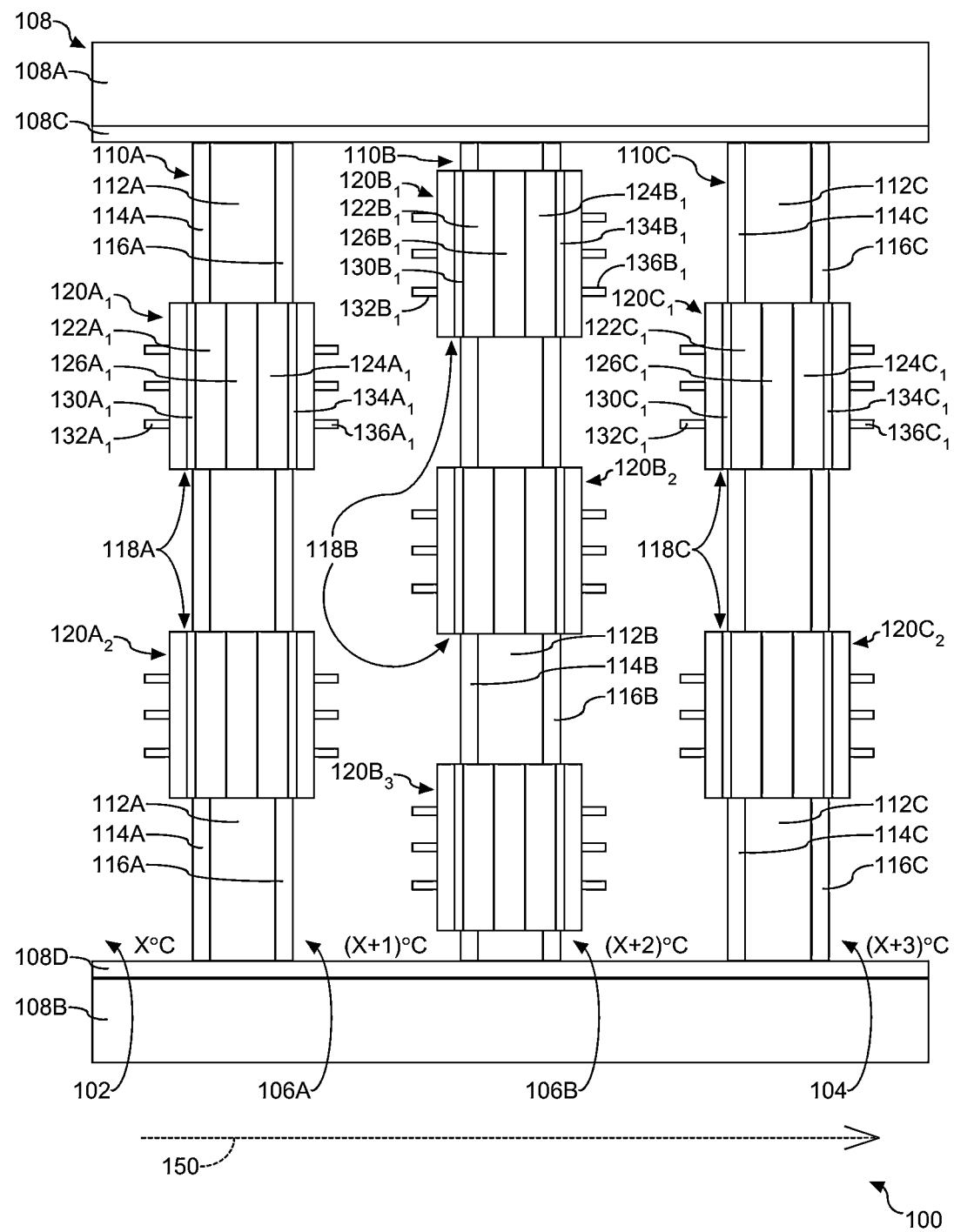
FIG. 1A illustrates a fragmented, cross-sectional view depicting an apparatus according to an exemplary embodiment.

Referring now more particularly to FIG. 1A, a diagram illustrates a fragmented, cross-sectional view of a thermal-transfer apparatus, generally designated by reference numeral (100), according to an exemplary embodiment.

The thermal-transfer apparatus (100) may be in the form of a physical device, apparatus, machine, or equipment configured for use in a commercial or domestic domain. In exemplary embodiments, the thermal-transfer apparatus (100) may be embodied as a standalone apparatus. In other exemplary embodiments, the thermal-transfer apparatus (100) may be incorporated, e.g., as a component, sub-system or sub-assembly, into an apparatus, a system or assembly, respectively. In one exemplary embodiment, the thermal-transfer apparatus (100) can be incorporated into or used as a variety of heating and/or cooling and power generation systems, such as but not limited to, refrigeration, air conditioning, electronics cooling, industrial temperature control, waste heat recovery, off-grid and mobile refrigeration, and cold storage systems.

The thermal-transfer apparatus (100) includes housing (108), only a portion of which is shown in FIG. 1 in fragmented view. The housing (108) can be made of any suitable material, including, for example, metal, plastic, aerogel, or composite material, or any combination thereof. In an exemplary embodiment, the housing (108) is made of a heat insulating material.

The housing (108) is shown as including opposite (e.g., top and bottom) walls (108A) and (108B), respectively, spaced from one another. Although not shown, the housing (108) may further include additional walls, such as end walls and side walls. The illustrated top wall (108A) and the bottom wall (108B) are coated with insulating layers (108C) and (108D), respectively. In exemplary embodiment the insulating layers (108C) and (108D) are aerogels, for example, as described in further detail below.

The housing (108) supports a plurality of panels (also referred to herein as layers) (110A), (110B), and (110C). While first, second, and third panels (110A), (110B), and (110C), respectively, are shown in FIG. 1A for explanatory purposes, it should be understood that the apparatus (100) may include fewer or more panels than the three panels (110A), (110B), and (110C) shown in FIG. 1A, including, by way of example, e.g., tens or hundreds of panels. In an exemplary embodiment, the panels (e.g., (110A), (110B), (110C), etc.) are substantially parallel to one another and spaced from one another.

In an exemplary embodiment, the first and second panels (110A) and (110B), respectively, are arranged substantially parallel to one another and spaced from one another to establish a first compartment (106A) between the panels (110A) and (110B). Similarly, the second and third panels (110B) and (110C), respectively, are arranged substantially parallel to and spaced from one another and define a second compartment (106B) between the panels (110B) and (110C). In an exemplary embodiment, the first and second compartments (106A) and (106B), respectively, are filled with air or another gas. In another embodiment (not shown), the inter-panel spacing shown in FIG. 1A is reduced or eliminated, so that the panels (e.g., (110A), (110B), (110C), etc.) are immediately adjacent to and/or in contact with one another to eliminate or substantially eliminate the first and second compartments (106A) and (106B), respectively.

In an exemplary embodiment, a first region or atmosphere (102) is positioned on an opposite side of the first panel (110A) from the first compartment (106A), and a second region or atmosphere (104) is positioned on an opposite side of the "nth" panel, i.e., the third panel (110C) in FIG. 1A, from the second compartment (106B). A first body (not shown in FIG. 1A), such as an object, device, or system, may be positioned in the first region (102) and a second body (not shown in FIG. 1A) may be positioned in the second region (104).

Each of the first, second, and third panels (110A), (110B), and (110C), respectively, is illustrated as a planar panel in FIG. 1A. According to alternative embodiments, the first, second, and third panels (110A), (110B), and (110C), respectively, possess sufficient pliability and/or flexibility to be physically manipulated (e.g., rolled, bent, folded, etc.) into other shapes, or may be manufactured into other shapes. For example, the first, second, and third panels (110A), (110B), and (110C), respectively, may be rolled about one another to form a cylindrical shape, with the panels (110A), (110B), and (110C) in a spiral or non-spiral configuration. As another example, the first, second, and third panels (110A), (110B), and (110C), respectively, may have U-shapes, e.g., the first panel (110A) nested within the second panel (110B), and the second panel (110B) nested within the third panel (110C), etc. The quantity, size, shape, spacing, proportions, and position of the first, second, and third panels (110A), (110B), and (110C), respectively, and the first and second compartments (106A) and (106B), respectively, may vary and should not be considered limiting.

Figure 1B:
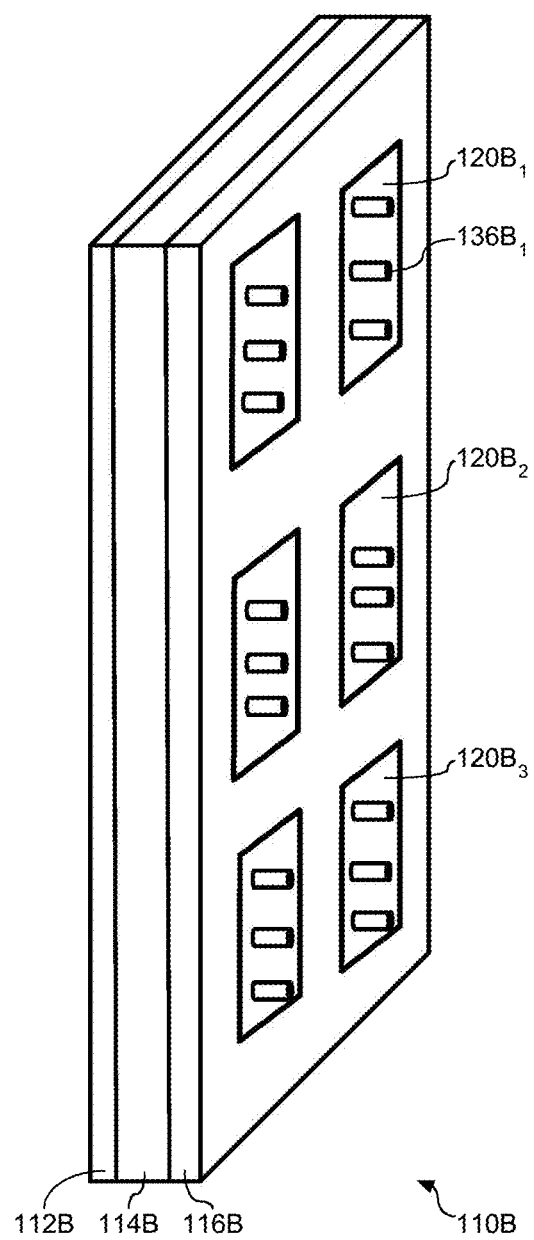
FIG. 1B illustrates a perspective side view depicting a panel of the apparatus of FIG. 1A in cross-section.

As shown in FIGS. 1A and 1B, the first panel (110A) includes a first sheet or substrate (112A) and first insulating coatings (114A) and (116A) respectively positioned on opposite exterior surfaces (unnumbered) of the first sheet or substrate (112A). The first panel (110A) has first passages (118A) extending therethrough. Likewise, the second panel (110B) includes a second sheet or substrate (112B) and second insulating coatings (114B) and (116B) respectively positioned on opposite exterior surfaces (unnumbered) of the second sheet or substrate (112B). The second panel (110B) has second passages (118B) extending therethrough. The third panel (110C) includes a third sheet or substrate (112C) and third insulating coatings (114C) and (116C) respectively positioned on opposite exterior surfaces (unnumbered) of the third sheet or substrate (112C). The third panel (110C) has third passages (118C) extending therethrough.

In an exemplary embodiment, the first, second, and third sheets or substrates (112A), (112B), and (112C), respectively, are made of, for example, a non-thermally conductive material, such as a polymer or ceramic. In an exemplary embodiment, thickness of each sheet or substrate (e.g., (112A)) is substantially equal to or less than a combined thicknesses of an emitter electrode (e.g., ($122A_1$)), a collector electrode (e.g., ($124A_1$)), and a spacer (e.g., ($126A_1$)) of an associated thermal energy harvesting thermionic device (e.g., ($120A_1$)), discussed in greater detail below. In another exemplary embodiment, the combined thickness of each sheet or substrate (e.g., (112A)) and associated insulating coatings (e.g., (112A) and (116A)) is substantially equal to or less than a combined thicknesses of the emitter electrode (e.g., ($122A_1$)), the collector electrode (e.g., ($124A_1$)), and the spacer (e.g., ($126A_1$)) of the associated thermal energy harvesting thermionic devices (e.g., ($120A_1$)). The thermally insulating coatings (114A), (116A), (114B), (116B), (114C), and (116C) may be made of the same material or different materials from one another. In an exemplary embodiment, the thermally insulating coatings (114A), (116A), (114B), (116B), (114C), and/or (116C) are made of an aerogel, such as a hydrophobic silica aerogel. In an exemplary embodiment, the thermally insulating coatings (114A), (116A), (114B), (116B), (114C), and (116C) are about 50 nm in thickness.

As shown in FIGS. 1A and 1B, the first panel (110A) includes first thermal energy harvesting thermionic devices ($120A_1$) and ($120A_2$) positioned in the first passages (118A), the second panel (110B) includes second thermal energy harvesting thermionic devices ($120B_1$), ($120B_2$), and ($120B_3$) positioned in the second passages (118B), and the third panel (110C) includes third thermal energy harvesting thermionic devices ($120C_1$) and ($120C_2$) positioned in the third passages (118C).

In an exemplary embodiment, the first insulating coatings (114A) and (116A) extend to outer edges of but do not coat or cover the first thermionic devices ($120A_1$) and ($120A_2$). In an exemplary embodiment, the second insulating coatings (114B) and (116B) extend to outer edges of but do not coat or cover the second thermionic devices ($120B_1$), ($120B_2$), and ($120B_3$), and the third insulating coatings (114C) and (116C) extend to outer edges of but do not coat or cover the third thermionic devices ($120C_1$) and ($120C_2$).

As best shown in FIG. 1B, the second thermionic devices, e.g., ($120B_1$), ($120B_2$), and ($120B_3$), may be spaced from one another and/or arranged in a matrix. Although not shown, the first thermionic devices, e.g., ($120A_1$) and ($120A_2$) and/or the third thermionic devices, e.g., ($120C_1$) and ($120C_2$), likewise may be spaced from one another and/or arranged in a matrix similar to that of FIG. 1B. In an exemplary embodiment, the thermionic devices make up about 90% of the surface area of a panel, e.g., the first thermionic devices ($120A_1$) and ($120A_2$) constitute about 90% of the surface area of the panel (110A).

The first thermal energy harvesting thermionic device ($120A_1$) includes a first emitter electrode ($122A_1$), a first collector electrode ($124A_1$), and a first spacer or intermediate layer ($126A_1$) positioned between and in contact with inner surfaces of the first emitter electrode ($122A_1$) and the first collector electrode ($124A_1$). The first thermionic device ($120A_1$) further includes a first emitter-side adhesive layer ($130A_1$) positioned on the first emitter electrode ($122A_1$), and one or more first emitter-side thermal conductors (or thermally conducting members) ($132A_1$) secured by the first emitter-side adhesive layer ($130A_1$) and in thermal communication with the first emitter electrode ($122A_1$). The first thermionic device ($120A_1$) further includes a first collector-side adhesive layer ($134A_1$) positioned on the first collector electrode ($124A_1$), and one or more first collector-side thermal conductors (or thermally conducting members) ($136A_1$) secured by the first collector-side adhesive layer ($134A_1$) and in thermal communication with the first collector electrode ($124A_1$).

The first thermal energy harvesting thermionic device ($120A_2$) has substantially the same structure as the first thermionic device ($120A_1$), and therefore is not described further herein in the interest of brevity.

The second thermal energy harvesting thermionic device ($120B_1$) includes a second emitter electrode ($122B_1$), a second collector electrode ($124B_1$), and a second spacer or intermediate layer ($126B_1$) positioned between and in contact with inner surfaces of the second emitter electrode ($122B_1$) and the second collector electrode ($124B_1$). The second thermionic device ($120B_1$) further includes a second emitter-side adhesive layer ($130B_1$) positioned on the second emitter electrode ($122B_1$), and one or more second emitter-side thermal conductors (or thermally conducting members) ($132B_1$) secured by the second emitter-side adhesive layer ($130B_1$) and in thermal communication with the second emitter electrode ($122B_1$). The second thermionic device ($120B_1$) further includes a second collector-side adhesive layer ($134B_1$) positioned on the second collector electrode ($124B_1$), and one or more second collector-side thermal conductors (or thermally conducting members) ($136B_1$) secured by the second collector-side adhesive layer ($134B_1$) and in thermal communication with the second collector electrode ($124B_1$).

The second thermal energy harvesting thermionic devices ($120B_2$) and ($120B_3$) have substantially the same structure as the second thermionic device ($120B_1$), and therefore are not described further herein in the interest of brevity.

The third thermal energy harvesting thermionic device ($120C_1$) includes a third emitter electrode ($122C_1$), a third collector electrode ($124C_1$), and a third spacer or intermediate layer ($126C_1$) positioned between and in contact with inner surfaces of the third emitter electrode ($122C_1$) and the third collector electrode ($124C_1$). The third thermionic device ($120C_1$) further includes a third emitter-side adhesive layer ($130C_1$) positioned on the third emitter electrode ($122C_1$), and one or more third emitter-side thermal conductors (or thermally conducting members) ($132C_1$) secured by the third emitter-side adhesive layer ($130C_1$) and in thermal communication with the third emitter electrode ($122C_1$). The third thermionic device ($120C_1$) further includes a third collector-side adhesive layer ($134C_1$) positioned on the third collector electrode ($124C_1$), and one or more third collector-side thermal conductors (or thermally conducting members) ($136C_1$) secured by the third collector-side adhesive layer ($134C_1$) and in thermal communication with the third collector electrode ($124C_1$).

The third thermal energy harvesting thermionic device ($120C_2$) has substantially the same structure as the third thermionic device ($120C_1$), and therefore is not described further herein in the interest of brevity.

In exemplary embodiments, the adhesive layers, e.g., ($130A_1$), ($134A_1$), ($130B_1$), ($134B_1$), ($130C_1$), and ($134C_1$), comprise epoxy. In exemplary embodiments, the adhesive layers, e.g., ($130A_1$), ($134A_1$), ($130B_1$), ($134B_1$), ($130C_1$), and ($134C_1$), contain thermally conductive filler. Exemplary thermally conductive fillers include nanoparticles. In exemplary embodiments, the thermally conductive filler has low electrical conductivity. Representative thermally conductive fillers include, for example, $SiO_2$, $Al_2O_3$, $WO_3$, and NiO.

In an exemplary embodiment best shown in FIG. 1A, the first thermionic devices ($120A_1$) and ($120A_2$) of the first panel (110A) are offset or staggered with respect to the second thermionic devices ($120B_1$), ($120B_2$), and ($120B_3$) of the second panel (110B). Likewise, in an exemplary embodiment the second thermionic devices ($120B_1$), ($120B_2$), and ($120B_3$) of the second panel (110B) are offset or staggered relative to the third thermionic devices ($120C_1$) and ($120C_2$) of the third panel (110C). In an exemplary embodiment, the staggering or offsetting of the thermionic devices of adjacent panels, e.g., (110A), (110B), and (110C), lowers heat transfer resistance and promotes uniformity of thermal flow distribution.

Figure 1C:
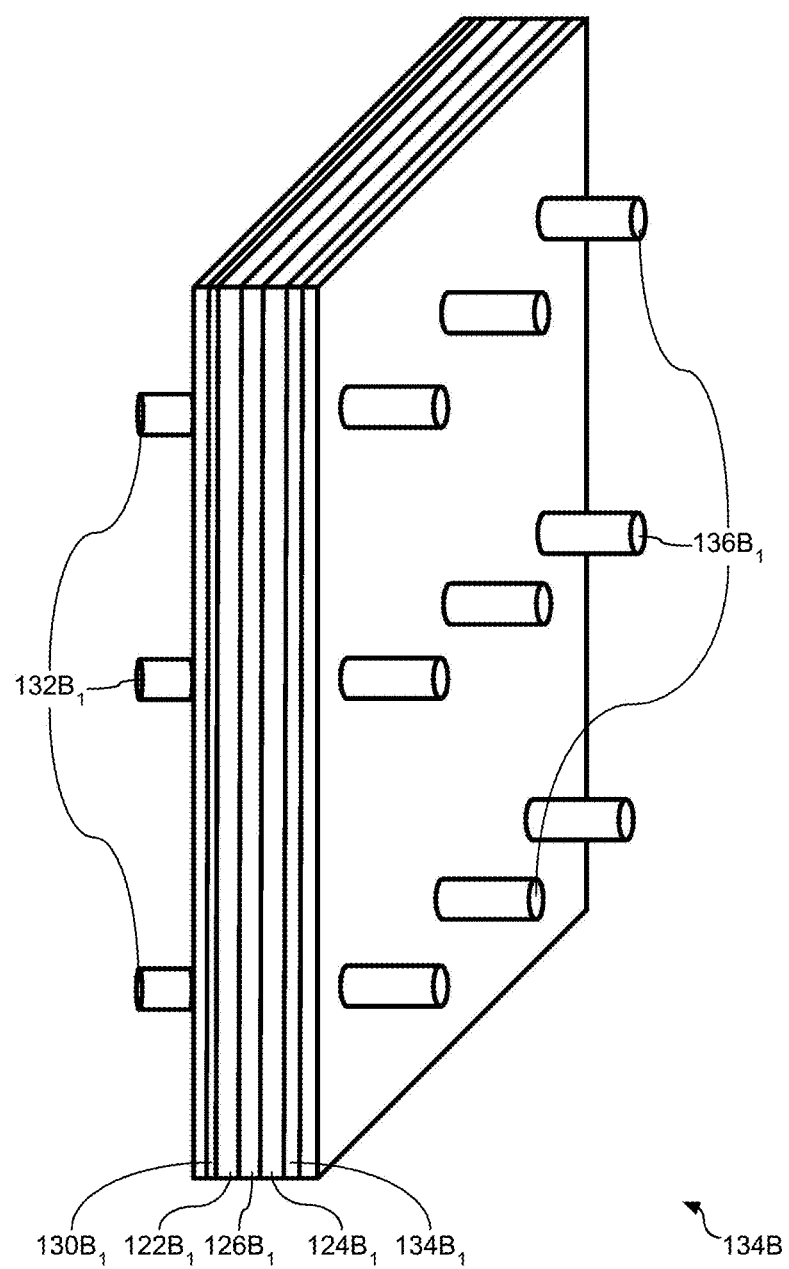
FIG. 1C illustrates a perspective side view depicting a thermal energy harvesting thermionic device of the apparatus of FIG. 1A.

The number and arrangement of thermal conductors, e.g., ($132A_1$), ($136A_1$), ($132B_1$), ($136B_1$), ($132C_1$), and ($136C_1$), in FIGS. 1A and 1B are different than the number and arrangement of thermal conductors in FIG. 1C for the sake of simplifying the drawings. FIGS. 1A and 1B illustrate an embodiment in which the thermal conductors (e.g., ($136B_1$)) are shown in a linear arrangement. FIG. 1C illustrates another embodiment in which the thermally conductive members (e.g., ($136B_1$)) are shown arranged in an array or matrix. The thermal conductors, e.g., ($132A_1$), ($136A_1$), ($132B_1$), ($136B_1$), ($132C_1$), and ($136C_1$), may be arranged in an array or matrix, such as that shown in FIG. 1C. Alternatively, thermal conductors, e.g., ($132A_1$), ($136A_1$), ($132B_1$), ($136B_1$), ($132C_1$), and ($136C_1$), of any of the panels (110A), (110B), and/or (110C) may be arranged randomly.

In exemplary embodiments, the thermal conductors, e.g., ($132A_1$), ($136A_1$), ($132B_1$), ($136B_1$), ($132C_1$), and ($136C_1$), comprise micropillars. Although the thermal conductors, e.g., ($132A_1$), ($136A_1$), ($132B_1$), ($136B_1$), ($132C_1$), and ($136C_1$), are depicted as micropillars having a cylindrical shape, such as that of a rod or pillar, other shapes and arrangements may be implemented. While micropillars configured as columns having round cross-sections are illustrated in the accompanying drawings, it should be understood that other cross sections are suitable, including triangular, rectangular, teardrop, etc. Examples of micropillar structures, spacing, arrangements, and methods of making and using the same are disclosed in U.S. Pat. No. 6,110,247 to Birmingham et al. In an embodiment, computational fluid dynamic (CFD) analysis is optionally employed to determine the positioning of the thermal conductors, e.g., ($132A_1$), ($136A_1$), ($132B_1$), ($136B_1$), ($132C_1$), and ($136C_1$) to improve heat exchange. In an exemplary embodiment, the micropillars have an aspect ratio of about one, for example, diameters of about 100 microns and heights of about 100 microns.

The thermally conductive members, e.g., ($132A_1$), ($136A_1$), ($132B_1$), ($136B_1$), ($132C_1$), and ($136C_1$) may be made of the same material or different materials from one another. In an exemplary embodiment, the thermally conductive members, e.g., ($132A_1$), ($136A_1$), ($132B_1$), ($136B_1$), ($132C_1$), and ($136C_1$) are made of a thermally conductive material, such as a thermally conductive metal, metal alloy, carbon allotrope, etc.

Exemplary embodiments of the spacers, e.g., ($126A_1$), ($126B_1$), ($126C_1$), etc., are discussed below with reference to FIGS. 4, 5A, and 5B. In exemplary embodiments, the spacers, e.g., ($126A_1$), ($126B_1$), ($126C_1$), etc., include passages, such as apertures (408) discussed below in connection with FIG. 4, containing a fluid. In additional embodiments, the spacers, e.g., ($126A_1$), ($126B_1$), ($126C_1$), etc., may be embodied as a permeable or semi-permeable material containing the fluid, as discussed further below, including in connection with FIG. 5B. In an exemplary embodiment, the fluid is a nano-fluid (e.g., (412) in FIGS. 4 and (602) in FIG. 6) comprising a plurality of nanoparticles suspended in a fluid medium. The nanoparticles are situated to transfer electrons between the emitter electrodes, e.g., ($122A_1$), ($122B_1$), and ($122C_1$) and the collector electrodes, e.g., ($124A_1$), ($124B_1$), and ($124C_1$), respectively. Exemplary embodiments of nano-fluids are discussed in greater detail below, including with reference to FIG. 6.

According to an exemplary embodiment, at least one dimension of the emitter electrodes, e.g., ($122A_1$), ($122B_1$), and ($122C_1$), the spacers ($126A_1$), ($126B_1$), and ($126C_1$), and/or the collector electors, e.g., ($124A_1$), ($124B_1$), and ($124C_1$), is nano-scale, such as the thickness. In an exemplary embodiment, nano-scale encompasses a range of less than 100 nm, or in certain embodiments less than 10 nm, such as a range of 1 to 10 nm.

In exemplary embodiments, each of the thermionic devices, e.g., ($120A_1$) ($120A_2$), ($120B_1$), ($120B_2$), ($120B_3$), ($120C_1$), and ($120C_2$) operates on a thermionic power conversion principle to convert the thermal energy into electrical energy (e.g., DC electricity) by an emission of electrons from the emitter electrodes, e.g., ($122A_1$), ($122B_1$), and ($122C_1$). The production of electrons from the emitter electrodes, e.g., ($122A_1$), ($122B_1$), and ($122C_1$), is controlled by barriers to the flow of electricity. The first barrier to be overcome involves establishing electron energy that is sufficiently large to exceed the work function of the emitter electrodes, e.g., ($122A_1$), ($122B_1$), and ($122C_1$), to enable electron emission from the inner surfaces of the emitter electrodes, e.g., ($122A_1$), ($122B_1$), and ($122C_1$), interfacing the spacers, e.g., ($126A_1$), ($126B_1$), and ($126C_1$), respectively. At lower temperatures, only a fraction of the electrons have sufficient energy to allow thermionic emission to proceed, thus limiting current flow. Intermediate and elevated temperatures provide higher energy than lower temperatures, with the intermediate temperatures giving rise to an increase in electron production at the inner surfaces of the emitter electrodes, e.g., ($122A_1$), ($122B_1$), and ($122C_1$), interfacing the spacers, e.g., ($126A_1$), ($126B_1$), and ($126C_1$), respectively, due to an increased or larger distribution of electrons with the required energy for emission. As kinetic energy of the electrons is dependent upon the temperature of the emitter electrodes, e.g., ($122A_1$), ($122B_1$), and ($122C_1$), increasing the temperature of the emitter electrodes, e.g., ($122A_1$), ($122B_1$), and ($122C_1$), such as by situating a warm body or air flow in the first region (102), results in an increase in electron emission, and hence electrical current generation.

Figure 2:
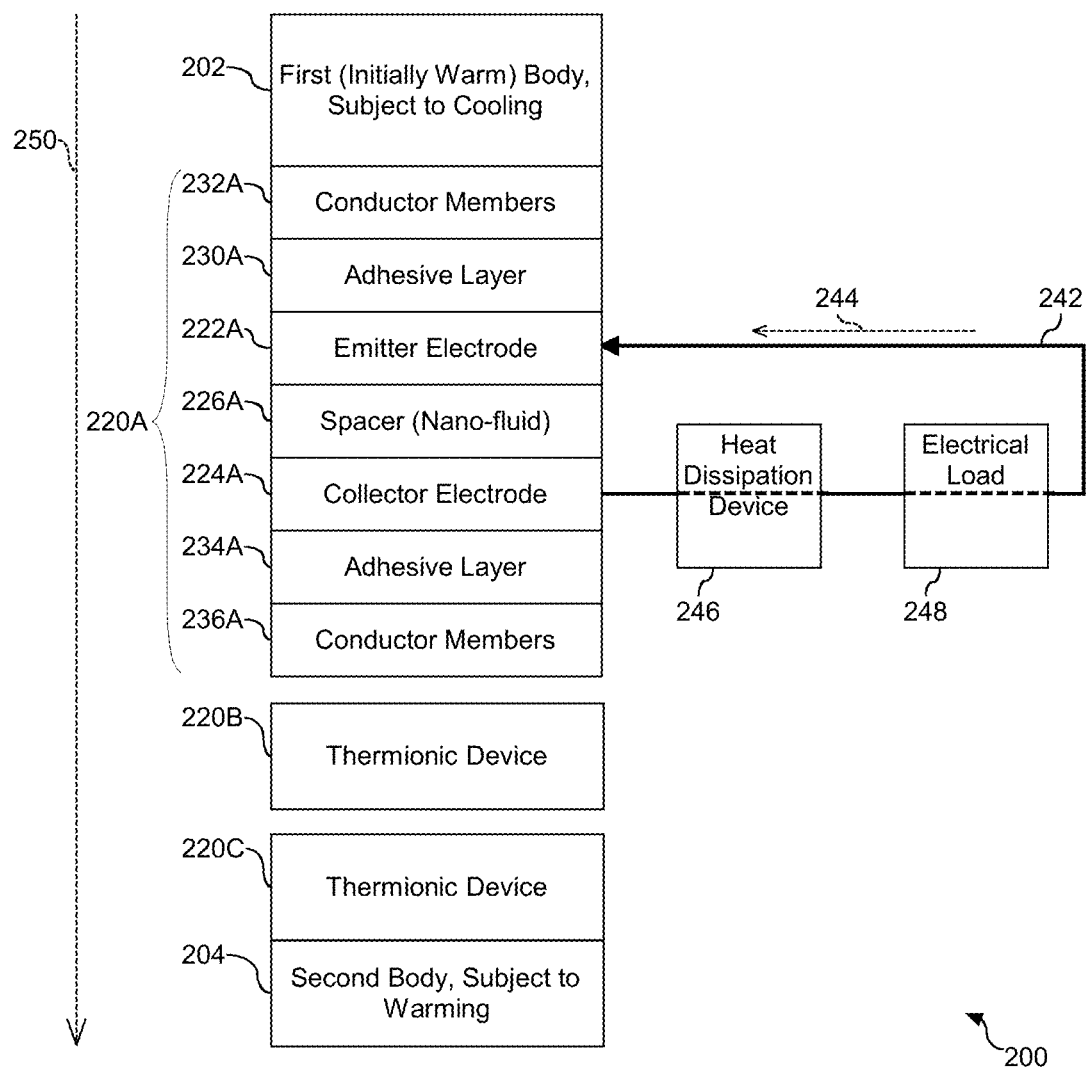
FIG. 2 illustrates a block diagram depicting a system including a thermal-transfer apparatuses according to an exemplary embodiment.

Electrons flow from the emitter electrodes, e.g., ($122A_1$), ($122B_1$), and ($122C_1$), across the nano-fluid in the spacers, e.g., ($126A_1$), ($126B_1$), and ($126C_1$), respectively, to the collector electrodes, e.g., ($124A_1$), ($124B_1$), and ($124C_1$), respectively. As shown, the collector electrodes, e.g., ($124A_1$), ($124B_1$), and ($124C_1$), are spaced from the emitter electrodes, e.g., ($122A_1$), ($122B_1$), and ($122C_1$), respectively, by inter-electrode distances containing the spacers, e.g., ($126A_1$), ($126B_1$), and ($126C_1$), respectively. As mentioned above and explained in greater detail below, a medium is contained in the spacers, e.g., ($126A_1$), ($126B_1$), and ($126C_1$). In exemplary embodiments, the medium is in contact with the first inner surfaces of the emitter electrodes, e.g., ($122A_1$), ($122B_1$), and ($122C_1$), and the second inner surfaces of the collector electrodes, e.g., ($124A_1$), ($124B_1$), and ($124C_1$). According to an exemplary embodiment, the medium contains suspended nanoparticles to transfer electrons between the emitter electrodes, e.g., ($122A_1$), ($122B_1$), and ($122C_1$), and the collector electrodes, e.g., ($124A_1$), ($124B_1$), and ($124C_1$), respectively. Thermal processes which involve the transport of the electrons across the nano-fluid in the electrode gaps (without, or in an embodiment with minimal, resistively heating the nano-fluid) involve movement of nanoparticles within the medium in the spacers, e.g., ($126A_1$), ($126B_1$), and ($126C_1$), to come close together or collide with each other and with the inner surfaces of the emitter electrodes, e.g., ($122A_1$), ($122B_1$), and ($122C_1$), and the inner surfaces of the collector electrodes, e.g., ($124A_1$), ($124B_1$), and ($124C_1$), respectively. These collisions enable the hopping or transition of electrons in the direction of the electric field (i.e., current production). A reverse production of electrons from the collector electrodes, e.g., ($124A_1$), ($124B_1$), and ($124C_1$), to the emitter electrodes, e.g., ($122A_1$), ($122B_1$), and ($122C_1$), respectively, is suppressed by the electric field. In an embodiment, the electric field is supplied by the use of dissimilar electrode materials, e.g., metals, graphene, etc. The transmission of the electrons across the nano-fluid in the spacers, e.g., ($126A_1$), ($126B_1$), and ($126C_1$), from the emitter electrodes, e.g., ($122A_1$), ($122B_1$), and ($122C_1$), to the collector electrodes, e.g., ($124A_1$), ($124B_1$), and ($124C_1$), respectively, creates a flow of electrical energy, and when connected to a circuit (200) such as shown in FIG. 2, enables electrons to pass through an electrically conductive path and an electrical load completing the circuit (200).

The electron transfer described above also has thermal-transfer effects. The electrons emitted from the emitter electrodes, e.g., ($122A_1$), ($122B_1$), and ($122C_1$), of the thermionic devices, e.g., ($120A_1$), ($120A_2$) ($120B_1$), ($120B_2$), ($120B_3$), ($120C_1$), and ($120C_2$), are high energy or "hot." Their leaving the emitters electrodes, e.g., ($122A_1$), ($122B_1$), and ($122C_1$), effectively cools the emitter electrodes, e.g., ($122A_1$), ($122B_1$), and ($122C_1$). The emission and removal of higher energy electrons from the emitter electrodes, e.g., ($122A_1$), ($122B_1$), and ($122C_1$), carries away more heat energy from the emitter electrodes, e.g., ($122A_1$), ($122B_1$), and ($122C_1$), than is realized with lower energy electrons, resulting in cooling of the emitter electrodes, e.g., ($122A_1$), ($122B_1$), and ($122C_1$). The "hot" electrons emitted by the emitter electrodes, e.g., ($122A_1$), ($122B_1$), and ($122C_1$), pass through the nano-fluid in the spacers, e.g., ($126A_1$), ($126B_1$), and ($126C_1$), respectively, and heat the collector electrodes, e.g., ($124A_1$), ($124B_1$), and ($124C_1$). This movement of electrons sets up a thermal gradient for a nanoscale heat engine. The transfer of heat away from the emitter electrodes, e.g., ($122A_1$), ($122B_1$), and ($122C_1$), and to the collector electrodes, e.g., ($124A_1$), ($124B_1$), and ($124C_1$), respectively has the beneficial effect of transferring away heat contained in the first region (102), including for example one or more objects contained in the first region (102), thereby cooling the first region (102) and object(s) contained therein.

The thermal conductors, e.g., ($132A_1$), ($132B_1$), and ($132C_1$) facilitate the transfer of heat from the first region (102), the first compartment (106A), and the second compartment (106B), respectively, to the emitter electrodes, e.g., ($122A_1$), ($122B_1$), and ($122C_1$), respectively. Similarly, the thermal conductors ($136A_1$), ($136B_1$), and ($136C_1$) facilitate the transfer of heat from the collector electrodes, e.g., ($124A_1$), ($124B_1$), and ($124C_1$), respectively, to the first compartment (106A), the second compartment (106B), and the second region (104), respectively.

In an exemplary embodiment, the transfer of "hot" electrons from the emitter electrodes, e.g., ($122A_1$), ($122B_1$), and ($122C_1$), to the collector electrodes, e.g., ($124A_1$), ($124B_1$), and ($124C_1$), respectively, is a substantially unidirectional flow expected to carry an about one-degree Celsius (1° C.) temperature difference, e.g., 1.6° C. This temperature increase is transferred by the thermal conductors, e.g., ($136A_1$), ($136B_1$), and ($136C_1$) to the first compartment (106A), the second compartment (106B), and the second region (104), respectively. As shown in FIG. 1A, in an embodiment, the heat transfer generates temperature differences from the first region (102) (T=X° C.) to the first compartment (106A) (T=X+1° C.), to the second compartment (106B) (T=X+2° C.), and to the second region (104) (T=X+3° C.). The thermally conductive members, e.g., ($132A_1$), ($136A_1$), ($132B_1$), ($136B_1$), ($132C_1$), and ($136C_1$), promote the heat transfer, for example, between the collector electrodes, e.g., ($124A_1$) of the first panel (110A) and the emitter electrodes, e.g., ($122B_1$) of the second panel (110B), and between the collector electrodes, e.g., ($120B_1$) of the second panel (110B) and the emitter electrode, e.g., (122C) of the third panel (110C).

Thus, in an exemplary embodiment, for a quantity "N" panels (110A), (110B), (110C), . . . , in the apparatus (100), the difference between the temperatures in the first and second regions (102) and (104), respectively, is the initial temperature X° C. in the first region (102) plus N-increments of approximately 1° C., e.g., about 1.6° C. For example, an apparatus including twenty-five panels would generate an approximately twenty-five degree (25° C.) difference between the first region (102) and the second region (104). In exemplary embodiments, the thermal transfer and resulting temperature differences are generated without requiring the use of an outside electric power source.

The uni-directional transfer of heat (in the direction represented by arrow (150) in FIG. 1A) and resulting temperature difference can be exploited to cool bodies (e.g., objects, devices, apparatuses, systems, etc.) and/or fluid (e.g., air) located in the first region (102). In an exemplary embodiment, the apparatus (100) can cool a body in the first region (102). In an exemplary embodiment, the apparatus (100) lowers a temperature of a body in the first region (102) to the temperature of or below the atmosphere (e.g., ambient temperature) of the first region (102).

In exemplary embodiments, the thermionic, substantially uni-directional flow of heat is opposite to the diffusive heat transfer from the body in the second region (104) to the body in the first region (102). Additionally, the diffusive heat transfer between the panels (110A), (110B), (110C), etc., that is, the backflow of heat from the third panel (110C) to the second panel (110B) and/or from the second panel (110B) to the first panel (110A), in a direction opposite to the substantially uni-directional thermionic heat transfer can be reduced, minimized, or eliminated. One or more of the following techniques and features may be involved or employed to facilitate uni-directional heat transfer and reduce or eliminate backflow of diffusive heat.

First, in exemplary embodiments, diffusive heat transfer is impeded by the small thicknesses (e.g., nanometers) of the spacers, e.g., $(126A_1)$, $(126B_1)$, and $(126C_1)$.

Second, in exemplary embodiments, the nano-fluid contained in the spacers, e.g., $(126A_1)$, $(126B_1)$, and $(126C_1)$, favor the transfer of high energy electrons in a uni-directional flow from the emitter electrodes, e.g., $(122A_1)$, $(122B_1)$, and $(122C_1)$, to the collector electrodes, e.g., $(124A_1)$, $(124B_1)$, and $(124C_1)$. The flow of electrons substantially eliminates space charge problems due to an electric field created from the connection of dissimilar electrode materials, thereby substantially eliminating the backflow of electrons.

Third, in exemplary embodiments, the thermally insulating coatings (e.g., aerogels) (114A), (116A), (114B), (116B), (114C), and (116C) act as thermal blockers. The thermally insulating coatings reduce, and in an exemplary embodiment minimize or eliminate by blocking, diffusive (reverse) heat transfer from the second panel (110B) to the first panel (110A), and from the third panel (110C) to the second panel (110B). At the same time, the thermionic devices, e.g., $(120A_1)$, $(120A_2)$, $(120B_1)$, $(120B_2)$, $(120B_3)$, $(120C_1)$, and $(120C_2)$, positioned in the passages (118A), (118B), and (118C) create sufficient heat portals to allow for the uni-directional thermionic transfer of heat caused by electron transfer.

In exemplary embodiments, aerogels are employed as the thermally insulating coatings (114A), (116A), (114B), (116B), (114C), and (116C). Without the thermally insulating coatings, due to air between adjacent panels (e.g., (110A) and (110B)), the backflow of diffusive heat would adversely affect the thermionic heat transfer, requiring the addition of 0.07 Watt (calculated/theoretical) of heat to the compartments (106A) and (106B) to raise the temperature about one degree Celsius between adjacent panels. However, the provision of thermal insulating coatings (114A), (116A), (114B), (116B), (114C), and (116C), particularly those made of aerogel materials disclosed herein with poor thermal conductivity, only permit 0.000727 Watt (calculated/theoretical) of diffusive heat from a hotter panel (e.g., (110B)) to a cooler panel (e.g., (110A)).

According to an exemplary embodiment, the theoretical thermal backflow of heat, expressed as a ratio of the backflow of heat (e.g., from panel (110B) to panel (110A)) divided by the forward heat flow (e.g., from panel (110A) to panel (110B)), is calculated to be 0.1030. This efficiency is believed to be principally due to the uni-directional flow created by the nanofluid and the poor thermal conductivity of the thermally insulating coatings (114A), (116A), (114B), (116B), (114C), and (116C), e.g., aerogel coatings. This hypothetical efficiency is better than conventional refrigerators.

Aerogels

The thermal insulating coatings described herein, including in connection with, for example, thermal insulating coatings (114A), (116A), (114B), (116B), (114C), and (116C), may be made of, for example, aerogels. In an exemplary embodiment, the aerogel is a hydrophobic silica aerogel. The hydrophobic nature of the aerogel reduces water deposition (e.g., due to condensation) in the first, second, and third panels (110A), (110B), (110C), respectively, to improve thermal blockage of conduction. In one or more exemplary embodiments, the porosity of the aerogel coatings is in a range of, for example, about 75 percent to about 99 percent by volume.

An embodiment of a method of making an aerogel is provided herein below. It should be understood that the embodiment is provided by way of example and explanation, and is not necessarily limiting of the scope of other embodiments described herein.

1. Using a graduated cylinder, measure 12.0 mL of absolute ethanol into a Beaker flask (e.g., 250 mL flask), using gloves to handle. In a fume hood, measure and add 15.0 mL of tetra-ethyl-ortho-silicate (TEOS or $Si(OCH_2CH_3)_4$) diluted in alcohol (e.g., anhydrous ethanol, isopropanol, etc.) in a 10-20% range. Add the 15.0 mL of TEOS to the ethanol in the fume hood. Stir, e.g., with a stir bar.

2. Measure 19 mL deionized water using a graduated cylinder and add deionized water into a small beaker. Mix in 2-3 drops of concentrate 1M HCl with a disposable pipet. While stirring, pour the aqueous acidic acid solution into the ethanol/alkoxide solution. Adjust pH to 3 by adding the HCl acid dropwise, if necessary.

3. Add an acid catalyst (HCl, 1M) dropwise to TEOS/alcohol solution while stirring. Allow to sit, e.g., 24 to 48 hours, to induce polymerization. Then, dilute with alcohol and store at a relatively low temperature, e.g., under refrigeration, to slow further polymerization. Further dilute as necessary or desirable for subsequent deposition.

4. Continue to stir the reaction mixture vigorously for 1 to 2 hours to thoroughly mix. Heat the stirred mixture to 65° C. for four hours until a sol-gel is formed.

5. Cure, for example, in an incubator, at, for example, 35-40° C. to dry the sol-gel. The dried sol-gel (or aerogel) can be deposited by dissolving the sol-gel (or aerogel) in an alcohol and using electrospraying or another technique for deposition. Alternatively, the dried sol-gel (or aerogel) can be placed in a vortex mixer or the like and spun to break up the sol-gel (or aerogel), into a state more suitable for deposition, e.g., onto the substrates (112A), (112B), and (112C). In an embodiment, the sol-gel may be spin-coat deposited.

Cure temperature affects pore size. Generally, pore size increases with increased cure temperature, and decreases with decreased cure temperature. Gel time can be reduced by reducing the amount of alcohol and/or adding additional catalyst (e.g., an acid such as HCl), although excess catalyst can result in shorter polymeric chains. Longer polymer chains are less prone to cracking.

In an exemplary embodiment, sol-gel is electrosprayed to create a thin film aerogel condensation event. Electrospraying may be conducted in a heated (or elevated temperature) environment to cure the sol-gel and form the aerogel. In an exemplary embodiment, for the formation of aerogels, a substrate surface is prepared to receive the (electrosprayed) sol-gel. In an embodiment, the substrate surface is stainless steel subject to alternating acid and base washes, followed by a nitric acid wash, followed by a hydroxide wash.

Thermal Transfer Computations

The following theoretical computations are given by way of explanation of principles, and are not necessarily limiting as the exemplary embodiments described herein.

In exemplary embodiments, the apparatus (100) is conveniently cooled by natural convection. Natural convection cooling is very desirable, since natural convention does not involve any fans that may break down or consume harvested energy. Natural convection is based on fluid motion caused by the density differences in a fluid due to a temperature difference. A fluid expands when heated and becomes less dense. For example, the refrigerator temperature difference is driven by a stack of panels, e.g., (110A), (110B), (110C), . . . , operating at an approximately 20° C. temperature difference for 20 panels. Using the thermal resistance approach, the total dissipated power, P, measured in the units of watts, W, is found in equation 1:

$$P = VI = I^2 R \qquad \text{(Equation 1)}$$

In steady state operation, this is equivalent to the heat dissipated by an electronic component consuming the power (see equation 1). The total rate of heat transfer, Q, is determined by equation 2:

$$Q = \frac{\Delta T}{R} = \frac{L}{kA} \qquad \text{(Equation 2)}$$

wherein $\Delta T$ is the temperature difference (° C.) and the thermal resistance to heat flow, R, has units of ° C./W, k is the thermal conductivity (W/m·° C.), L is the thickness of the material (m), and A is the heat transfer area.

The total resistance to heat transfer can be calculated as found in equation 3:

$$R_{Cell} = R_{Adhesive} + R_{Refrig} \qquad \text{(Equation 3)}$$

wherein the total heat transfer resistance of the system, $R_{SYS}$, is equal to the sum of the thermal resistances (for all the thermionic cells of an apparatus) of the epoxy adhesive, $R_{Adhesive}$, joining to the resistance of the contact potential difference cell, $R_{Refrig}$.

For example, the thermal resistance of the epoxy adhesive can be found by solving equation 1 for $R_{Adhesive}$ where the thickness of the epoxy is $0.03 \times 10^{-3}$ m is divided by the thermal conductivity (1.8 W/m·° C.) and the heat transfer area ($10^{-4}$ m²). $R_{Adhesive}$ is determined to be 0.167° C./W. Similarly, the thermal resistance for the refrigerator cell, $R_{Refrig}$, is calculated by summing each component part to determine its resistance to heat flow (see equation 4).

$$R_{REFRIG} = R_{Tungsten} + R_{Nanofluid} + R_{Pt} \qquad \text{(Equation 4)}$$

wherein $R_{Tungsten}$ and $R_{Pt}$ are the thermal resistances of tungsten and platinum, respectively, as the electrodes of the thermionic devices.

The value of $R_{Tungsten}$ is calculated by using the electrode thickness ($20 \times 10^{-6}$ m) divided by the thermal conductivity (173 W/m·° C.) and the heat transfer area ($10^{-2}$ m²). The $R_{Tungsten}$ is found to be 1.15 $10^{-5}$° C./W. The platinum electrode thermal resistance, $R_{Pt}$, is found by using the electrode thickness ($20 \times 10^{-6}$ m) divided by the thermal conductivity (71.6 W/m·° C.) and the heat transfer area ($10^{-2}$ m²). The $R_{Pt}$ is found to be 2.79 $10^{-5}$° C./W. The thermal resistance of the nanofluid, $R_{Nanofluid}$ is calculated by determining the thermal conductivity of the particles and the fluid. The thermal conductivity of the nanofluid is calculated by equation 5 [Incropera, 2011]:

$$k_{NF} = \left[ \frac{k_P + 2k_{BF} + 2\psi(k_P - k_{BF})}{k_P + 2k_{BF} - \psi(k_P - k_{BF})} \right] k_{BF} \qquad \text{(Equation 5)}$$

wherein $k_P$ is the particle thermal conductivity (318 W/m·K), $k_{BF}$ is the thermal conductivity of the bulk fluid (0.613 W/m·K), and w is the particle volume fraction (10%).

After substituting into equation 6, the thermal conductivity of the nanofluid, $k_{NF}$ is found to be 0.816 W/m·K. Thereafter, the $R_{Nanofluid}$ is calculated to be $1.22 \times 10^{-6}$° C./W with a thickness of 10 nanometers ($10^{-9}$ m) and a heat transfer area of $10^{-2}$ m². Therefore, the thermal resistance of the thermionic energy harvester cell, $R_{Refrig}$, is $4.0 \times 10^{-5}$° C./W. Finally, the $R_{SYS}$ is 0.2° C./W. Calculating the temperature at the connection with the second refrigeration cell, $T_1$ where 8 W of electrical power have been dissipated (above the first refrigeration cell exposed to the natural convection of air) is shown in equation 6:

$$T_1 = T_0 + (Q) R_{SYS} = 20 + (8 \text{ W})(0.2 \text{ C/W}) = 21.6 \qquad \text{(Equation 6)}$$

wherein $T_0$ is the ambient air worst-case of 20° C. and $T_1$ is found to be 21.6° C.

Approximately 20 panels of refrigeration cells are used in this design to reach the refrigeration temperature of 0° C. starting from ambient air conditions. In an exemplary embodiment, the temperature difference from panel to panel is expected to be closer to approximately 1.6° C. per panel. This temperature difference, especially when multiplied by the provision of multiple panels, provides for the cooling. The above calculations and approximations are provided on a theoretical basis.

As demonstrated above, in certain exemplary embodiments the refrigeration cell (see FIGS. 1A-1C) can be cooled by natural convection, and a need for a cooling fan or other fluid mover is eliminated, although the use of a fluid mover is not prohibited. Any harvested electrical power does not need to be used to power a cooling fan, although the use of a fan or other fluid mover, electrically or otherwise powered, is not prohibited.

Electrical Circuit Embodiment

FIG. 2 illustrates an embodiment of a circuit (200) including a first thermionic device (also referred to herein as a module) (220A) of a first panel (e.g., (110A) of FIG. 1A), a second thermionic device (220B) of a second panel (e.g., (110B) of FIG. 1A), and a third thermionic device (220C) of a third panel (e.g., (110C) of FIG. 1A). The first thermionic device (220A) includes a first emitter electrode (222A), a first collector electrode (224A), a first spacer (226A), a first emitter-side adhesive layer (230A), one or more first emitter-side thermal conductors (232A), a first collector-side adhesive layer (234A), and one or more first collector-side thermal conductors (236A) having identical or substantially similar features and relationships described above with respect to the first emitter electrode (122A₁), the first collector electrode (124A₁), the first spacer (126A₁), the first emitter-side adhesive layer (130A₁), the one or more first emitter-side thermal conductors (132A₁), the first collector-side adhesive layer (134A₁), and the one or more first collector-side thermal conductors ($136A_1$), respectively. For simplicity and brevity purposes, corresponding structures of the thermionic device ($120A_2$) of FIG. 1A are not shown in FIG. 2. The second and third thermionic devices (220B) and (220C), respectively, correspond to the thermionic devices ($120B_1$) and ($120C_1$), respectively, of FIG. 1A, and are both showed generically, i.e., without delineation of the specific layers thereof.

The first thermionic device (210A) is positioned adjacent to a first body (202), which in an embodiment may be initially warm. The third thermionic apparatus (210C) is positioned adjacent to a second body (204). Although the circuit (200) is shown with three thermionic devices (210A), (210B), and (210C) of three panels spaced and parallel with respect to one another, in other embodiments the circuit (200) includes fewer or more panels in stacked or other arrangements.

In an exemplary embodiment, the circuit (200) is configured to cause thermal energy emitted by the first body (202), which may be initially warm, to be received at the emitter electrode (222A) via the emitter-side thermal conductors (232A) of the first thermionic device (220A) to excite electrons in the emitter electrode (222A). The excited electrons are "hot," as described above, and transferred through the spacer (226A) to the collector electrode (224A) in a substantially uni-directional flow of heat, which continues on to the second thermionic device (220B) of the second panel, to the third thermionic device (220C) of the third panel, and to the second body (204), causing the first body (202) to be cooled and the second body (204) to be warmed or heated. The thermionic heat transfer is represented by arrow (250)/

The circuit (200) includes one or more electrically conductive paths. For the sake of simplicity, FIG. 2 illustrates an electrical conductive path (242) for the thermionic device (220A) configured to conduct a flow of electrons in a direction indicated by arrow (244) leaving the collector electrode (224A) and returning to the emitter electrode (222A). Although not shown, in an exemplary embodiment each of the other thermionic devices, e.g., (220B) and (220C) has an associated conductive path. The thermionic devices of each of the panels (e.g., thermionic devices ($120A_1$) and ($120A_2$) of panel (110A) in FIG. 1A) may be arranged in circuits having components arranged in series or parallel, or a combination of series and parallel to generate electrical output at a desired voltage, current, and power.

The circuit (200) includes a heat-dissipating device (246) and an electrical load (248) connected by the electrically conductive path (242) for carrying an electrical current (typically a direct current) from the thermionic device(s). Arrow (244) represents the direction of electron flow. The electrically conductive path (242) includes one or more electrical conductors. The one or more electrical conductors can be, for example, one or more electricity-conveying members such as wires, traces, cables, electrical ink, electrical lines, etc. The electrically conductive path (242) may be internal to a housing (not shown in FIG. 2) of the thermionic device (220A), external to the housing, or have one or more portions that are internal to the housing and one or more other portions that are external to the housing. Although not shown in the accompanying drawings, the electrical current in the circuit (200) may be smoothed via, for example, a trimming capacitor.

In exemplary embodiments, the heat dissipating device (246) is positioned with respect to the path (242) to reduce the temperature of the electrical conductive path (242). It should be understood that the use of the heat-dissipation device (246) is optional.

According to an exemplary embodiment, a design feature of an exemplary embodiment of the circuit is that the size, e.g., diameter, of the return wire or other electrical conductive path(s)/connector(s) (242) is small enough to transfer heat readily back to the emitter electrode (222A) without creating a large or excessive resistance. The temperature or average energy of electrons is reduced due to thermal exchange of heat leaving the collector electrode (224A) to the heat-dissipation device (246). The electron flow leaving the collector electrode (224A) and passing through the heat-dissipation device (246) is thereby delivered to the electrical load (248) via conductive path (242) with less thermal energy, thereby reducing likelihood that the electrical load (248) will overheat. This reduced thermal energy is re-supplied to the emitter electrode (222A) via the conductive path (242) to maintain the thermionic device (220A) operating at a high efficiency. In an exemplary embodiment, the heat-dissipation device (246) is a microstructure array heat exchanger, and in an exemplary embodiment is the heat-dissipating device shown and described below in FIGS. 3A and 3B. Implementation of the heat-dissipating device (246) functions to reduce an average energy of electrons leaving the collector electrode (224A). Returning electrons that are re-supplied to the emitter electrode (222A) will therefore complete a heat engine cycle with a lower average energy leaving the load (248) than emitted from the collector electrode (224A).

Figure 3A:
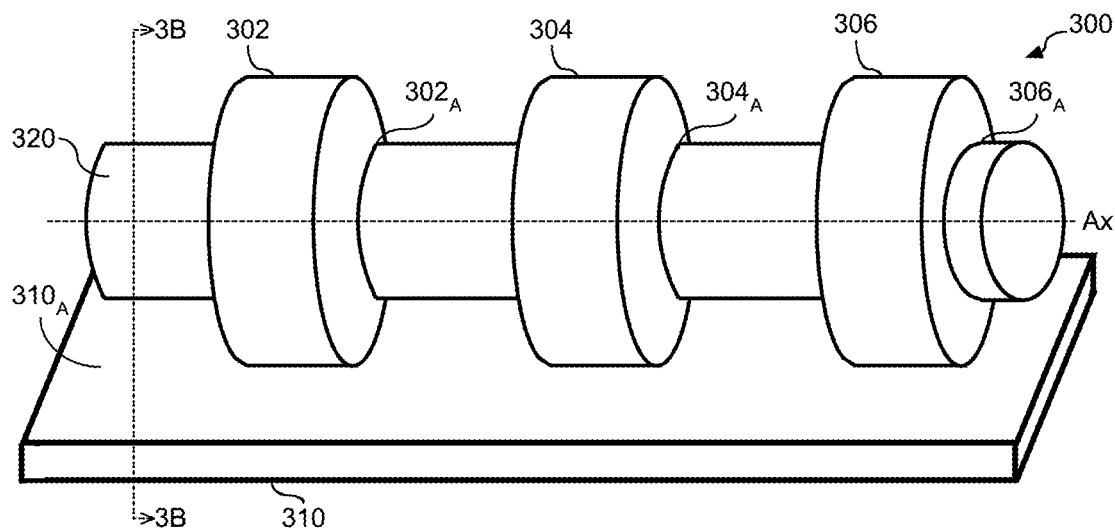
FIG. 3A illustrates a fragmented side perspective view depicting a heat-dissipating device according to an exemplary embodiment.
Figure 3B:
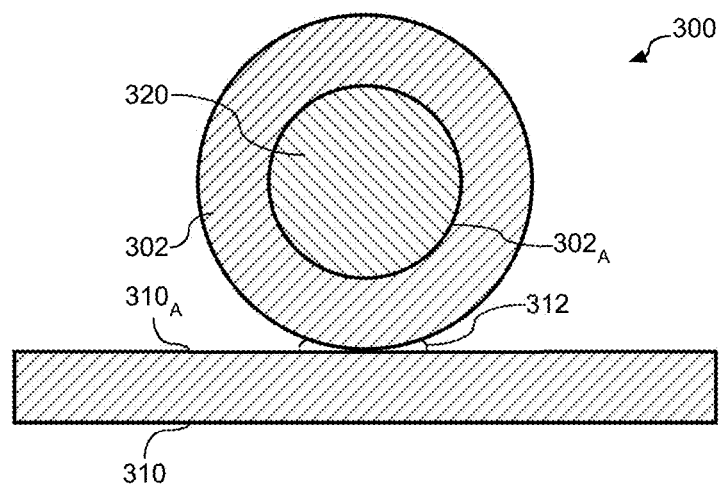
FIG. 3B illustrates a cross-sectional view depicting the heat-dissipating device of FIG. 3A taken along sectional line 3B-3B of FIG. 3A.

The heat-dissipation device (246) may be embodied as, for example, a heat sink or a heat exchanger. In an exemplary embodiment, the heat-dissipation device (246) comprises a micro-structure array heat exchanger. Referring to FIGS. 3A and 3B, an embodiment of a heat-dissipating device is generally designated by reference numeral (300) positioned with respect to the conductive path (242), embodied in FIGS. 3A and 3B as an electrical conductor (320), such as a wire, having a central longitudinal axis A. In FIG. 3A, the electrical conductor (320) is shown continuous in length and fragmented at opposite ends, such that the electrical conductor (320) may be proportionally longer than illustrated.

The heat-dissipation device (300) includes a plurality of rings, annular collars, or arcuate surfaces, hereinafter referred to as collars, and illustrated as first, second, and third collars (302), (304), and (306), respectively. Although three collars (302), (304), and (306) are shown in FIG. 3A, it should be understood that the heat-dissipation device (300) may include fewer or more collars, and the collars (302), (304), and (306) may possess configurations other than annular shapes. The first, second, and third collars (302), (304), and (306) dissipate heat from the conductor (320), and more specifically, fluid (e.g., air) circulating around the surfaces of the collar array acts as a heat transfer medium for cooling the conductor (320) to an operable temperature. The collars (302), (304), and (306) may be a heat-conductive material, such as copper, copper alloy, aluminum, etc. Accordingly, the collar array shown herein prevents the conductor (320) from overheating by absorbing its heat and dissipating the heat into the air and/or through a base (310), discussed below.

In FIGS. 3A and 3B, the collars (302), (304), and (306) are shown mounted on or positioned proximal to a base (310). The base (310) is depicted as a plate with a planar or relatively planar upper surface ($310_A$). It should be understood, however, that the base (310) may possess other shapes. For example, in an embodiment, the collars (302), (304), and (306) may be frictionally fitted between grommets (not shown), with the grommets incorporating the functionality of the base (310), which may be omitted. In an exemplary embodiment, the base (310) acts as a heat sink and is made of a heat-conductive material, such as copper, copper alloy, aluminum, etc. When mounted to the base, the collars (302), (304), and (306) are connected to the base (310) with solder (312), although adhesive, mechanical fasteners, or other connectors and thermal interface materials may be used.

The first, second, and third collars (302), (304), and (306), respectively, include corresponding openings, shown in FIG. 3A as first, second, and third central circular openings ($302_A$), ($304_A$), and ($306_A$), respectively. The collars (302), (304), and (306) are concentrically or relatively concentrically positioned around an exterior surface of the electrical conductor (320), so that each of the collars (302), (304), and (306) is centered on or coaxial with the longitudinal axis $A_x$ of the electrical conductor (320). The first, second, and third collars (302), (304), and (306), respectively, are shown spaced apart from one another along the longitudinal axis A. The spacing is illustrated as uniform, although it should be understood that non-uniform or no spacing may be employed.

As shown in FIG. 3B, the diameter of the opening ($302_A$) of the first collar (302) is approximately equal to, or slightly greater than, the outer diameter of the electrical conductor (320). The diameters of openings of the second and third collars ($304_A$) and ($306_A$), respectively, may be similarly sized with respect to the outer diameter and exterior surface of the electrical conductor (320). Any gap between the outer surface of the electrical conductor (320) and the inner edges of the annular structures (302), (304), and (306) defining the openings ($302_A$), ($304_A$), and ($306_A$), respectively, is mitigated or eliminated following receipt of the conductor (320). In an exemplary embodiment, the collars (302), (304), and (306) are friction fitted on or with respect to the electrical conductor (320) so as to be immovable or to mitigate movement of the collars (302), (304), and (306) along the longitudinal axis A.

In an exemplary mode of operation, heat conveyed by the electrical conductor (320) is removed in part by the collars (302), (304), and (306) and transmitted to the base (310), which together function as a heat sink.

The electrical load (248) may be an electronic component, such as, for example, a capacitor, a resistor, an electronics component, etc. In another embodiment, the electrical load (248) is a component of any of a wide array of consumer and commercial products and goods, including, by way of example and not limitation, mobile telephones, cordless telephones, consumer electronics, portable electronics, computers such as laptop computers and tablet computers, personal digital assistants (PDAs), portable radios, power tools, watches, clocks, timers, calculators, game systems and controllers, cameras, video recorders, portable televisions, global positioning systems (GPS), data transfer devices, lighting goods and systems, home products, toys, headphones, DVD and CD players, MP3 players, voice recorders, sensors, controllers, grooming instruments, alarm systems, weapons such as stun guns, backup power sources, military equipment, emergency equipment, utility equipment, vehicle controls and systems, appliances, telecommunications, etc.

Distributed Cooling System Embodiment

The various embodiments of thermionic energy harvesting apparatuses described herein can be integrated into a distributed cooling system, where heat is removed locally from, for example, hot electronics, air conditioners, and refrigerators. Electronics deliver thermal energy to a system-wide thermal bus (e.g., the thermionic apparatus (710) of FIGS. 7A and 7B, discussed below) that is maintained at some colder temperature. The thermal bus may take many forms (e.g., cylindrical or other shapes) depending on the application, including pumped liquid loops, radiative coolers, and forced-air heatsinks. One such embodiment is illustrated in FIGS. 7A and 7B in the form of electronics in combination with a cooling system, collectively designated by reference numeral (700) in FIG. 7A.

The system (700) includes a tubular apparatus (710) embodied as a thermal bus. The apparatus (710) includes a plurality of panels, each containing one or more thermionic devices. An air flow (712), which in an exemplary embodiment is a cool air flow, is shown passing through a central opening (710D), as shown in FIG. 7B, of the tubular apparatus (710). A fluid mover (not shown) may be used to create the fluid flow.

Figure 7A:
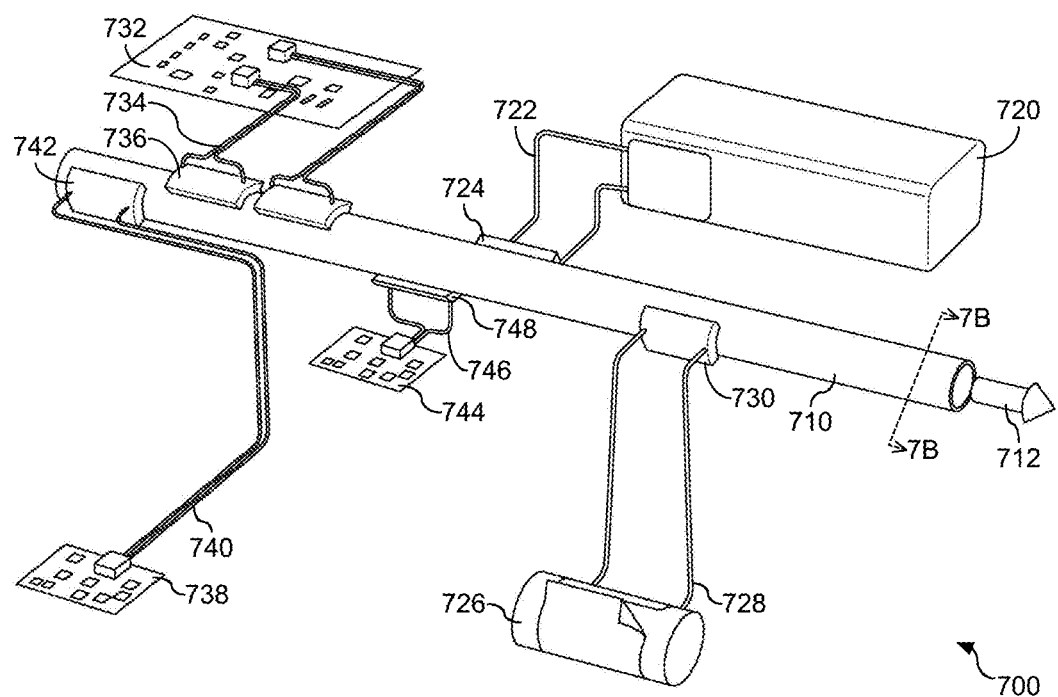
FIGS. 7A and 7B collectively illustrate a system including a thermal-transfer apparatus according to an exemplary embodiment.
Figure 7B:
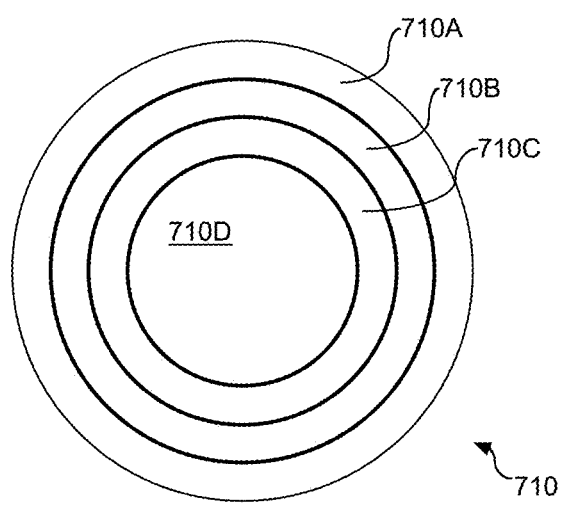

A cross-section of the apparatus (710) is shown in FIG. 7B, which is taken alone sectional line 7B-7B of FIG. 7A. The apparatus (710) includes an outermost panel (710A) corresponding to the panel (110A) of FIG. 1A arranged annularly, a middle panel (710B) corresponding to the panel (110B) of FIG. 1A arranged annularly, and an innermost panel (710C) corresponding to the panel (110C) of FIG. 1A, arranged around the central opening (710D).

Electronic components of the system (700) include an electronics device (e.g., computer, stereo, etc.) (720), a capacitor (726), and first, second, and third circuit boards (732), (738), and (744), respectively. Thermally conductive leads (e.g., wires) (722) and a contact (724) attach the electronics device (720) to an outer surface of the apparatus (710). Thermally conductive leads (e.g., wires) (728) and a contact (730) attach the capacitor (716) to the outer surface of the apparatus (710). The circuit boards (732), (738), and (744) are attached to the outer surface of the apparatus (710) via thermally conductive leads (e.g., wires) (734), (740), and (746), respectively, and contacts (736), (742), and (748), respectively.

The electronics components (720), (726), (732), (738), and (744) generate heat or heat by-product, collectively referred to herein as heat, during operation. The heat is transferred by the conductive leads (722), (728), (734), (740), and (746) to the contacts (724), (730), (736), (742), and (748), respectively, on the outer surface of the apparatus (710). The annular panels (710A), (710B), and (710C) operate in a manner described above with respect to the first, second, and third panels (110A), (110B), and (110C), respectively. Heat generated by operation of the electronics components (720), (726), (732), (738), and (746) is transferred from the contacts on the outer surface of the apparatus (710), radially inward through the tube-shaped, concentric panels (710A), (710B), and (710C), to the fluid flowing through the central aperture (710D) of the apparatus (710) and is transported away. At the same time, the apparatus or bus (710) with its thermionic devices generates electricity, which may be used to drive an electrical load. According to the embodiment illustrated in FIGS. 7A and 7B, the annular panels (710A), (710B), and (710C) are arranged to transfer heat radially inward, so that the outermost panel (710A) is cooler than the innermost panel (710C). According to another embodiment, the annular panels (710A), (710B), and (710C) can be reversed, so that heat is transferred radially outward from the cooling fluid flowing through the central aperture (710D) outwardly.

Thermal Energy Harvesting Thermionic Devices and Apparatuses

Recent improvements in thermionic power converters pertain to material selection based on work functions and corresponding work function values for the electrodes and using a fluid to fill the inter-electrode gap. Electron transfer density is limited by the materials of the electrodes and the materials of the fluid in the inter-electrode gap (i.e., the associated work functions). Representative and exemplary materials, features, conditions, etc. associated with thermal energy harvesting thermionic devices are described in further detail below.

Figure 4:
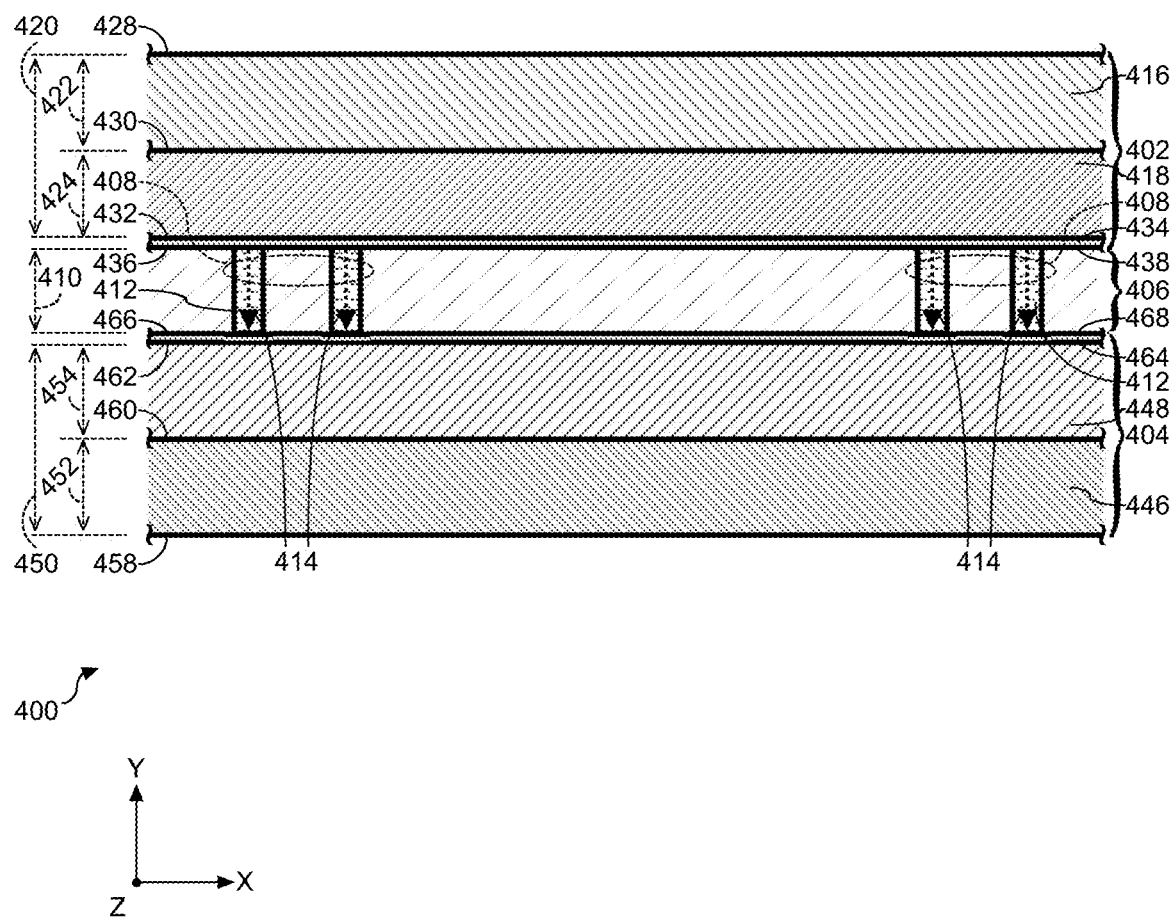
FIG. 4 illustrates a sectional view depicting a thermal energy harvesting thermionic device according to an exemplary embodiment.

Referring to FIG. 4, a diagram is provided to illustrate a sectional view of an embodiment of a thermal energy harvesting thermionic device (or thermionic device) (400) that is configured to convert thermal energy (or heat) into electrical power, i.e., electricity, which is distributed via an electrical conductive path, such as path (242) of FIG. 2, and to cool a body, such as the first body (202) of FIG. 2 or the electronic components of FIG. 7A.

In exemplary embodiments, the device (400) may be nano-scale and/or contain one or more nano-scale components. Each of the dimensions, including a thickness dimension defined parallel to a first-axis, also referred to herein as a vertical axis, i.e., Y-axis in FIG. 4, a longitudinal dimension parallel to a second-axis, i.e., X-axis in FIG. 4, also referred to herein as a horizontal axis, and a lateral dimension parallel to a third axis-axis, i.e. Z-axis in FIG. 4, orthogonal to the X-axis and Y-axis, are shown for reference. The X-axis, Y-axis, and Z-axis are orthogonal to each other in physical space.

The thermal energy harvesting thermionic device (400) is sometimes referred to herein as a cell. In exemplary embodiments, the thermal energy harvesting thermionic device (400) is illustrated as a sheet or a plurality of adjacently positioned sheets or layers, e.g., that may be stacked or wound. A plurality of devices (400) may be organized (e.g., into panels as discussed above) of an apparatus, with the cells arranged in series or parallel, or a combination of both to generate electrical output at the desired voltage, current, and power.

The thermal energy harvesting thermionic device (400) includes an emitter electrode (402) and a collector electrode (404) positioned to define an inter-electrode gap (or interstitial space) therebetween. For simplicity, the adhesive layers (e.g., (130A$_1$), (134A$_1$), (130B$_1$), (134B$_1$), (130C$_1$), and (134C$_1$) of FIG. 1A), and the thermally conductive members (e.g., (132A$_1$), (136A$_1$), (132B$_1$), (136B$_1$), (132C$_1$), and (136C$_1$) of FIG. 1A) have been omitted from FIG. 4 and FIGS. 5A and 5B below.

In an embodiment, a spacer (406) of separation material, sometimes referred to herein as a standoff, maintains separation between the electrodes (402) and (404). While the spacer (406) is referred to herein in the singular, it should be understood that the spacer (406) may comprise a plurality of elements. The spacer (406) may be a dielectric or insulator, or comprise one or more materials that collectively exhibit electrically non-conductive properties. The spacer (406) is illustrated in direct contact with the electrodes (402) and (404). The electrodes (402) and (404) and the spacer (406) define a plurality of closed apertures (408), also referred to herein as cavities, in the inter-electrode gap. In an exemplary embodiment, the apertures (408) extend in the Y direction between the electrodes (402) and (404) for a distance (410) in a range, for example, of about 1 nanometer (nm) to about 100 nm, or in a range, for example, of about 1 nm (or about 2 nm) to about 20 nm. A fluid (412), also referred to as a nano-fluid (discussed further herein with reference to FIG. 6), is received and maintained within one or more, and preferably each, of the apertures (408).

In alternative embodiments, no spacer (406) is used and only the nano-fluid (412) is positioned between the electrodes (402) and (404). Accordingly, the thermal energy harvesting thermionic device (400) includes two opposing electrodes (402) and (404), optionally separated by the spacer (406) with a plurality of apertures (408) extending between the electrodes (402) and (404) and configured to receive the nano-fluid (412).

The emitter electrode (402) and the collector electrode (404) each may be fabricated from different materials from one another, with the different materials having separate and different work function values. The work function of a material or a combination of materials is the minimum thermodynamic work, i.e., minimum energy, needed to remove an electron from a solid to a point in a vacuum immediately outside a solid surface of the material. The work function is a material-dependent characteristic. Work function values are typically expressed in units of electron volts (eV). Accordingly, the work function of a material determines the minimum energy required for electrons to escape the surface, with lower work functions generally facilitating electron emission.

The difference in work function values between the electrodes (402) and (404) due to the different electrode materials influences the voltage that can be achieved. Thus, to generate high power, the difference in work function values between the electrodes (402) and (404) is relatively large in an exemplary embodiment. In an embodiment, the work function value of the collector electrode (404) is smaller than the work function value of the emitter electrode (402). The different work function values induces a contact potential difference between the electrodes (402) and (404) that has to be overcome, e.g., by the application of heat to the emitter electrode (402), to transmit electrons through the nano-fluid (412) within the apertures (408) from the emitter electrode (402) to the collector electrode (404). In an exemplary embodiment, the total of the work function value of the collector electrode (404) and the contact potential difference is less than or equal to the work function of the emitter electrode (402). According to an embodiment, maximum flow occurs when the total of the work function value of the collector electrode (404) and the contact potential equals the work function value of the emitter electrode (402).

Both electrodes (402) and (404) emit electrons; however, once the contact potential difference is overcome, the emitter electrode (402) emits significantly more electrons than the collector electrode (404), which is influenced by an electric field that suppresses electron production from the collector electrode (404). A net flow of electrons is transferred from the emitter electrode (402) to the collector electrode (404), and a net electron current (414) flows from the emitter electrode (402) to the collector electrode (404) through the apertures (408). This net electron current (414) causes the emitter electrode (402) to become positively charged and the collector electrode (404) to become negatively charged. Accordingly, the thermal energy harvesting thermionic device (400) generates an electron flow (414) that is transmitted from the emitter electrode (402) to the collector electrode (404).

In an embodiment, the emitter electrode (402) may be manufactured with a first backing (416), which may comprise, for example, a polyester film, e.g., Mylar®, and a first layer (418) extending beneath the first backing (416). The first layer (418) may be comprised of, for example, graphene, platinum (Pt), or other suitable materials. In an embodiment, the emitter electrode (402) has an emitter electrode thickness measurement (420) extending in the Y direction that is, for example, approximately 0.25 millimeters (mm), such measurement being non-limiting, or in a range of, for example, about 2 nm to about 0.25 mm, such measurements being non-limiting. The first backing (416) is shown in FIG. 4 with a first backing thickness measurement (422), and the first layer (418) is shown herein with a first layer thickness measurement (424), each extending in the Y direction. In an embodiment, the first backing thickness measurement (422) and the first layer thickness measurement (424) are in a range of, for example, about 0.01 mm to about 0.125 mm, or, for example, 0.125 mm, such values being non-limiting. The first backing measurement (422) and the first layer measurement (424) may have the same or different measurement values. The first backing (416) may be omitted altogether, particularly where the first layer thickness measurement (424) is relatively large.

In an exemplary embodiment, prior to assembly, the first layer (418) is sprayed onto the first backing (416) so as to embody the first layer (418) as a nanoparticle layer that is approximately 2 nm (i.e., the approximate diameter of a nanoparticle), where the 2 nm value should be considered non-limiting. In an embodiment, the thickness (424) of the first layer (418) may be in a range of, for example, about 1 nm to about 20 nm, or about 2 nm to about 20 nm. In another embodiment, the thickness (424) of the first layer (418) may be in a range of, for example, 0.01 mm to 0.125 mm. Generally, smaller thicknesses have higher energy densities and less wasted energy. The first backing (416) has a first outer surface (428). The first backing (416) and the first layer (or the nanoparticle layer) (418) define a first interface (430) therebetween. The first layer (or the nanoparticle layer) (418) defines a first surface (432) facing the inter-electrode gap. Alternatively to spraying, the first layer (418) may be pre-formed and applied to the first backing layer (416), or vice versa, i.e., the first backing layer (416) applied to the first layer (418).

A first coating (434), such as cesium oxide ($Cs_2O$), at least partially covers the first surface (432) to form an emitter surface (436) of the first electrode (402) that directly interfaces with a first spacer surface (438). Accordingly, the emitter electrode (402) of the embodiment illustrated in FIG. 4 includes a first layer (or nanoparticle layer) (418) interposed between the first backing (416) and the first coating (434).

In FIG. 4, according to an exemplary embodiment the collector electrode (404) includes a second backing (446), which may comprise, for example, a polyester film, and at least one second layer (448), which may comprise, for example, graphene or aluminum (Al), extending over the second backing (446). The collector electrode (404) has a collector electrode thickness measurement (450) extending in the Y direction that is, for example, approximately 0.25 millimeters (mm), such measurement being non-limiting, or in a range of, for example, about 2 nm to about 0.25 mm, such values being non-limiting. For example, in an embodiment, a second backing measurement (452) of the second backing (446) and a second layer measurement (454) of the second layer (448) are each approximately 0.125 mm, such values being non-limiting. In an embodiment, the second backing measurement (452) and the second layer measurement (454) may be in a range of, for example, about 0.01 mm to about 0.125 mm, or each approximately 0.125 mm, such values being non-limiting. The second backing measurement (452) and the second layer measurement (454) may have the same or different measurement values. The second backing (446) may be omitted altogether, particularly where the second layer thickness measurement (454) is relatively large.

In an embodiment, the second layer (448) is sprayed on to the second backing (446) to embody the second layer (448) as a second nanoparticle layer that is approximately 2 nm thick, where the 2 nm value should be considered non-limiting. The second layer measurement (454) of the second layer (448) may range from, for example, about 1 nm to about 20 nm, or about 2 nm to about 20 nm. In another embodiment, the second layer measurement (454) of the second layer (448) may be in a range of, for example, 0.01 mm to 0.125 mm. As discussed above in connection with the first layer (418), generally, smaller thicknesses have higher energy densities and less wasted energy. The second backing (446) has a second outer surface (458). The second backing (446) and the second layer/nanoparticle layer (448) define a second interface (460). The second layer (or the second nanoparticle layer) (448) defines a second surface (462) facing the inter-electrode gap. Alternatively to spraying, the second layer (448) may be pre-formed and applied to the second backing (446) or vice versa, i.e., the second backing (446) applied to the second layer (448).

A second coating (464), which may be comprised of cesium oxide ($Cs_2O$), at least partially covers the second surface (462) to form a collector surface (466) of the collector electrode (404) that directly interfaces with a second surface (468) of the spacer (406). Accordingly, the collector electrode (404) of FIG. 4 includes the second layer/nanoparticle layer (448) on the second backing (446) and the $Cs_2O$ coating (464) on the second surface (462).

In an exemplary embodiment, the first coating (434) and the second coating (464) are formed on the first and second surfaces (432) and (462), respectively. In an embodiment, an electrospray or a nano-fabrication technique is employed to form or apply the first and second coatings (434) and (464), respectively. The first and second coatings (434) and (464) can be applied in one or more predetermined patterns that may be the same as or different from one another.

In one or more exemplary embodiments, a percentage of surface area coverage of each of the first surface (432) and second surface (462) with the respective coating layers (434) and (464) (e.g., $Cs_2O$) is within a range of at least 50%, and up to 70%, and in at least one embodiment is about 60%. The $Cs_2O$ coatings (434) and (464) reduce the work function values of the electrodes (402) and (404) from the work function values of, for example, platinum (Pt), which in an embodiment is 5.65 electron volts (eV), and aluminum (Al), which in an embodiment is 4.28 eV. The emitter electrode (402) with the coating layer (434) of $Cs_2O$ has a work function value ranging from about 0.5 to about 2.0 eV, and in an embodiment is approximately 1.5 eV, and the collector electrode (404) with the coating layer (464) of $Cs_2O$ has a work function value of about 0.5 to about 2.0 eV, and in an embodiment is approximately 1.5 eV.

Various modifications may be made to the thermal energy harvesting thermionic device (400) discussed herein. For example, either or both of the first backing (416) and the second backing (446) may be eliminated from the electrodes (402) and (404), respectively, particularly where the first layer (418) and/or the second layer (448) have relatively large thicknesses.

In an embodiment, the electrodes (402) and (404) are comprised of graphene, and are referred to herein as graphene electrodes (402) and (404). The graphene electrodes (402) and (404) can exhibit work function values below 1.0 eV when coated with cesium oxide, gold, tungsten, and other elements and compounds. Sulfur may be incorporated into the coatings (434) and (464) to improve the bonding of the coatings (434) and (464) to the graphene electrodes (402) and (404), respectively, particularly where the first and second layers (418) and (448) of the electrodes (402) and (404) comprise graphene and the sulfur creates covalent bonding between the electrodes (402) and (404) and their respective coatings (434) and (464). The respective work function values of the electrodes (402) and (404) can be made to differ, even when both are comprised of graphene, for example by incorporating different coatings (434) and (464) into the electrodes (402) and (404). Suitable graphene electrodes are available through ACS (Advanced Chemical Suppliers) Materials, and include Trivial Transfer Graphene™ (TTG 10055).

In an embodiment, the surface area coverage on the emitter electrode (402) or the collector electrode (404) with $Cs_2O$ is spatially resolved, e.g., applied in a pattern or non-uniform across the length of the corresponding surface, and provides a reduction in a corresponding work function to a minimum value. In an exemplary embodiment, the cesium oxide reduces the work function value of the emitter electrode (402) or the collector electrode (404) down to about 2.0 eV or less, e.g., about 1.2 eV. In an exemplary embodiment, this is an approximately 60-80% reduction, and corresponds to the surface coverage of the $Cs_2O$, e.g., cesium oxide. The lower work function values of the electrodes (402) and (404) improve operation of the thermal energy harvesting thermionic device (400) as described herein.

According to an exemplary embodiment, platinum (Pt) coated on copper foil and aluminum (Al) materials optionally are selected for the first and second electrodes (402) and (404), respectively, due to at least some of their metallic properties, e.g., strength and resistance to corrosion, and the measured change in work function values when the thermionic emissive material of $Cs_2O$ or other materials disclosed herein is layered thereon. Alternative materials may be used, such as graphene, noble metals including, and without limitation, rhenium (Re), osmium (Os), ruthenium (Ru), iridium (Ir), rhodium (Rh), and palladium (Pd), or any combination of these metals. In addition, and without limitation, non-noble metals such as gold (Au), tungsten (W), tantalum (Ta), and molybdenum (Mo), and any combination thereof, may also be used. For example, and without limitation, tungsten (W) nanoparticles may be used rather than platinum (Pt) nanoparticles to form the first surface (432), and gold (Au) nanoparticles may be used rather than aluminum (Al) nanoparticles to form the second surface (462). Accordingly, the selection of the materials used to form the nanoparticle surfaces (432) and (462) can be principally based on the work functions of the electrodes (402) and (404), and more specifically, the difference in the work functions once the electrodes (402) and (404) are fully fabricated.

The selection of the first and second coatings (434) and (464), i.e., thermionic electron emissive material(s), on the first surface (432) and second surface (462), respectively, may be partially based on the desired work function value of the electrodes (402) and (404), respectively, and chemical compatibility between the deposited materials, and the deposited thermionic electron emissive materials of the first and second coatings (434) and (464), respectively. Deposition materials include, but are not limited to, thorium, aluminum, cerium, and scandium, as well as oxides of alkali or alkaline earth metals, such as cesium, barium, calcium, and strontium, as well as combinations thereof and combinations with other materials. In at least one embodiment, the thickness of the layer(s) of patterned thermionic electron emissive material(s) of the first and second coatings (434) and (464) is approximately 2 nm, where the 2 nm value should be considered non-limiting. Accordingly, the electrodes (402) and (404) have highly desirable work functions.

Figure 5A:
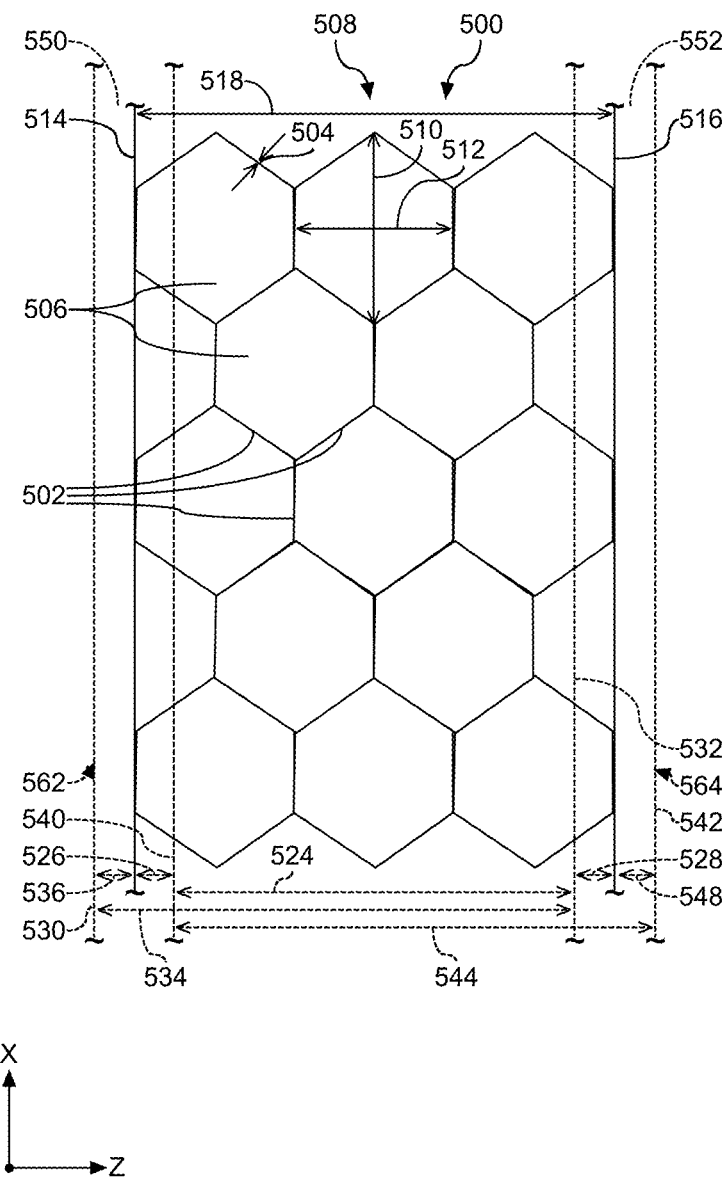
FIG. 5A illustrates a partially transparent top view of an embodiment of a spacer and adjacent electrodes for use in a thermal energy harvesting thermionic device.

FIG. 5A depicts a top view of an embodiment of a spacer (500) in relationship to (between) the adjacent electrodes (562) and (564), for use in a thermal energy harvesting thermionic device, such as the device (400) having electrodes (402) and (404) as shown and described in reference to FIG. 4. The spacer (500) and the electrodes (562) and (564) are not shown to scale.

The spacer (500) includes a plurality of interconnected edges or walls (502). The edges (502) have a thickness or edge measurement (504) in the range of, for example, about 2.0 nm to about 0.25 mm. In the illustrated embodiment, the interconnected edges (502) collectively define a plurality of hexagonal apertures, also referred to herein as cavities (506), in a honeycomb array (508). The cavities (506) extend in a direction parallel to the Y-axis. The spacer (500) may be configured as a uniform or relatively uniform layer, e.g., contiguous and with or without limited apertures. The apertures or cavities, either uniformly or non-uniformly provided across the width and/or length of the spacer material, may be in a range of, for example, greater than 0 mm (e.g., 2 nm) to about 0.25 mm in the Y-axis direction, similar to an embodiment of the spacer (406) of FIG. 4.

Figure 5B:
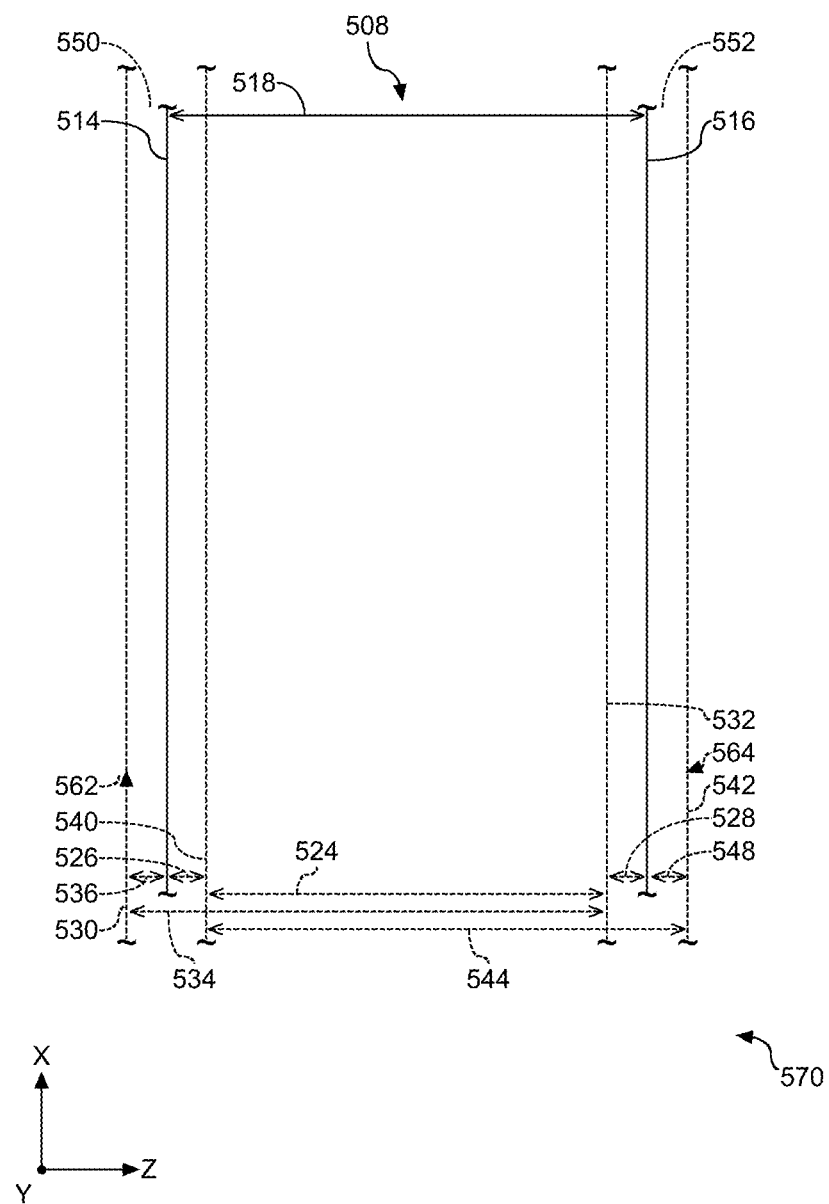
FIG. 5B illustrates a partially transparent top view of another embodiment of a spacer and adjacent electrodes for use in a thermal energy harvesting thermionic device.

Referring to FIG. 5B, a top view of another embodiment of a spacer (570) between the adjacent electrodes (562) and (564), is shown for use in a thermal energy harvesting thermionic device, such as the device (400) with electrodes (402) and (404) as shown and described in FIG. 4. The embodiments shown and described in FIGS. 5A and 5B are provided with the same reference numerals, where appropriate, to designate identical or like parts. The spacer (570) may be comprised of a permeable or semi-permeable material, which in an embodiment may be adapted to receive or be coated or impregnated with the nano-fluid.

Referring to FIG. 5A, in an embodiment the apertures (506) have a first dimension (510) and a second dimension (512) each having a value in a range between, for example, 2.0 nm and 100 microns. In an embodiment, the edges (502), the apertures (506), and the array (508) form various shapes, configurations, and sizes, including the dimensions and sizing of the apertures (506), that enable operation of spacer (500) as described herein, including, without limitation, circular, rectangular, and elliptical apertures (506).

The spacers (500) and (570), shown in FIGS. 5A and 5B, respectively, include a first outer edge (514) and a second outer edge (516) that define the Z-dimensions of the spacer (500), (570). The spacer (500), (570) has a distance measurement (518) in the lateral dimension (Z) between the lateral side edges (514) and (516) in a range of, for example, about 1 nm to about 10 microns.

As shown in FIGS. 5A and 5B, the electrodes (562) and (564) are offset in the lateral dimension Z with respect to one another and with respect to the spacer (500), (570). Specifically, the emitter electrode (562) includes opposite first and second lateral side edges (530) and (532) separated by a first distance (534). The collector electrode (564) includes opposite third and fourth lateral side edges (540) and (542) separated by a second distance (544). The values of the first and second distances (534) and (544) may be the same or different from one another, and may be within a range of, for example, approximately 10 mm to approximately 2.0 m.

With respect to the first electrode (562), the first lateral side edge (530) extends in the lateral direction Z beyond the first lateral support side edge (514) of the spacer (500), (570) by a third distance (536), and the second lateral support side edge (516) of the spacer (500), (570) extends in the lateral direction Z beyond the second lateral side edge (532) by a fourth distance (528).

With respect to the second electrode (564), the first lateral support side edge (514) of the spacer (500), (570) extends in the lateral direction Z beyond the third lateral side edge (540) by a fifth distance (526), and the fourth lateral side edge (542) extends in the lateral direction Z beyond the second lateral support side edge (516) of the spacer (500), (570) by a sixth distance (548).

In embodiments, the third distance (536), the fourth distance (528), the fifth distance (526), and the sixth distance (548) may be the same or different from one another and within a range of, for example, approximately 1.1 nm to approximately 10 microns. The spacer (500), (570) may have a lateral measurement (518) with respect to the Z-axis greater than lateral measurements (534) and (544) of the electrodes (562) and (564), respectively. The spacer design and measurements shown and described herein reduce a potential for electrodes, such as the electrodes (402) and (404), to contact one another when the spacer (500), (570) is incorporated into the device (400) of FIG. 4. The direct contacting of the electrodes (402) and (404) could create a short circuit.

Each of the lateral support side edges (514) and (516) may receive at least one layer of an electrically insulating sealant that electrically isolates the portions (550) and (552) of the electrodes (562) and (564), respectively, that extend beyond the lateral support side edges (514) and (516), respectively. Further, as described above, each of the electrodes (562) and (564) may be offset from the spacer (500), (570) to reduce the potential for the electrodes (562) and (564) contacting each other and creating a short circuit.

In exemplary embodiments, the at least one spacer (500) and/or (570), which in exemplary embodiments are dielectric spacers, as shown and described in FIGS. 5A and 5B, respectively, are fabricated with a dielectric material, such as, and without limitation, silica (silicon dioxide), alumina (aluminum dioxide), titania (titanium dioxide), and boron-nitride. The apertures (506) extend between the electrodes (562) and (564) for the distance (410) (with reference to FIG. 4), e.g., in the Y-dimension, in a range of, for example, about 1 nanometer (nm) (or 2 nm) to about 10 microns. A fluid, e.g., the nano-fluid (412) of FIG. 4, is received and maintained within each of the apertures (506). The dielectric spacer (500), (570) is positioned between, and in direct contact with, the electrodes (562) and (564).

Figure 6:
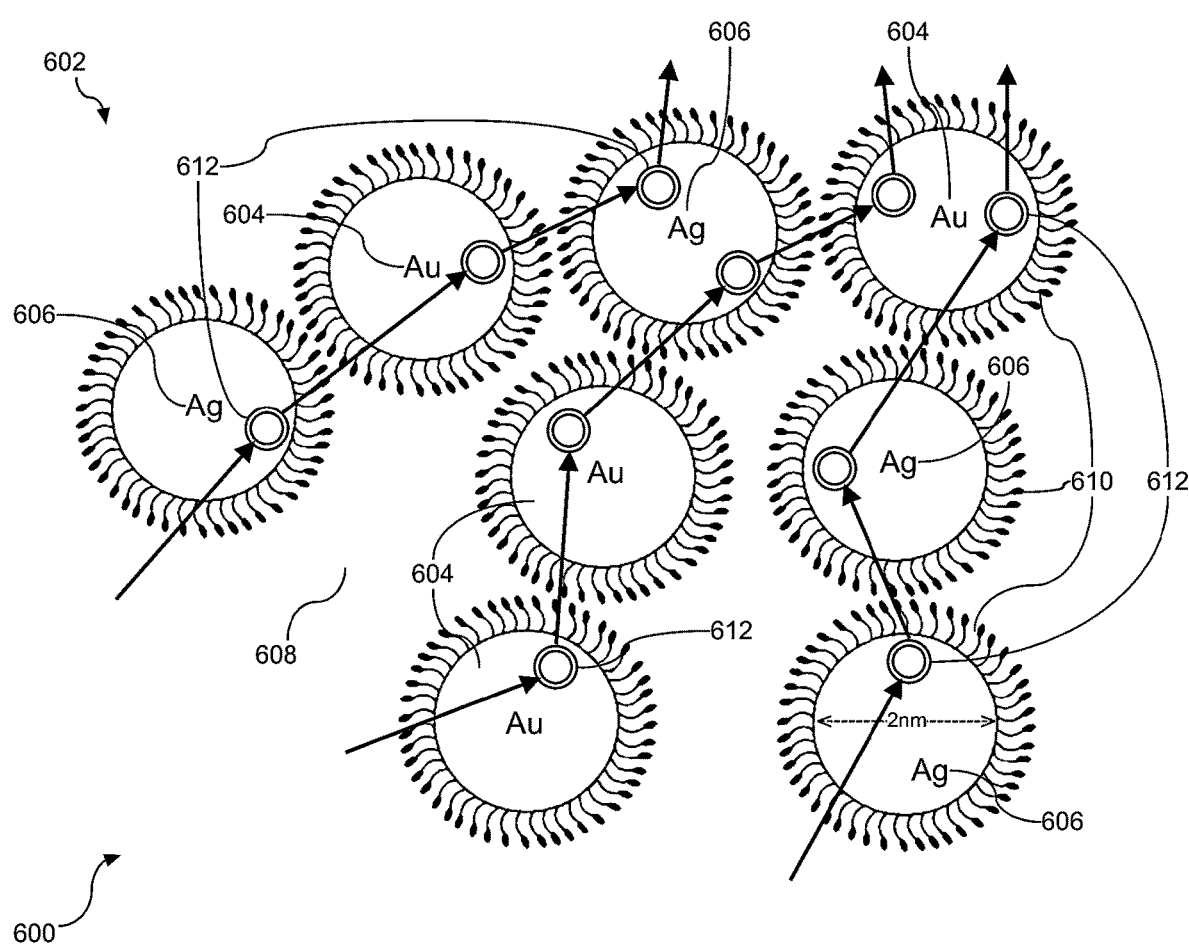
FIG. 6 illustrates a schematic view depicting an embodiment of a nano-fluid of a thermal energy harvesting thermionic device, the nano-fluid including a plurality of nanoparticles suspended in a dielectric medium.

Referring to FIG. 6, a diagram (600) is provided to illustrate a schematic view of an embodiment of a fluid (602), also referred to herein as a nano-fluid. As shown, the nano-fluid (602) includes a plurality of gold (Au) nanoparticle clusters (604) and a plurality of silver (Ag) nanoparticle clusters (606) suspended in a dielectric medium (608). Alternatively, the nano-fluid (602) may include gold (Au) nanoparticle clusters (604) but not silver (Ag) nanoparticle clusters (606), or alternatively silver (Ag) nanoparticle clusters (606) but not gold (Au) nanoparticle clusters (604). Nanoparticle materials other than silver (Ag) and gold (Au) may be used.

In FIG. 6, each cluster (606) and (608) is embodied as a single nanoparticle, in particular a single Au nanoparticle or a single Ag nanoparticle, with a dielectric coating (discussed below). In certain exemplary embodiments, one or more of the clusters (606) and (608) may be an agglomeration of more than one nanoparticle.

In some embodiments, and without limitation, the dielectric medium (608) is an alcohol, a ketone (e.g., acetone), an ether, a glycol, an olefin, and/or an alkane (e.g., those alkanes with greater than three carbon atoms, e.g., tetradecane). In an embodiment, the dielectric medium (608) is water or silicone oil. Alternatively, the dielectric medium (608) is an aerogel made from a sol-gel, the aerogel having aerogel-like properties and low thermal conductivity values that reduce heat transfer therethrough, e.g., thermal conductivity values as low as 0.013 watts per meter-degrees Kelvin (W/m·K) as compared to the thermal conductivity of water at 20 degrees Celsius (° C.) of 0.6 W/m·K. Appropriate materials are selected to fabricate the nanoparticle clusters (604) and (606). According to an embodiment, the materials selected for the nanoparticle clusters (604) and (606) may have work function values that are greater than the work function values for associated electrodes, such as the electrodes (402) and (404) of FIG. 4. In an example, the work function values of the Au nanoparticle clusters (604) and the Ag nanoparticle clusters (606) are about 4.1 eV and 3.8 eV, respectively.

According to exemplary embodiments, at least one layer of a dielectric coating (610), such as a monolayer of alkanethiol material, is deposited on the Au nanoparticle clusters (604) and the Ag nanoparticle clusters (606) to form a dielectric barrier thereon. In an exemplary embodiment, the deposit of the dielectric coating (610) is performed via electrospray. The alkanethiol material of the dielectric coating (610) includes, but is not limited to, dodecanethiol and/or decanethiol. Additionally or alternatively, the dielectric coating (610) may be a halogenoalkane or alkyl halide, in which one or more of the hydrogen atoms of the alkane are replaced by halogen atom(s), i.e., fluorine, chlorine, bromine, or iodine. The deposit of the dielectric coating (610), such as alkanethiol, reduces coalescence of the nanoparticle clusters (604) and (606). In at least one embodiment, the nanoparticle clusters (604) and (606) have a diameter in the range of about 1 nm to about 3 nm. In an exemplary embodiment, the nanoparticle clusters (604) and (606) have a diameter of about 2 nm. In an exemplary embodiment, the Au nanoparticle clusters (604) and the Ag nanoparticle clusters (606) are tailored to be electrically conductive with charge storage features (i.e., capacitive features), minimize diffusive heat transfer through associated spacer apertures, such as the spacer apertures (506) of FIG. 5A, with low thermal conductivity values, minimize ohmic heating, eliminate space charges in the spacer apertures (506), and prevent arcing. The plurality of Au nanoparticle clusters (604) and the Ag nanoparticle clusters (606) are suspended in the dielectric medium (608). Accordingly, the nano-fluid (602), including the suspended nanoparticle clusters (604) and (606), provides a conductive pathway for electrons to travel across the spacer apertures (408) of FIG. 4 and/or (506) of FIGS. 5A and 5B from, for example with reference to FIG. 4, the emitter electrode (402) to the collector electrode (404) through charge transfer. Accordingly, in at least one embodiment, a plurality of the Au nanoparticle clusters (604) and the Ag nanoparticle clusters (606) are mixed together in the dielectric medium (608) to form the nano-fluid (602), the nano-fluid (602) residing in the apertures (408) of FIG. 4 and/or the apertures (506) of FIG. 5A or the inter-electrode gap of FIG. 5B.

The Au nanoparticle clusters (604) according to exemplary embodiments are dodecanethiol functionalized gold nanoparticles. In exemplary embodiments, the Au nanoparticle clusters (604) have an average particle size of about 1 nm to about 3 nm, at about 2% (weight/volume (grams/ml)). According to exemplary embodiments, the Ag nanoparticle clusters (606) are dodecanethiol functionalized silver nanoparticles. In certain embodiments, the Ag nanoparticle clusters (606) have an average particle size of about 1 nm to about 3 nm, at about 0.25% (weight/volume percent). In an embodiment, the average particle size of both the Au and Ag nanoparticle clusters (604) and (606) is at or about 2 nm. The Au and Ag cores of the nanoparticle clusters (604) and (606) are selected for their abilities to store and transfer electrons. In an embodiment, a 50%-50% mixture of Au and Ag nanoparticle clusters (604) and (606) are used. However, a mixture in the range of 1-99% Au-to-Ag can be used as well. Electron transfers are more likely to occur between nanoparticle clusters (604) and (606) with different work functions. In an exemplary embodiment, a mixture of nearly equal (molar) numbers of two different nanoparticle clusters (604) and (606), e.g., Au and Ag, provides good electron transfer. Accordingly, nanoparticle clusters are selected based on particle size, particle material (with the associated work function values), mixture ratio, and electron affinity.

Conductivity of the nano-fluid (602) can be increased by increasing concentration of the nanoparticle clusters (604) and (606). The nanoparticle clusters (604) and (606) may have a concentration within the nano-fluid (602) of, for example, about 0.1 mole/liter to about 2 moles/liter. In at least one embodiment, the Au and Ag nanoparticle clusters (604) and (606) each have a concentration of at least 1 mole/liter. In at least one embodiment, a plurality of Au and Ag nanoparticle clusters (604) and (606) are mixed together in a dielectric medium (608) to form a nano-fluid (602), the nano-fluid (602) residing in, for example, the apertures (408) of FIG. 4, the apertures (506) of FIG. 5A, and/or the permeable or semi-permeable material of FIG. 5B.

According to an exemplary embodiment, the stability and reactivity of nanoparticles, such as Au and Ag nanoparticle clusters (604) and (606), are determined largely by a ligand shell formed by the alkanethiol coating (610) adsorbed or covalently bound to the surface of the nanoparticle clusters (604) and (606). The nanoparticle clusters (604) and (606) tend to aggregate and precipitate, which can be prevented by the presence of a ligand shell of the non-aggregating polymer alkanethiol coating (610) enabling these nanoparticle clusters (604) and (606) to remain suspended. Adsorbed or covalently attached ligands can act as stabilizers against agglomeration and can be used to impart chemical functionality to the nanoparticle clusters (604) and (606). Over time, the surfactant nature of the ligand coatings is overcome and the lower energy state of agglomerated nanoparticle clusters is formed. Over time, agglomeration may occur due to the lower energy condition of nanoparticle cluster accumulation and addition of a surfactant may be used. Examples of surfactants include, without limitation, Tween® 20 and Tween® 21.

In the case of the nano-fluid (602) of FIG. 6 substituted for the nano-fluid (412) of FIG. 4, electron transfer through collisions of the plurality of nanoparticle clusters (604) and (606) is illustrated. In an exemplary embodiment, the work function values of the nanoparticle clusters (604) and (606) are greater than the work function values of the emitter electrode (402) (e.g., about 0.5 eV to about 2.0 eV) and the collector electrode (404) (e.g., about 0.5 eV to about 2.0 eV). The nanoparticle clusters (604) and (606) are tailored to be electrically conductive with capacitive (i.e., charge storage) features while minimizing heat transfer therethrough. Accordingly, the suspended nanoparticle clusters (604) and (606) provide a conductive pathway for electrons to travel across the apertures (408) from the emitter electrode (402) to the collector electrode (404) through charge transfer.

Thermally-induced Brownian motion causes the nanoparticle clusters (604) and (606) to move within the dielectric medium (608), and during this movement the nanoparticle clusters (604) and (606) occasionally collide with each other and with the electrodes (402) and (404). As the nanoparticle clusters (604) and (606) move and collide within the dielectric medium (608), the nanoparticle clusters (604) and (606) chemically and physically transfer charge. The nanoparticle clusters (604) and (606) transfer charge chemically when electrons (612) hop between electrodes, e.g., from and to the electrodes (402) and (404) of FIG. 4, to the nanoparticle clusters (604) and (606) and from one nanoparticle cluster (604) and (606) to another nanoparticle cluster. The hops primarily occur during collisions. Due to the electric field affecting the collector electrode (404), electrons (612) are more likely to move from the emitter electrode (402) to the collector electrode (404) via the nanoparticle clusters (604) and (606) rather than in the reverse (opposite) direction. Accordingly, a net electron current from the emitter electrode (402) to the collector electrode (404) via the nanoparticle clusters (604) and (606) is the primary and dominant current of the thermal energy harvesting thermionic device, e.g., (400).

The nanoparticle clusters (604) and (606) transfer charge physically (i.e., undergo transient charging) due to the ionization of the nanoparticle clusters (604) and (606) upon receipt of an electron, and the electric field generated by the differently charged electrodes (402) and (404). The nanoparticle clusters (604) and (606) become ionized in collisions when the clusters gain or lose an electron (612). Positive and negative charged nanoparticle clusters (604) and (606) in the nano-fluid (602) migrate to the negatively charged collector electrode (404) and the positively charged emitter electrode (402), respectively, providing an ion current flow. This ion current flow is in the opposite direction from the electron current flow, but less in magnitude than the electron flow.

Some ion recombination in the nano-fluid (602) may occur, which diminishes both the electron and ion current flow. Electrode separation may be selected at an optimum width (or thickness in the Y direction in FIG. 4) to maximize ion formation and minimize ion recombination. In an exemplary embodiment, the electrode separation (410) is less than about 10 nm to support maximization of ion formation and minimization of ion recombination. In an embodiment, the nanoparticle clusters (604) and (606) have a maximum dimension of, for example, about 2 nm. In exemplary embodiments, the electrode separation distance (410) as defined by the spacer (406) (or the spacer (500) or (570) of FIGS. 5A and 5B, respectively) has an upper limit of, for example, about 1000 nm, preferably about 100 nm, and more preferably about 20 nm, and the electrode separation distance (410) of 20 nm is equivalent to approximately 10 nanoparticle clusters (604) and (606). Therefore, the electrode separation distance (410) of about 20 nm provides sufficient space within the apertures (408) for nanoparticle clusters (604) and (606) to move around and collide, while minimizing ion recombination. For example, in an embodiment, an electron can hop from the emitter electrode (402) to a first set of nanoparticle clusters (604) and (606) and then to a second, third, fourth, or fifth set of nanoparticle clusters (604) and (606) before hopping to the collector electrode (404). A reduced quantity of hops mitigates ion recombination opportunities. Accordingly, ion recombination in the nano-fluid (602) is minimized through an electrode separation distance (410) selected at an optimum width to maximize ion formation and minimize ion recombination.

In an exemplary embodiment, when the emitter electrode (402) and the collector electrode (404) are initially brought into close proximity, the electrons of the collector electrode (404) have a higher Fermi level than the electrons of the emitter electrode (402) due to the lower work function of the collector electrode (404). The difference in Fermi levels drives a net electron current that transfers electrons from the collector electrode (404) to the emitter electrode (402) until the Fermi levels are equal, i.e., the electrochemical potentials are balanced and thermodynamic equilibrium is achieved. The transfer of electrons between the emitter electrode (402) and the collector electrode (404) results in a difference in charge between the emitter electrode (402) and the collector electrode (404). This charge difference sets up the voltage of the contact potential difference and an electric field between the emitter electrode (402) and the collector electrode (404), where the polarity of the contact potential difference is determined by the material having the greatest work function. With the Fermi levels equalized, no net current will flow between the emitter electrode (402) and the collector electrode (404). Accordingly, electrically coupling the emitter electrode (402) and the collector electrode (404) with no external load results in attaining the contact potential difference between the electrodes (402) and (404) and no net current flow between the electrodes (402) and (404) due to attainment of thermodynamic equilibrium between the two electrodes (402) and (404).

The thermal energy harvesting thermionic device (400) can generate electric power (e.g., at room temperature) with or without additional heat input. Heat added to the emitter electrode (402) will raise the temperature of the emitter electrode (402) and the Fermi level of the emitter electrode (402) electrons. With the Fermi level of the emitter electrode (402) higher than the Fermi level of the collector electrode (404), a net electron current will flow from the emitter electrode (402) to the collector electrode (404) through the nano-fluid (412), (602). If the device (400) is placed into an external circuit (e.g., see FIG. 2), such that the external circuit is connected to the electrodes (402) and (404), the same amount of electron current will flow through the external circuit from the collector electrode (404) to the emitter electrode (402). Heat energy added to the emitter electrode (402) is carried by the electrons (612) to the collector electrode (402). The bulk of the added energy is transferred to the external circuit for conversion to useful work, some of the added energy is transferred through collisions of the nanoparticle clusters (604) and (606) with the collector electrode (404), and some of the added energy is lost to ambient as waste energy. As the energy input to the emitter electrode (402) increases, the temperature of the emitter electrode (402) increases, and the electron transmission from the emitter electrode (402) increases, thereby generating more electron current. As the emitter electrode (402) releases electrons onto the nanoparticle clusters (604) and (606), energy is stored in the thermal energy harvesting thermionic device (400). Accordingly, the thermal energy harvesting thermionic device (400) generates, stores, and transfers charge and moves heat energy associated with a temperature difference, where added thermal energy causes the production of electrons to increase from the emitter electrode (402) into the nano-fluid (412), (602).

The nano-fluid (602) can be substituted into the device (400) of FIG. 4 and used to transfer charges from the emitter electrode (402) to one of the mobile nanoparticle clusters (604) and (606) via intermediate contact potential differences from the collisions of the nanoparticle clusters (604) and (606) with the emitter electrode (402) induced by Brownian motion of the nanoparticle clusters (604) and (606). In an exemplary embodiment, selection of dissimilar nanoparticle clusters (604) and (606) that include Au nanoparticle clusters (604) and Ag nanoparticle clusters (606), which have greater work functions of about 4.1 eV and about 3.8 eV, respectively, than the work functions of the electrodes (402) and (404) in accordance with an embodiment, improves transfer of electrons to the nanoparticle clusters (604) and (606) from the emitter electrode (402) to the collector electrode (404). In this exemplary embodiment, the relationship of the work function values of the Au and Ag nanoparticle clusters (604) and (606) improves the transfer of electrons to the nanoparticle clusters (604) and (606) through Brownian motion and electron hopping. Accordingly, the selection of materials within the thermal energy harvesting thermionic device (400) improves electric current generation and transfer therein through enhancing the release of electrons from the emitter electrode (402) and the conduction of the released electrons across the nano-fluid (412), (602) to the collector electrode (404).

As the electrons (612) hop from nanoparticle cluster (604) and (606) to nanoparticle cluster (604) and (606), single electron charging effects that include the additional work required to hop an electron (612) onto a nanoparticle cluster (604) and (606) if an electron (612) is already present on the nanoparticle cluster (604) and (606), determine if hopping additional electrons (612) onto that particular nanoparticle cluster (604) and (606) is possible. Specifically, the nanoparticle clusters (604) and (606) include a voltage feedback mechanism that prevents the hopping of more than a predetermined number of electrons to the nanoparticle cluster (604) and (606). This prevents more than the allowed number of electrons (612) from residing on the nanoparticle cluster (604) and (606) simultaneously. In an embodiment, only one electron (612) is permitted on any nanoparticle cluster (604) and (606) at any one time. Therefore, during conduction of current through the nano-fluid (602), a single electron (612) hops onto the nanoparticle cluster (604) and (606). The electron (612) does not remain on the nanoparticle cluster (604) and (606) indefinitely, but hops off to either the next nanoparticle cluster (604) and (606) or the collector electrode (404) through collisions resulting from the Brownian motion of the nanoparticle clusters (604) and (606). However, the electron (612) does remain on the nanoparticle cluster (604) and (606) long enough to provide the voltage feedback required to prevent additional electrons (612) from hopping simultaneously onto the nanoparticle clusters (604) and (606). The hopping of electrons (612) across the nanoparticle clusters (604) and (606) avoids resistive heating associated with current flow in a media. Notably, the thermal energy harvesting thermionic device (400) containing the nano-fluid (602) does not require pre-charging by an external power source in order to introduce electrostatic forces. This is due to the device (400) being self-charged with triboelectric charges generated upon contact between the nanoparticle clusters (604) and (606) due to Brownian motion. Accordingly, in exemplary embodiments, the electron hopping across the nano-fluid (602) is limited to one electron (612) at a time residing on a nanoparticle cluster (604) and (606).

As the electron current starts to flow through the nano-fluid (602), a substantial energy flux away from the emitter electrode (402) is made possible by the net energy exchange between emitted and replacement electrons (612). The replacement electrons from an electrical conductor connected to the emitter electrode (402) do not arrive with a value of energy equivalent to an average value of the Fermi energy associated with the material of emitter electrode (402), but with an energy that is lower than the average value of the Fermi energy. Therefore, rather than the replacement energy of the replacement electrons being equal to the chemical potential of the emitter electrode (402), the electron replacement process takes place in the available energy states below the Fermi energy in the emitter electrode (402). The process through which electrons are emitted above the Fermi level and are replaced with electrons below the Fermi energy is sometimes referred to as an inverse Nottingham effect. Accordingly, a low work function value of, for example, about 0.5 eV for the emitter electrode (402) allows for the replacement of the emitted electrons with electrons with a lower energy level to induce a cooling effect on the emitter electrode (402).

As described this far, in certain exemplary embodiments the principal electron transfer mechanism for operation of the device (400) is thermionic energy conversion or harvesting. In some embodiments, thermoelectric energy conversion is conducted in parallel with the thermionic energy conversion. For example and referring to FIG. 6, an electron (612) colliding with a nanoparticle cluster (604) and (606) with a first energy may induce the emission of two electrons at second and third energy levels, respectively, where the first energy level is greater than the sum of the second and third energy levels. In such circumstances, the energy levels of the emitted electrons are not as important as the number of electrons.

Thermal energy harvesting thermionic devices (400) are distinguished by at least one embodiment having the thermoelectric energy conversion features described herein. The nano-fluid (412), (602) is selected for operation of the thermal energy harvesting thermionic devices (400) within one or more temperature ranges. In an embodiment, the temperature range of the associated thermal energy harvesting thermionic device (400) is controlled to modulate a power output of the device (400). In general, as the temperature of the emitter electrode (402) increases, the rate of thermionic emission therefrom increases. The operational temperature ranges for the nano-fluid (602) are based on the desired output of the thermal energy harvesting thermionic device (400), the temperature ranges that optimize thermionic conversion, the temperature ranges that optimize thermoelectric conversion, and fluid characteristics. Therefore, different embodiments of the nano-fluid (602) are designed for different energy outputs of the device (400).

For example, in an embodiment, the temperature of the nano-fluid (412), (602) is maintained at less than 250° C. to avoid deleterious changes in energy conversion due to the viscosity changes of the dielectric medium (608) above 250° C. In an embodiment, the temperature range of the nano-fluid (602) for substantially thermionic emission is only approximately room temperature (i.e., about 20° C. to about 25° C.) up to about 70-80° C., and the temperature range of the nano-fluid (602) for thermionic and thermo-electric conversion is above 70-80° C., with the principal limitations being the temperature limitations of the materials. In an exemplary embodiment, the nano-fluid (602) for operation including thermoelectric conversion includes a temperature range that optimizes the thermoelectric conversion through optimizing the power density within the thermal energy harvesting thermionic device (400), thereby optimizing the power output of the device (400). In at least one embodiment, a mechanism for regulating the temperature of the nano-fluid (602) includes diverting some of the energy output, e.g., heat, of the device (400) into the nano-fluid (602). Accordingly, the apertures (408) of specific embodiments of the thermal energy harvesting thermionic device (400) may be filled with the nano-fluid (602) to employ thermoelectric energy conversion with thermionic energy conversion above a particular temperature range, or thermionic energy conversion by itself below that temperature range.

As described herein, in at least one embodiment, the dielectric medium (608) has thermal conductivity values less than about 1.0 watt per meter-Kelvin (W/m·K). In at least one embodiment, the thermal conductivity of the dielectric medium (608) is about 0.013 watt per meter-Kelvin (W/m·K), as compared to the thermal conductivity of water at about 20 degrees Celsius (° C.) of about 0.6 W/m·K. Accordingly, the nano-fluid (602) minimizes heat transfer, such as through the apertures (408) of FIG. 4, with low thermal conductivity values. Since the heat transport in a low thermal conductivity nano-fluid (602) can be small, a high temperature difference between the two electrodes, e.g., the electrodes (402) and (404), can be maintained during operation. These embodiments are designed for thermal energy harvesting thermionic devices that employ thermionic emission where minimal heat transfer through the nano-fluid (412), (602) is desired.

As shown in FIG. 4, the thermal energy harvesting thermionic device (400) has an aperture (408) with a distance (410) between electrodes (402) and (404) that in exemplary embodiments is within a range of, for example, about 1 nm (or 2 nm) to about 20 nm. In a portion of range of the electrode separation distance (410) of about 1 nm (or 2 nm) to about less than 10 nm, thermal conductivity values and electrical conductivity values of the nano-fluid (412), (602) are enhanced beyond those conductivity values attained when the predetermined distance of the cavity (408) is greater than about 100 nm. This enhancement of thermal and electrical conductivity values of the nano-fluid (412), (602) associated with the distance (410) of about 1 nm (or about 2 nm) to 10 nm as compared to a distance (410) greater than 100 nm is due to a plurality of factors.

Examples of a first factor include, but are not limited to, enhanced phonon and electron transfer between the plurality of nanoparticle clusters (604) and (606) within the nano-fluid (602), enhanced phonon and electron transfer between the plurality of nanoparticle clusters (604) and (606) and the first electrode (402), and enhanced phonon and electron transfer between the plurality of nanoparticle clusters (604) and (606) and the second electrode (404).

A second factor is an enhanced influence of Brownian motion of the nanoparticle clusters (604) and (606) in a confining environment between the electrodes (402) and (404) to, e.g., less than about 10 nm inter-electrode distance (410). As the distance (410) between the electrodes (402) and (404) decreases below about 10 nm, fluid continuum characteristics of the nano-fluid (412), (602) with the suspended nanoparticle clusters (604) and (606) is altered. For example, as the ratio of particle size to volume of the apertures (408) increases, random and convection-like effects of Brownian motion in a dilute solution dominate. Therefore, collisions of the nanoparticle clusters (604) and (606) with the surfaces of other nanoparticle clusters (604) and (606) and the electrodes (402) and (404) increase thermal and electrical conductivity values due to the enhanced phonon and electron transfer.

A third factor is the at least partial formation of matrices of the nanoparticle clusters (604) and (606) within the nano-fluid (602). Under certain conditions, the nanoparticle clusters (604) and (606) will form matrices within the nano-fluid (602) as a function of close proximity to each other with some of the nanoparticle clusters remaining independent from the matrices. In an embodiment, the formation of the matrices is based on the factors of time and/or concentration of the nanoparticle clusters (604) and (606) in the nano-fluid (602).

A fourth factor is the predetermined nanoparticle clusters (604) and (606) density, which in an embodiment is about one mole per liter. Accordingly, apertures (408) containing the nano-fluid (602) with a distance (410) of about 1 nm (or about 2 nm) to less than about 10 nm causes an increase in the thermal and electrical conductivity values of the nano-fluid (602) therein.

In addition, the nanoparticle clusters (604) and (606) have a small characteristic length, e.g., about 2 nm, and the clusters (604) and (606) are often considered to have only one dimension. This characteristic length restricts electrons in a process called quantum confinement, which increases electrical conductivity. The collision of particles with different quantum confinement facilitates transfer of charge to the electrodes (402) and (404). The thermal energy harvesting thermionic device (400) has an enhanced electrical conductivity value greater than about 1 Siemens per meter (S/m) as compared to the electrical conductivity of drinking water of about 0.005 S/m to about 0.05 S/m. Also, the embodiments of the device (400) with the enhanced thermal conductivity have a thermal conductivity value greater than about 1 W/m·K as compared to the thermal conductivity of water at 20 degrees Celsius (° C.) of about 0.6 W/m·K.

Thermionic emission of electrons (612) from the emitter electrode (402) and the transfer of the electrons (612) across the nano-fluid (602) from one nanoparticle cluster (604) and (606) to another nanoparticle cluster (604) and (606) through hopping are both quantum mechanical effects.

Release of electrons from the emitter electrode (402) through thermionic emission as described herein is an energy selective mechanism. A thermionic barrier in the apertures (408) between the emitter electrode (402) and the collector electrode (404) is induced through the interaction of the nanoparticles (604) and (606) inside the apertures (408) with the electrodes (402) and (404). The thermionic barrier is at least partially induced through the quantity and material composition of the plurality of nanoparticle clusters (604) and (606). The thermionic barrier induced through the nano-fluid (602) provides an energy selective barrier on the order of, for example, about 1 eV. Accordingly, the nano-fluid (602) provides an energy selective barrier to electron emission and transmission.

In exemplary embodiments, to overcome the thermionic barrier and allow electrons (612) to be emitted from the emitter electrode (402) above the energy level needed to overcome the barrier, materials for the emitter electrode (402) and the collector electrode (404) are selected for their work function values and Fermi level values. The Fermi levels of the two electrodes (402) and (404) and the nanoparticle clusters (604) and (606) will try to align by tunneling electrons (612) from the electrodes (402) and (404) to the nanoparticle clusters (604) and (606). The difference in potential between the two electrodes (402) and (404) (described elsewhere herein) overcomes the thermionic barrier, and the thermionic emission of electrons (612) from the emitter electrode (402) occurs with sufficient energy to overcome the thermionic block. Notably, and in general, for cooling purposes, removing higher energy electrons from the emitter electrode (402) causes the emission of electrons (612) to carry away more heat energy from the emitter electrode (402) than is realized with lower energy electrons. Accordingly, the energy selective barrier is overcome through the thermionic emission of electrons at a higher energy level than would be otherwise occurring without the thermionic barrier.

Once the electrons (612) have been emitted from the emitter electrode (402) through thermionic emission, the thermionic barrier continues to present an obstacle to further transmission of the electrons (612) through the nano-fluid (602). Smaller inter-electrode gaps on the order of about 1 nm (or about 2 nm) to about 10 nm, as compared to those gaps in excess of 100 nm, facilitate electron hopping, i.e., field emission, of short distances across the apertures (408). Energy requirements for electron hopping are much lower than the energy requirements for thermionic emission; therefore, the electron hopping has a significant effect on the energy generation characteristics of the device (400). The design of the nano-fluid (602) enables energy selective tunneling, e.g., electron hopping, that is a result of the barrier (which has wider gap for low energy electrons) which results in electrons above the Fermi level being a principal hopping component. In an exemplary embodiment, direction of the electron hopping is determined through the selection of the different materials for the electrodes (402) and (404) and their associated work function and Fermi level values. The electron hopping across the nano-fluid (602) transfers heat energy with electrons (612) across the apertures (408) while maintaining a predetermined temperature gradient such that the temperature of the nano-fluid (602) is relatively unchanged during the electron transfer. Accordingly, the emitted electrons transport heat energy from the emitter electrode (402) across the apertures (408) to the collector electrode (404) without increasing the temperature of the nano-fluid (602).

Embodiment for Manufacturing the Thermionic Devices/Apparatuses

Figure 8:
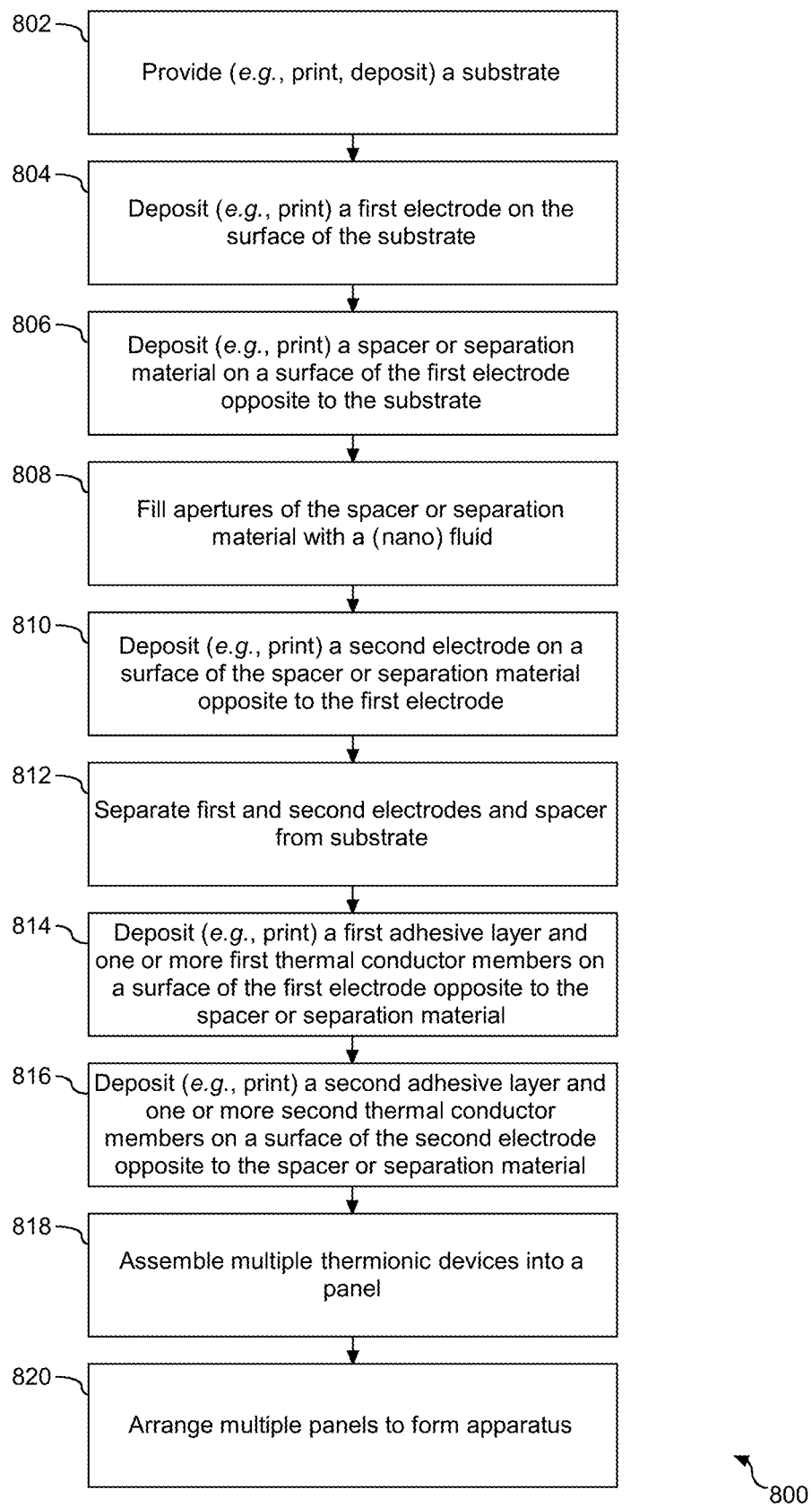
FIG. 8 illustrates a flowchart depicting an embodiment of a method for manufacturing an apparatus including a plurality of thermal energy harvesting thermionic devices according to an exemplary embodiment.

Referring to FIG. 8, a flowchart (800) is provided illustrating an embodiment of a method for manufacturing thermal energy harvesting thermionic devices, and assembling the thermionic devices into panels, and arranging the panels to create an apparatuses.

A substrate is provided, e.g., pre-fabricated or is deposited, such as by printing (802). Printing operations referred to with reference to the steps of FIG. 8 may be performed with apparatus (900) of FIG. 9, discussed in greater detail below. The substrate may be planar or pre-shaped. A first electrode (e.g., the emitter electrode) having a first work function value is deposited, e.g., printed, on a surface of the substrate (804). A spacer or other separation material is deposited, e.g., printed, on a surface of the first electrode opposite to the substrate (806) so that a first surface of the spacer or other separation material is positioned in at least partial physical contact with the first electrode. Apertures or passageways in the spacer or other separation material may be formed before, during deposition, or after deposition. The apertures or passageways are filled with a medium or media (808), which in an exemplary embodiment comprises a nano-fluid including a plurality of nanoparticles, such as that shown in FIG. 6. The filling of the apertures or passageways of the spacer or other separation material may be performed prior to, during, or after deposition of the spacer or other separation material. A second electrode (e.g., the collector electrode) having a second work function value is deposited, e.g., printed, on a surface of the spacer or other separation material that is opposite to the first electrode so that a second surface of the spacer or other separation material is positioned in at least partial physical contact with the second electrode (810). The first and second electrodes and the spacer are separated from the substrate (812). A first adhesive layer and one or more first thermal conductor members are deposited, such as by printing, on a surface of the first electrode opposite to the spacer or separation material (814). A second adhesive layer and one or more second thermal conductor members are deposited, such as by printing, on a surface of the second electrode opposite to the spacer or separation material (816). The steps (802) to (816) are repeated to form a plurality of thermionic devices.

The plurality of thermionic devices are assembled into a panel (818), such as panel (110A), (110B), or (110C) of FIG. 1A. According to an embodiment, the substrate (e.g., (112A)) and insulating coatings (e.g., (114A) and (116A)) have passages in which the thermionic devices are positioned. Step (818) is repeated to form a plurality of panels. The plurality of panels are arranged, such as in a housing, to establish a heat-transfer apparatus (820).

Exemplary electrospray and nano-fabrication technique(s) and associated equipment, including three-dimensional printing and four-dimensional printing (in which the fourth dimension is varying the nanoscale composition during printing to tailor properties) for forming the thermionic device are set forth in U.S. Application Publication No. 2015/0251213 published Sep. 10, 2015 entitled "Electrospray Pinning of NanoGrained Depositions," U.S. patent application Ser. No. 16/416,849 filed May 20, 2019 entitled "Single-Nozzle Apparatus for Engineered Nano-Scale Electrospray Depositions," U.S. patent application Ser. No. 16/416,858 filed May 20, 2019 entitled "Multi-Nozzle Apparatus for Engineered Nano-Scale Electrospray Depositions," and in U.S. patent application Ser. No. 16/416,869 filed May 20, 2019 entitled "Method of Fabricating Nano-Structures with Engineered Nano-Scale Electrospray Depositions." The apparatus and methods of those applications may be practiced alone or in combination with one another for making the various layers and components of the thermionic devices disclosed herein. Generally, and in certain embodiments, those applications include disclosures of embodiments regarding, among other things, a composition including a nano-structural material, grain growth inhibitor nanoparticles, and/or at least one of a tailoring solute or tailoring nanoparticles. Any one of more of those compositional components (e.g., grain growth inhibitors) may be excluded from the embodiments described herein.

Figure 9:
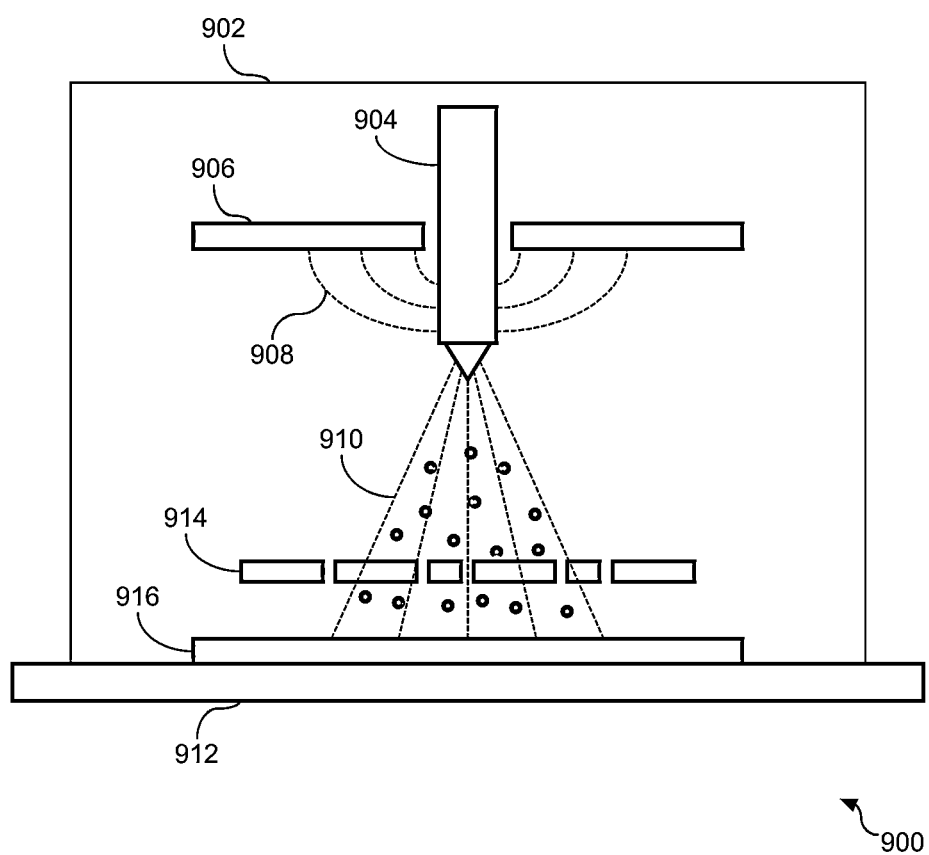
FIG. 9 illustrates an embodiment of an electrospray system and technique suitable for making a thermal harvesting thermionic device, including but not limited to carrying out the process of FIG. 8.

A simplified diagram of an electrospray apparatus or system is generally designated by reference numeral (900) in FIG. 9. The electrospray system (900) includes an outer housing (902) that may be embodied as a vented heat shield containing a Faraday cage (not shown). Within the outer housing (902), an emitter tube (also referred to as an electrospray nozzle) (904) coupled to the bottom of a material reservoir (not shown) receives molten material from the material reservoir through a capillary tube (not shown). An extractor electrode (906) is configured for generating an electric field (908) to extract the molten material from the electrospray nozzle (904) to form a stream or spray (910) of droplets of nanoparticle size. The electric field (908) also drives the spray of droplets (910) towards a moving stage (912) that is movable relative to the extractor electrode (906). The extractor electrode (906) can also generate a magnetic field for limiting dispersion of the stream (910) of droplets. In an exemplary embodiment, the extractor electrode (906) has a toroidal shape, with the electrospray nozzle (904) extending through the center of the toroid.

FIG. 9 shows the use of a template (914) for forming a predetermined pattern on substrate (916). The template (914) may be particularly useful in preparing certain layers, components, and subcomponents. For example, according to an embodiment, the template (914) is used to control the patterned deposition of the coating (434) or (464), e.g., a cesium oxide coating. In accordance with another embodiment, the template (914) is used to assist in the formation of apertures, e.g., apertures (408) in the spacer (406) of FIG. 4 or the walls (502) of spacer (500) of FIG. 5A.

The thermal conductors, including those arranged as arrays of nanopillars, may be formed using techniques known in the art. For example, U.S. Pat. No. 6,110,247 to Birmingham discloses micromachined pillars.

Figure 10:
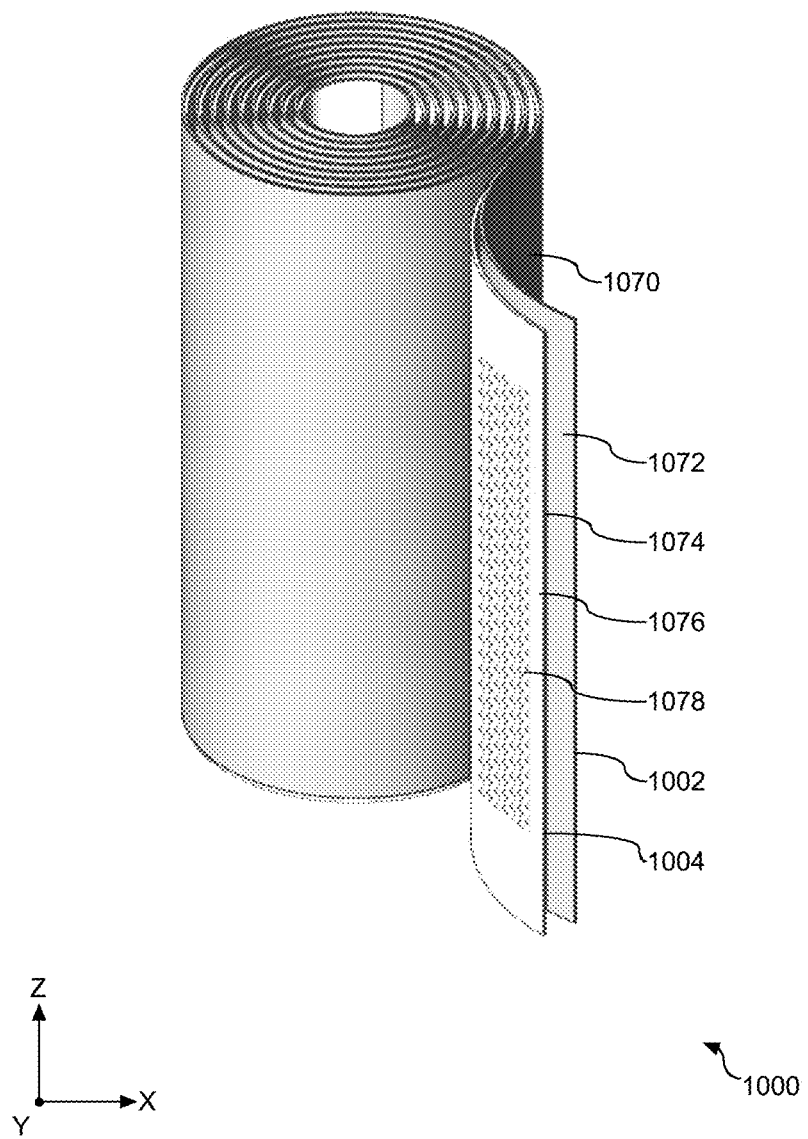
FIG. 10 illustrates a perspective view of a first repository of layered materials that may be used to manufacture a thermal energy harvesting thermionic device.
Figure 11:
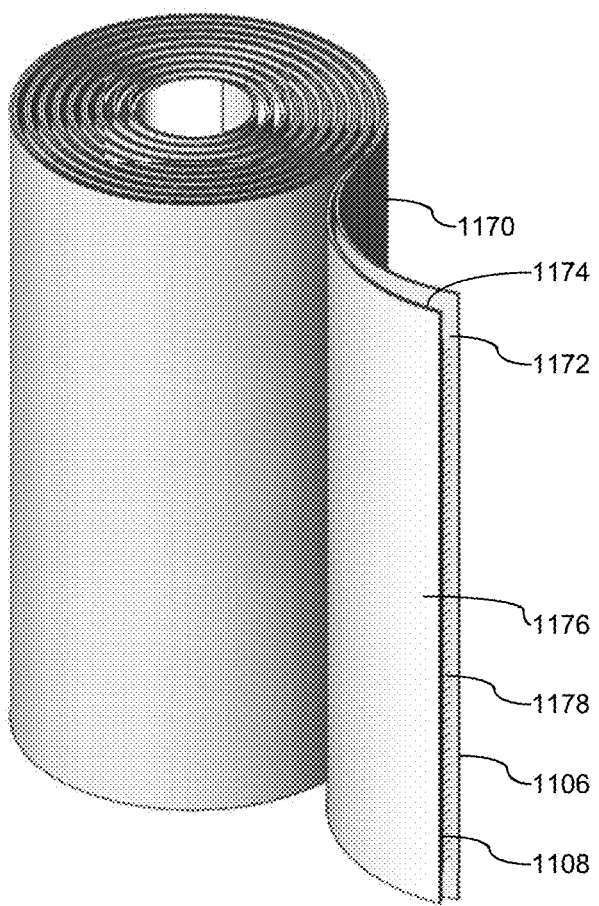
FIG. 11 illustrates a perspective view of a second repository of layered materials that may be used to manufacture a thermal energy harvesting thermionic device.

In another embodiment for manufacturing thermionic devices, the electrodes and spacers of the thermionic device are manufactured from prefabricated materials. FIG. 10 shows a perspective view of a first repository or roll (1000) of layered materials (1002) and (1004), e.g., the first and second layers, that may be used to manufacture the thermionic device. FIG. 11 illustrates a perspective view of a second repository or roll (1100) of layered materials (1106) and (1108), e.g., the third and fourth layers, that may be used in combination with the first repository (1000) to manufacture the thermionic device.

Referring to FIG. 10, a first layer (1002) is equivalent to an outer casing of the thermionic device, and is hereon referred to as outer casing (1002). In an exemplary embodiment, the outer casing (1002) is the equivalent to the first backing (416) of FIG. 4. Similarly, a second layer (1004) is equivalent to the emitter electrode (418) and is hereon referred to as emitter electrode (1004). The outer casing (1002) includes a first surface (1070) that defines an external surface of the thermionic device. The outer casing (1002) also includes a second surface (1072) that contacts the emitter electrode (1004). The emitter electrode (1004) includes a first surface (1074) contacting the second surface (1072) of the outer casing (1002). The emitter electrode (1004) also includes a second surface (1076). In an embodiment, the second surface (1076) is at least partially coated with $Cs_2O$ (1078) or other electron emissive materials described above, which in an embodiment is pre-applied to the second surface (1076). In an embodiment, the $Cs_2O$ (1078) is applied to the second surface (1076) during manufacturing of the thermionic device.

Referring to FIG. 11, a third layer (1106) is equivalent to a separation material (such as the spacer (406) of FIG. 4), and is hereon referred to as separation material (1106). In an embodiment, the separation material (1106) is, e.g., a dielectric material, and the separation material (1106) is impregnated with a nano-fluid, such as nano-fluid (602) discussed herein. Similarly, a fourth layer (1108) is equivalent to a collector electrode and is hereon referred to as collector electrode (1108). The separation material (1106) includes a first surface (1170) that contacts the second surface (1076) of the emitter electrode (1004) of FIG. 102. The separation material (1106) also includes a second surface (1172). The collector electrode (1108) includes a first surface (1174) contacting the second surface (1172) of the separation material (1106). The collector electrode (1108) also includes an opposite second surface (1176). In an embodiment, the first surface (1174) is at least partially coated with $Cs_2O$ (1178), which in an embodiment is pre-applied to the first surface (1174). In an embodiment, the $Cs_2O$ (1178) is applied to the first surface (1174) during manufacturing of the thermionic device.

In an embodiment, rather than manufacturing the thermal energy harvesting thermionic device using the two repositories or rolls (1000) and (1100), each of the layers (1002), (1004), (1106), and (1108) are dispensed from an individual repository or roll for each layer. In another embodiment, rather than using a separation material (1106) in the form of a solid material, the separation material (1106) is applied to either the second surface (1076) of the emitter electrode (1004) or the first surface (1174) of the collector electrode (1108). In an embodiment, the solid material is a sheet or a web. In an embodiment, the separation material (1106) is applied to both of the surfaces (1076) and (1174). In an embodiment, the separation material (1106) is pre-applied to either or both of the electrodes (1004) and (1108). In an embodiment, the separation material (1106) is applied to the electrodes (1004) and (1108) at the time of manufacture of the thermal energy harvesting thermionic device. In an embodiment, the separation material (1106) is a fluid applied through one or more electrospray devices (e.g., FIG. 9). In an embodiment, the separation material (1106) is applied through any method that enables operation of devices as described herein.

Embodiment for Operation of the Apparatuses

Figure 12:
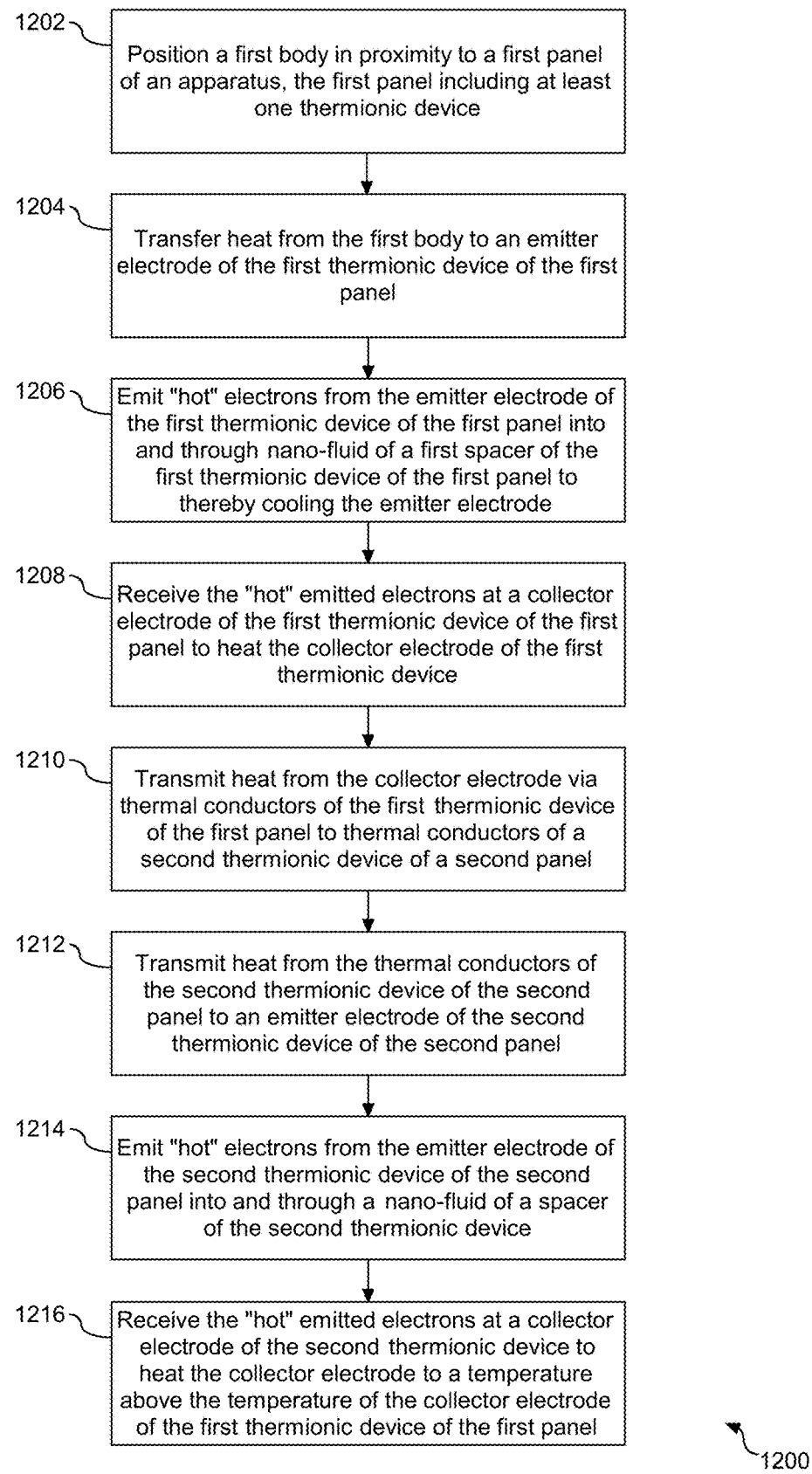
FIG. 12 illustrates a flowchart illustrating an embodiment of a method for operating a thermal-transfer apparatus according to an exemplary embodiment.

FIG. 12 depicts a flowchart illustrating an embodiment of a method for operating a heat-transfer apparatus according to an exemplary embodiment.

A first body, optionally having a warm or hot temperature, is positioned proximal to a first panel comprising at least one first thermionic device (1202). Heat is transferred from the first body to emitter-side thermal conductors, and from the thermal conductors to an emitter electrode of the first thermionic device of the first panel (1204). The emitter electrode of the first thermionic device emits "hot" electrons into and through nano-fluid of a spacer of the first thermionic device to thereby cool the emitter electrode of the first panel (and an object adjacent to or in contact with the first panel) (1206). The "hot" electrons are received by a collector electrode of the first thermionic device to heat the collector electrode (1208). Heat is transferred from the collector electrode via the collector-side thermal conductors of the first thermionic device of the first panel to emitter-side thermal conductors of a second thermionic device of a second panel (1210).

The heat received by the thermal conductors of the second thermionic device of the second panel is transferred to an emitter electrode of the second thermionic device of the second panel (1012). The emitter electrode of the second thermionic device emits "hot" electrons into and through a nano-fluid of a spacer of the second thermionic device of the second panel (1214). The emission and removal of higher energy electrons from the emitter electrode of the second thermionic device carries away more heat energy from the emitter electrode of the second thermionic device of the second panel than is realized with lower energy electrons. As a result, the emitter electrode of the second thermionic device is cooled. The "hot" electrons are received by the collector-side thermal conductors of the second thermionic device of the second panel to heat the collector electrode (1216). In an exemplary embodiment, the collector electrode of the second thermionic device of the second panel is heated to a temperature above (e.g., about one degree Celsius above in embodiments) the temperature of the first thermionic device of the first layer. This transfer of "hot" electrons and heat may continue to third and additional ("$n^{th}$") panels. The continued transfer of heat from panel to panel of the apparatus, away from the first body proximal to the first panel, has the effect of cooling the body proximal to the first panel below its initial temperature.

The thermionic and thermal characteristics of the thermionic devices provide significant advantages over conventional cooling apparatuses, many of which require the use of outside energy sources to continuously cool bodies.

As described above, the thermal-transfer apparatuses of embodiments described herein may be used in wide variety of applications, including, by way of example, refrigeration, air conditioning, electronics cooling, industrial temperature control, waste heat recovery, off-grid and mobile refrigeration, and cold storage.

Another advantage of certain embodiments is that the apparatuses and circuits are scalable to meet thermal management needs of various systems and environments. Another advantage of certain embodiments is that the apparatuses and circuits can produce power while operating, in exemplary embodiments at high efficiencies, at or near room (e.g., ambient) temperatures without requiring an external heat source. Another advantage of certain embodiments is that apparatus and circuits are provided with relatively small sizes and weights, reduced noise, and environmental sustainability, e.g., is carbon neutral and doesn't require conventional batteries and circulation of refrigerants.

The apparatuses of exemplary embodiments described herein facilitate generating electrical energy via a long-lived, battery-like device for any size-scale electrical application. Thermal energy harvesting thermionic devices of apparatuses of exemplary embodiments have a conversion efficiency superior to presently available single A and double A conventional batteries. The thermal energy harvesting thermionic devices of exemplary embodiments described herein are light weight, compact, and have a relatively long operating life with an electrical power output at a useful value. Furthermore, in addition to the tailored work functions, the nanoparticle clusters of exemplary embodiments described herein are multiphase nano-composites that include thermoelectric materials. In exemplary embodiments, the combination of thermoelectric and thermionic functions within a single device further enhances the power generation capabilities of the thermal energy harvesting thermionic devices.

The conversion of heat into usable electricity enables energy harvesting capable of offsetting, or even replacing, the reliance on conventional power supplies, such as electrochemical batteries, especially when long-term operation of a large number of devices in dispersed locations is required. Energy harvesting distinguishes itself from batteries and hardwire power owing to inherent advantages, such as outstanding longevity measured in years, little maintenance, and minimal disposal and contamination issues. The thermal energy harvesting thermionic apparatuses of exemplary embodiments described herein demonstrate a novel electric generator with low cost for efficiently harvesting thermal energy. The apparatuses of exemplary embodiments described herein initiate electron flow due to the differences in the Fermi levels of the electrodes without the need for an initial temperature differential or thermal gradient, although in exemplary embodiments a heat source (such as a warm body to be cooled) is used to generate the temperature differentials over the course of use.

The thermal energy harvesting thermionic apparatuses of exemplary embodiments described herein are scalable across a large number of power generation requirements. The devices may be designed for applications requiring electric power in the milliwatts (mW), watts (W), kilowatts (kW), and megawatts (MW) ranges.

The production of renewable, sustainable, green energy resources is the critical innovation for sustainable development of human civilization. Embodiments disclosed herein include apparatuses including a plurality of thermal energy harvesting thermionic devices to effect heat transfer, and in exemplary embodiments to cool or maintain a cool temperature of a body. Further embodiments disclosed herein include apparatuses including thermal energy harvesting thermionic devices for heating/cooling and power generation/heat recovery systems, such as, refrigeration, air conditioning, electronics cooling, industrial temperature control, waste heat recovery, off-grid and mobile refrigeration, and cold storage. In exemplary embodiments, the thermionic devices of the apparatuses are nanoscale energy harvesters, and in further exemplary devices is the sole power supply. In an exemplary embodiment, the thermionic devices can cause the apparatuses to be substantially autogenous or self-powered.

Aspects of the present embodiments are described herein with reference to one or more of flowchart illustrations and/or block diagrams of methods and apparatus according to the embodiments. It should be understood that the sequence of steps in those flowcharts (e.g., FIG. 8 and FIG. 12) may be changed. Further, additional steps may be included and/or illustrated steps omitted.

While particular embodiments have been shown and described, it will be understood to those skilled in the art that, based upon the teachings herein, changes and modifications may be made without departing from its broader aspects. Therefore, the appended claims are to encompass within their scope all such changes and modifications as are within the true spirit and scope of the embodiments. Furthermore, it is to be understood that the embodiments are solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to the embodiments containing only one such element, even when the same claim includes the introductory phrases "one or more" or "at least one" and indefinite articles such as "a" or "an"; the same holds true for the use in the claims of definite articles. As used herein, the term "and/or" means either or both (or any combination or all of the terms or expressed referred to).

The corresponding structures, materials, acts, and equivalents of all means or step plus function elements in the claims below are intended to include any structure, material, or act for performing the function in combination with other claimed elements as specifically claimed. The description of the present embodiments has been presented for purposes of illustration and description, but is not intended to be exhaustive or limited to the embodiments in the form disclosed. Many modifications and variations will be apparent to those of ordinary skill in the art without departing from the scope and spirit of the embodiments. The embodiments were chosen and described in order to best explain the principles of the embodiments and the practical application, and to enable others of ordinary skill in the art to understand the embodiments for various embodiments with various modifications and combinations with one another as are suited to the particular use contemplated. Accordingly, the scope of protection of the embodiment(s) is limited only by the following claims and their equivalents.

What is claimed is:

1. An apparatus, comprising:
   a first panel comprising:
      a first sheet having first opposite surfaces;
      first thermally insulating coatings respectively positioned on the first opposite surfaces of the first sheet; and
      at least one first thermal energy harvesting thermionic device positioned in a first passage extending through the first sheet, the at least one first thermal energy harvesting thermionic device not being covered by the first thermally insulating coatings, the at least one first thermal energy harvesting thermionic device comprising:
         a first emitter electrode;
         a first collector electrode;
         a first nano-fluid positioned between an inner surface of the first emitter electrode and an inner surface of the first collector electrode, the first nano-fluid comprising a first medium and a first plurality of nanoparticles in the first medium, the first nanoparticles configured to transfer electrons between the first emitter electrode and the first collector electrode during operation of the apparatus to cool the first emitter electrode;
         one or more first emitter-side thermal conductors positioned adjacent to an outer surface of the first emitter electrode and in thermal communication with the first emitter electrode; and
         one or more first collector-side thermal conductors positioned adjacent to an outer surface of the first collector electrode and in thermal communication with the first collector electrode; and
   a second panel comprising:
      a second sheet having second opposite surfaces;
      second thermally insulating coatings respectively positioned on the second opposite surfaces of the second sheet; and
      at least one second thermal energy harvesting thermionic device positioned in a second passage extending through the second sheet, the at least one second thermal energy harvesting thermionic device not being covered by the second thermally insulating coatings, the at least one second thermal energy harvesting thermionic device comprising:
         a second emitter electrode;
         a second collector electrode;
         a second nano-fluid positioned between an inner surface of the second emitter electrode and an inner surface of the second collector electrode, the second nano-fluid comprising a second medium and a second plurality of nanoparticles in the second medium, the second nanoparticles configured to transfer electrons between the second emitter electrode and the second collector electrode during operation of the apparatus;
         one or more second emitter-side thermal conductors positioned adjacent to an outer surface of the second emitter electrode and in thermal communication with the second emitter electrode;
         one or more second collector-side thermal conductors positioned adjacent to an outer surface of the second collector electrode and in thermal communication with the second collector electrode; and the one or more second emitter-side thermal conductors of the at least one second thermal energy harvesting thermionic device being proximal to the one or more first collector-side thermal conductors of the at least one first thermal energy harvesting thermionic device to receive heat from the one or more first collector-side thermal conductors of the at least one first thermal energy harvesting thermionic device during operation of the apparatus.

2. The apparatus of claim 1, wherein the first and second panels are spaced from one another to provide a compartment therebetween.

3. The apparatus of claim 2, wherein the apparatus further comprises a housing supporting the first and second panels, the housing including a thermally insulating coating.

4. The apparatus of claim 2, wherein the one or more first collector-side thermal conductors of the at least one first thermal energy harvesting thermionic device and the one or more second emitter-side thermal conductors of the at least one second thermal energy harvesting thermionic device extend into the compartment.

5. The apparatus of claim 1, wherein:
the one or more first emitter-side thermal conductors and the one or more first collector-side thermal conductors comprise a plurality of the first emitter-side thermal conductors and a plurality of the first collector-side thermal conductors, respectively; and
the one or more second emitter-side thermal conductors and the one or more second collector-side thermal conductors comprise a plurality of the second emitter-side thermal conductors and a plurality of the second collector-side thermal conductors, respectively.

6. The apparatus of claim 5, wherein the first collector-side thermal conductors are out of alignment with the second emitter-side thermal conductors.

7. The apparatus of claim 5, wherein:
the first emitter-side thermal conductors, the first collector-side thermal conductors, the second emitter-side thermal conductors, and the second collector-side thermal conductors each comprise micropillars arranged in an array.

8. The apparatus of claim 1, wherein each of the first thermally insulating coatings and the second thermally insulating coatings comprises an aerogel.

9. The apparatus of claim 8, wherein the aerogel comprises a hydrophobic silica aerogel.

10. The apparatus of claim 1, wherein:
the at least one first thermal energy harvesting thermionic device further comprises:
a first emitter-side adhesive layer securing the one or more first emitter-side thermal conductors adjacent to and in thermal communication with the first emitter electrode; and
a first collector-side adhesive layer securing the one or more first collector-side thermal conductors adjacent to and in thermal communication with the first collector electrode; and
the at least one second thermal energy harvesting thermionic device further comprises:
a second emitter-side adhesive layer securing the one or more second emitter-side thermal conductors adjacent to and in thermal communication with the second emitter electrode; and
a second collector-side adhesive layer securing the one or more second collector-side thermal conductors adjacent to and in thermal communication with the second collector electrode.

11. The apparatus of claim 10, wherein the first and second emitter-side adhesive layers and the first and second collector-side adhesive layers each comprise an epoxy.

12. The apparatus of claim 10, wherein the first and second emitter-side adhesive layers and the first and second collector-side adhesive layers each contain thermally conductive filler.

13. The apparatus of claim 12, wherein the thermally conductive filler comprises metallic nanoparticles.

14. The apparatus of claim 1, wherein the first and second panels collectively form a structure having an annular cross section, and wherein the first and second panels are concentrically arranged with respect to one another.

15. The apparatus of claim 14, wherein the structure has a central passage configured to convey a cooling fluid.

16. The apparatus of claim 1, wherein a thickness of the first emitter electrode, a thickness of the first collector electrode, and/or a distance between the first emitter electrode and the first collector electrode has a nano-scale thickness of less than 100 nm.

17. The apparatus of claim 16, wherein the nano-scale thickness is in a range of 2 nm to 10 nm.

18. A circuit comprising:
an apparatus comprising:
a first panel comprising:
a first sheet having first opposite surfaces;
first thermally insulating coatings respectively positioned on the first opposite surfaces of the first sheet; and
at least one first thermal energy harvesting thermionic device positioned in a first passage extending through the first sheet, the at least one first thermal energy harvesting thermionic device not being covered by the first thermally insulating coatings, the at least one first thermal energy harvesting thermionic device comprising:
a first emitter electrode;
a first collector electrode;
a first nano-fluid positioned between an inner surface of the first emitter electrode and an inner surface of the first collector electrode, the first nano-fluid comprising a first medium and a first plurality of nanoparticles in the first medium, the first nanoparticles configured to transfer electrons between the first emitter electrode and the first collector electrode during operation of the apparatus to cool the first emitter electrode;
one or more first emitter-side thermal conductors positioned adjacent to an outer surface of the first emitter electrode and in thermal communication with the first emitter electrode; and
one or more first collector-side thermal conductors positioned adjacent to an outer surface of the first collector electrode and in thermal communication with the first collector electrode;
a second panel comprising:
a second sheet having second opposite surfaces;
second thermally insulating coatings respectively positioned on the second opposite surfaces of the second sheet; and
at least one second thermal energy harvesting thermionic device positioned in a second passage extending through the second sheet, the at least one second thermal energy harvesting thermionic device not being covered by the second thermally insulating coatings, the at least one second thermal energy harvesting thermionic device comprising:
a second emitter electrode;
a second collector electrode;
a second nano-fluid positioned between an inner surface of the second emitter electrode and an inner surface of the second collector electrode, the second nano-fluid comprising a second medium and a second plurality of nanoparticles in the second medium, the second nanoparticles configured to transfer electrons between the second emitter electrode and the second collector electrode during operation of the apparatus;
one or more second emitter-side thermal conductors positioned adjacent to an outer surface of the second emitter electrode and in thermal communication with the second emitter electrode;
one or more second collector-side thermal conductors positioned adjacent to an outer surface of the second collector electrode and in thermal communication with the second collector electrode; and
the one or more second emitter-side thermal conductors of the second thermal energy harvesting thermionic device being proximal to the one or more first collector-side thermal conductors of the first thermal energy harvesting thermionic device to receive heat from the one or more first collector-side thermal conductors of the first thermal energy harvesting thermionic device during operation of the apparatus; and
an electrically conductive path configured to electrically couple at least the first thermal energy harvesting thermionic device, the second thermal energy harvesting thermionic device, or a combination comprising the first and second thermionic devices to an electrical load.

19. A method, comprising:
providing an apparatus comprising:
a first panel comprising:
a first sheet having first opposite surfaces;
first thermally insulating coatings respectively positioned on the first opposite surfaces of the first sheet; and
at least one first thermal energy harvesting thermionic device positioned in a first passage extending through the first sheet, the at least one first thermal energy harvesting thermionic device not being covered by the first thermally insulating coatings, the at least one first thermal energy harvesting thermionic device comprising:
a first emitter electrode;
a first collector electrode;
a first nano-fluid positioned between an inner surface of the first emitter electrode and an inner surface of the first collector electrode, the first nano-fluid comprising a first medium and a first plurality of nanoparticles in the first medium, the first nanoparticles configured to transfer electrons between the first emitter electrode and the first collector electrode during operation of the apparatus to cool the first emitter electrode;
one or more first emitter-side thermal conductors positioned adjacent to an outer surface of the first emitter electrode and in thermal communication with the first emitter electrode; and
one or more first collector-side thermal conductors positioned adjacent to an outer surface of the first collector electrode and in thermal communication with the first collector electrode;
a second panel comprising:
a second sheet having second opposite surfaces;
second thermally insulating coatings respectively positioned on the second opposite surfaces of the second sheet; and
at least one second thermal energy harvesting thermionic device positioned in a second passage extending through the second sheet, the at least one second thermal energy harvesting thermionic device not being covered by the second thermally insulating coatings, the at least one second thermal energy harvesting thermionic device comprising:
a second emitter electrode;
a second collector electrode;
a second nano-fluid positioned between an inner surface of the second emitter electrode and an inner surface of the second collector electrode, the second nano-fluid comprising a second medium and a second plurality of nanoparticles in the second medium, the second nanoparticles configured to transfer electrons between the second emitter electrode and the second collector electrode during operation of the apparatus;
one or more second emitter-side thermal conductors positioned adjacent to an outer surface of the second emitter electrode and in thermal communication with the second emitter electrode;
one or more second collector-side thermal conductors positioned adjacent to an outer surface of the second collector electrode and in thermal communication with the second collector electrode; and
the one or more second emitter-side thermal conductors of the second thermal energy harvesting thermionic device being proximal to the one or more first collector-side thermal conductors of the first thermal energy harvesting thermionic device to receive heat from the one or more first collector-side thermal conductors of the first thermal energy harvesting thermionic device during operation of the apparatus;
positioning a first body in proximity to the first panel to transfer heat from the first body to the at least one first thermal energy harvesting thermionic device;
emitting electrons from the first emitter electrode through the first nano-fluid and receiving the electrons at the first collector electrode to raise a temperature of the first collector electrode and the one or more first collector-side thermal conductors; and
transmitting the heat from the one or more first collector-side thermal conductors to the one or more second emitter-side thermal conductors of the at least one second thermal energy harvesting thermionic device.

20. The method of claim 19, further comprising cooling the first body, the cooling of the first body comprising the emission of electrons from the first emitter electrode.

* * * * *